United States Patent
Ho et al.

(10) Patent No.: US 12,266,573 B2
(45) Date of Patent: Apr. 1, 2025

(54) TRANSISTOR ISOLATION REGIONS AND METHODS OF FORMING THE SAME

(71) Applicant: Taiwan Semiconductor Manufacturing Co., Ltd., Hsinchu (TW)

(72) Inventors: Yi Chen Ho, Taiching (TW); Yiting Chang, Taoyuan (TW); Chi-Hsun Lin, Hsinchu (TW); Zheng-Yang Pan, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 615 days.

(21) Appl. No.: 17/483,043

(22) Filed: Sep. 23, 2021

(65) Prior Publication Data

US 2023/0008893 A1   Jan. 12, 2023

Related U.S. Application Data

(60) Provisional application No. 63/219,420, filed on Jul. 8, 2021.

(51) Int. Cl.
*H01L 21/8234*   (2006.01)
*H01L 21/02*   (2006.01)
*H01L 21/762*   (2006.01)
*H01L 27/088*   (2006.01)

(52) U.S. Cl.
CPC .. *H01L 21/823481* (2013.01); *H01L 21/0228* (2013.01); *H01L 21/76224* (2013.01); *H01L 27/0886* (2013.01)

(58) Field of Classification Search
CPC ........... H01L 21/02167; H01L 21/0228; H01L 21/76224
See application file for complete search history.

(56) References Cited

U.S. PATENT DOCUMENTS

| | | | |
|---|---|---|---|
| 2016/0314965 A1* | 10/2016 | Nguyen | H01L 21/76834 |
| 2017/0213726 A1* | 7/2017 | Saly | C23C 16/45542 |
| 2019/0165127 A1* | 5/2019 | Ching | H01L 21/76229 |
| 2021/0083074 A1 | 3/2021 | Yang et al. | |
| 2021/0202715 A1 | 7/2021 | Ching et al. | |

* cited by examiner

*Primary Examiner* — John A Bodnar
(74) *Attorney, Agent, or Firm* — Slater Matsil, LLP

(57) ABSTRACT

In an embodiment, a device includes: an isolation region on a substrate; a first semiconductor fin protruding above the isolation region; a second semiconductor fin protruding above the isolation region; and a dielectric fin between the first semiconductor fin and the second semiconductor fin, the dielectric fin protruding above the isolation region, the dielectric fin including: a first layer including a first dielectric material having a first carbon concentration; and a second layer on the first layer, the second layer including a second dielectric material having a second carbon concentration, the second carbon concentration greater than the first carbon concentration.

20 Claims, 48 Drawing Sheets

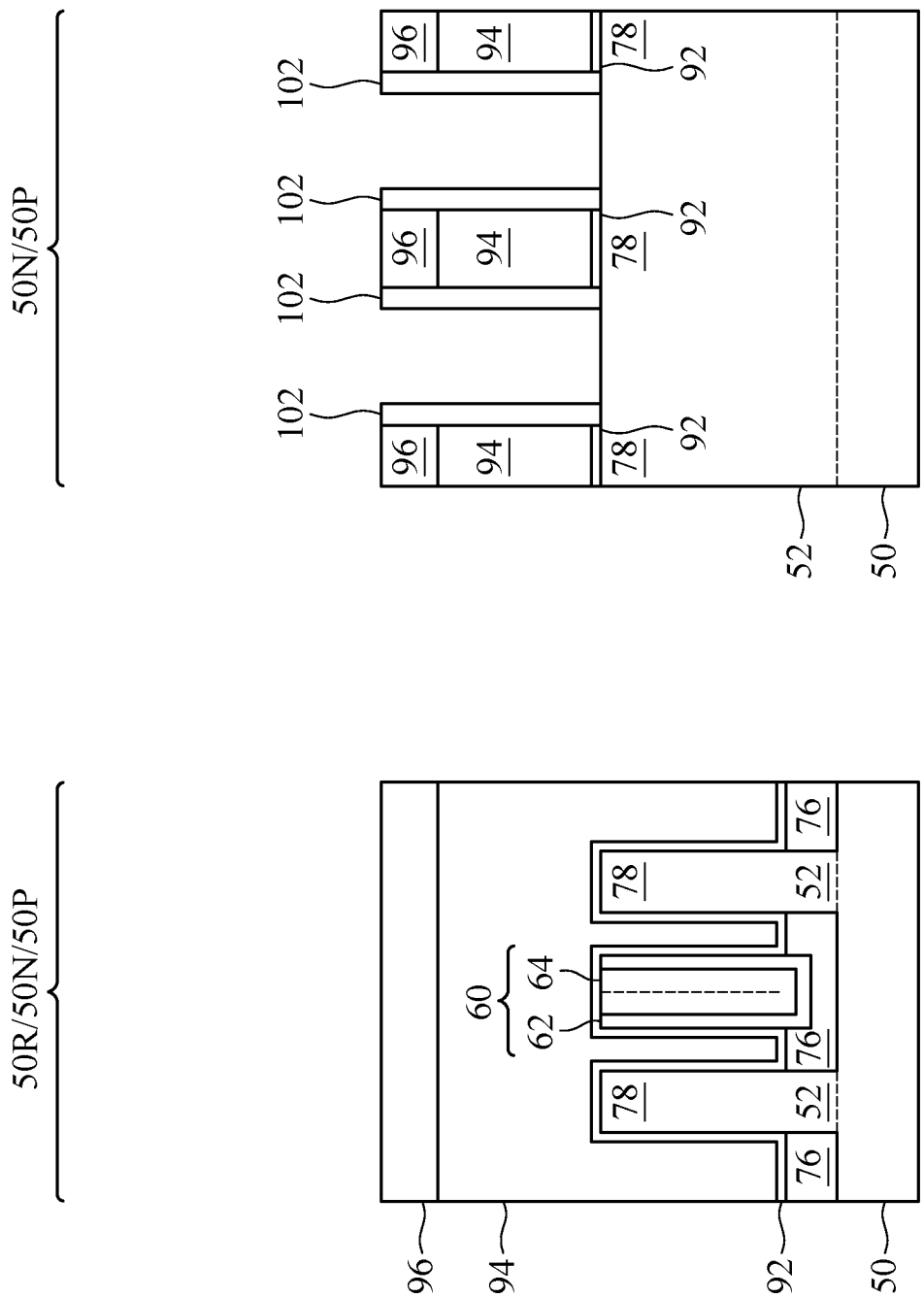

TRANSISTOR ISOLATION REGIONS AND METHODS OF FORMING THE SAME

PRIORITY CLAIM AND CROSS-REFERENCE

This application claims the benefit of U.S. Provisional Application No. 63/219,420, filed on Jul. 8, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
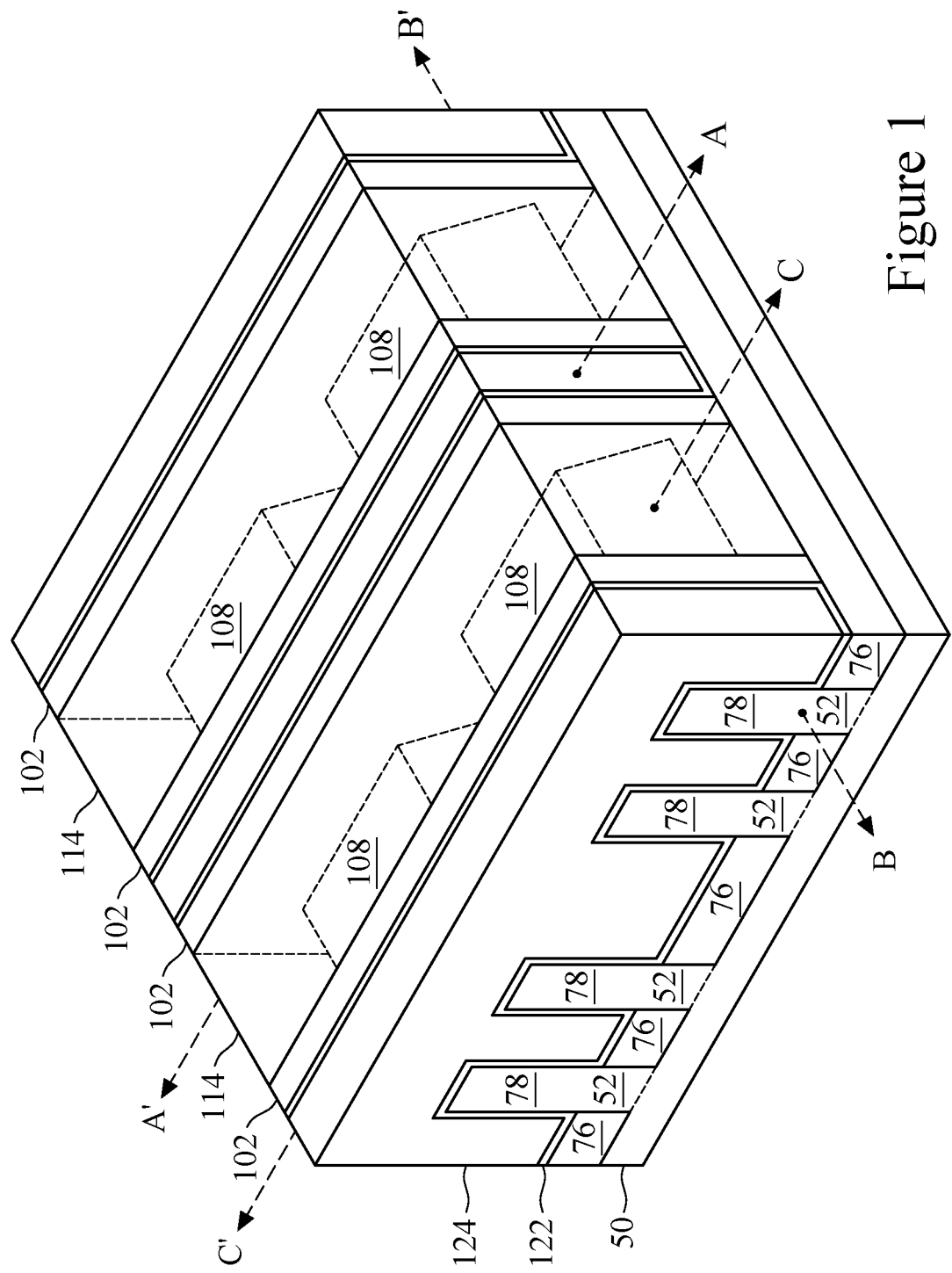
FIG. 1 illustrates an example of Fin Field-Effect Transistors (FinFETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dielectric fins are formed between epitaxial source/drain regions of FinFETs. The dielectric fins separate some of those epitaxial source/drain regions during growth to prevent coalescing of those epitaxial source/drain regions. The dielectric fins also act as additional isolation regions to electrically isolate adjacent device features. The dielectric fins are formed of ceramic dielectric material(s), which increases the mechanical strength of the dielectric fins. The dielectric fins may thus reduce CMP loading in subsequent processing, and are less prone to being crushed or peeled by outside forces. Further, the ceramic dielectric material(s) of the dielectric fins have a high etching selectivity from the etching of surrounding insulation materials. The formation of voids during subsequent etching process(es) may thus be reduced. Further yet, the ceramic dielectric material(s) are capable of being deposited by a deposition process with high conformality. Accordingly, the size and quantity of defects (e.g., dimple defects, seam/void defects, etc.) in the resulting FinFETs may be reduced, which may improve the performance and reliability of the resulting FinFETs.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include semiconductor fins 52 extending from a substrate 50 (e.g., a semiconductor substrate), with the semiconductor fins 52 acting as channel regions 78 for the FinFETs. Isolation regions 76, such as shallow trench isolation (STI) regions, are disposed between adjacent semiconductor fins 52, which may protrude above and from between adjacent isolation regions 76. Although the isolation regions 76 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 52 are illustrated as being single, continuous materials with the substrate 50, the bottom portions of the semiconductor fins 52 and/or the substrate 50 may include a single material or a plurality of materials. In this context, the semiconductor fins 52 refer to the portion extending from between the adjacent isolation regions 76.

Gate dielectrics 122 are along sidewalls and over top surfaces of the semiconductor fins 52. Gate electrodes 124 are over the gate dielectrics 122. Epitaxial source/drain regions 108 are disposed in opposite sides of the semiconductor fins 52 with respect to the gate dielectrics 122 and gate electrodes 124. An inter-layer dielectric (ILD) 114 is formed over the epitaxial source/drain regions 108. Source/drain contacts (subsequently described) to the epitaxial source/drain regions 108 are formed through the ILD 114. The epitaxial source/drain regions 108 may be shared between various semiconductor fins 52. For example, adjacent epitaxial source/drain regions 108 may be electrically connected, such as through coalescing the epitaxial source/drain regions 108 by epitaxial growth, or through coupling the epitaxial source/drain regions 108 with a same source/drain contact.

FIG. 1 further illustrates reference cross-sections that are used in later figures. Cross-section A-A' is along a longitudinal axis of a gate electrode 124. Cross-section B-B' is perpendicular to cross-section A-A' and is along a longitudinal axis of a semiconductor fin 52 and in a direction of, for example, a current flow between the epitaxial source/drain regions 108 of a FinFET. Cross-section C-C' is parallel to cross-section A-A' and extends through epitaxial source/drain regions 108 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-21C are views of intermediate stages in the manufacturing of FinFETs, in accordance with some embodiments. FIGS. 2, 3, 4, 5, 6, 7, 8, 9, 10, and 11 are cross-sectional views illustrated along a similar cross-section as either of reference cross-section A-A' and reference cross-section C-C' in FIG. 1. FIGS. 12A, 13A, 14A, 15A, 16A, 17A, 18A, 19A, 20A, and 21A are cross-sectional views illustrated along a similar cross-section as reference cross-section A-A' in FIG. 1. FIGS. 12B, 13B, 14B, 15B, 16B, 17B, 18B, 19B, 20B, and 21B are cross-sectional views illustrated along a similar cross-section as reference cross-section B-B' in FIG. 1. FIGS. 12C, 13C, 14C, 15C, 16C, 17C, 18C, 19C, 20C, and 21C are cross-sectional views illustrated along a similar cross-section as reference cross-section C-C' in FIG. 1.

Figure 2:
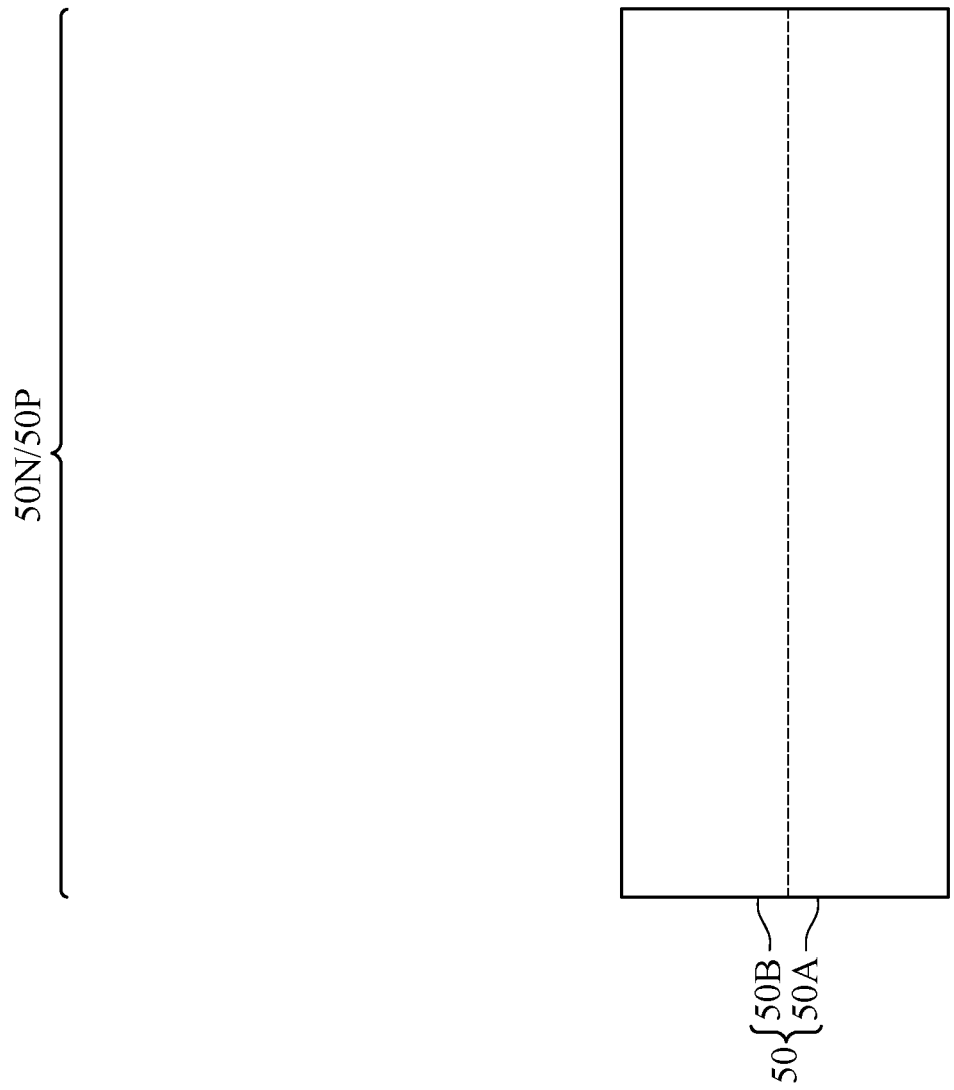
FIGS. 2-21C are views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are described, any number of n-type regions 50N and p-type regions 50P may be provided. FIGS. 2-21C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

In some embodiments, the substrate 50 includes a first semiconductor layer 50A and a second semiconductor layer 50B. The second semiconductor layer 50B may be epitaxially grown on the first semiconductor layer 50A. The first semiconductor layer 50A may be formed of the candidate materials previously described. The second semiconductor layer 50B may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like. The second semiconductor layer 50B is formed of a different semiconductor material than the first semiconductor layer 50A. The second semiconductor layer 50B in the n-type region 50N may be formed of a different semiconductor material than the second semiconductor layer 50B in the p-type region 50P. In some embodiments, the second semiconductor layer 50B in the n-type region 50N is formed of a semiconductor material that is suitable for channel regions of n-type devices (such as silicon), and the second semiconductor layer 50B in the p-type region 50P is formed of a semiconductor material that is suitable for channel regions of p-type devices (such as silicon germanium).

Figure 3:
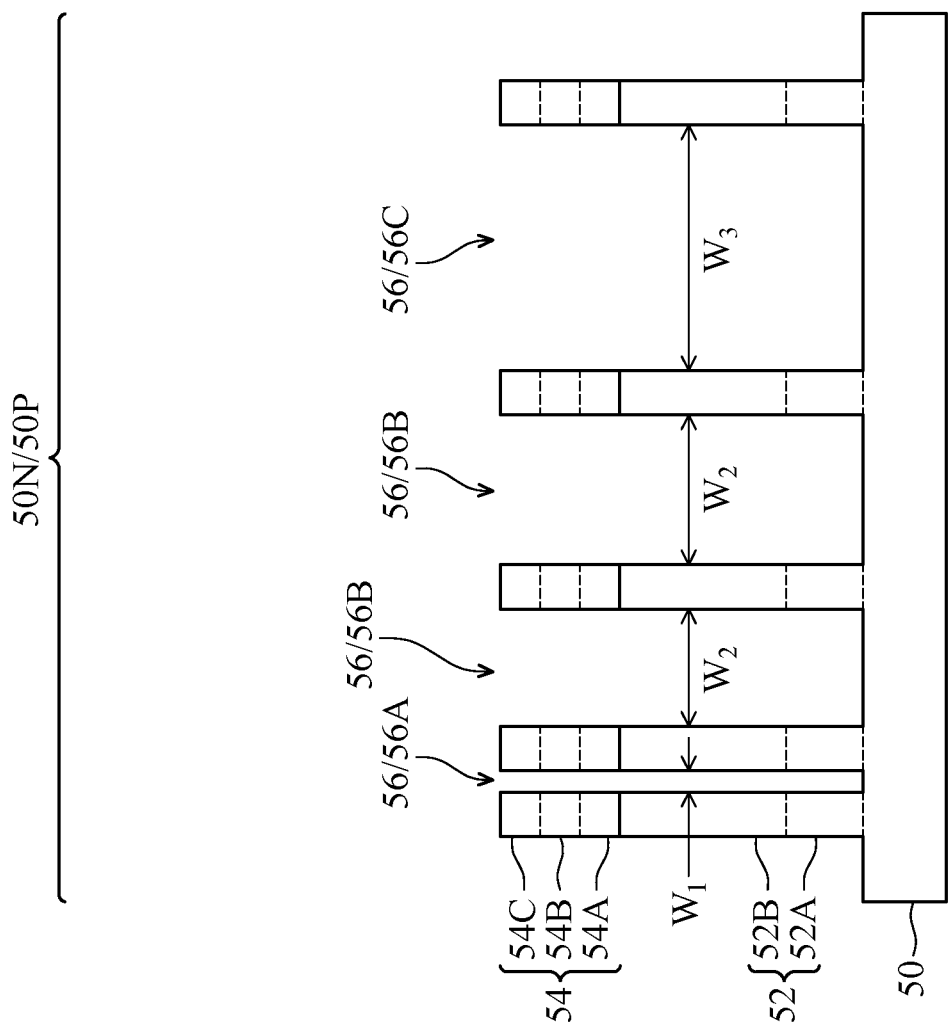

In FIG. 3, semiconductor fins 52 are formed in the substrate 50. The semiconductor fins 52 are semiconductor strips. In some embodiments, the semiconductor fins 52 are formed in the substrate 50 by etching trenches 56 in the substrate 50. The etching may be any acceptable etch process, such as a reactive ion etch (RIE), neutral beam etch (NBE), the like, or a combination thereof. The etch may be anisotropic.

In embodiments where the substrate 50 includes a first semiconductor layer 50A and a second semiconductor layer 50B (see FIG. 2), the trenches 56 may extend through the second semiconductor layer 50B and partially into the first semiconductor layer 50A, such that the semiconductor fins 52 include lower portions 52A (including portions of the first semiconductor layer 50A) and upper portions 52B (including portions of the second semiconductor layer 50B). In some embodiments, the substrate 50 includes a second semiconductor layer 50B in some region(s) but not in other region(s). The semiconductor fins 52 in the p-type regions 50P may include lower portions 52A (including portions of the first semiconductor layer 50A) and upper portions 52B (including portions of the second semiconductor layer 50B), while the semiconductor fins 52 in the n-type region 50N may include a single portion (including portions of the first semiconductor layer 50A).

The semiconductor fins 52 may be patterned by any suitable method. For example, the semiconductor fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fins 52. In some embodiments, the mask (or other layer) may remain on the semiconductor fins 52.

In some embodiments, a mask 54 is used to etch the trenches 56 in the substrate 50. The mask 54 may be a single layer mask, or may be a multilayer mask, such as a multi-layer mask that includes a first mask layer 54A, a second mask layer 54B, and a third mask layer 54C. The first mask layer 54A and second mask layer 54B may each be formed of a dielectric material such as silicon oxide, silicon nitride, a combination thereof, or the like, which may be deposited or thermally grown according to acceptable techniques. The first mask layer 54A and the second mask layer 54B are formed of different materials that have a high etch selectivity from the etching of one another. For example, the first mask layer 54A may be formed of silicon oxide, and the second mask layer 54B may be formed of silicon nitride. The third mask layer 54C may be another type of mask layer, such as a hardmask layer, formed of a material that has a high etching selectivity from the etching of the first mask layer 54A and second mask layer 54B. The third mask layer 54C may be formed of a hardmask material such as titanium nitride, tungsten nitride, a combination thereof, or the like, which may be deposited according to acceptable techniques. The mask 54 may be patterned by any acceptable photolithography and etching process. The mask 54 may then be used as an etching mask to etch the substrate 50, thereby forming the trenches 56. Timed etch processes may be used to stop the etching of the substrate 50 after the trenches 56 reach a desired depth. In some embodiments, the trenches 56 have a depth in the range of 25 nm to 45 nm. In some embodiments, the mask 54 (or other layer) may remain on the semiconductor fins 52 after etching.

The trenches 56 have different widths. Specifically, a first subset of the trenches 56A have a lesser width than a second subset of the trenches 56B, which have a lesser width than a third subset of the trenches 56C. In some embodiments, the trenches 56A have a first width $W_1$ in the range of 18 nm to 30 nm, the trenches 56B have a second width $W_2$ in the range of 50 nm to 65 nm, and the trenches 56C have a third width $W_3$ in the range of 65 nm to 80 nm. The trenches 56 may be formed with different widths by patterning the mask 54 with a pattern having features spaced apart by different distances that correspond to the different widths of the trenches 56. The widths of the trenches 56 defines the width of the semiconductor fins 52 (also referred to as the critical dimension of the semiconductor fins 52). In some embodiments, the semiconductor fins 52 have a width in the range of 16 nm to 20 nm.

Figure 4:
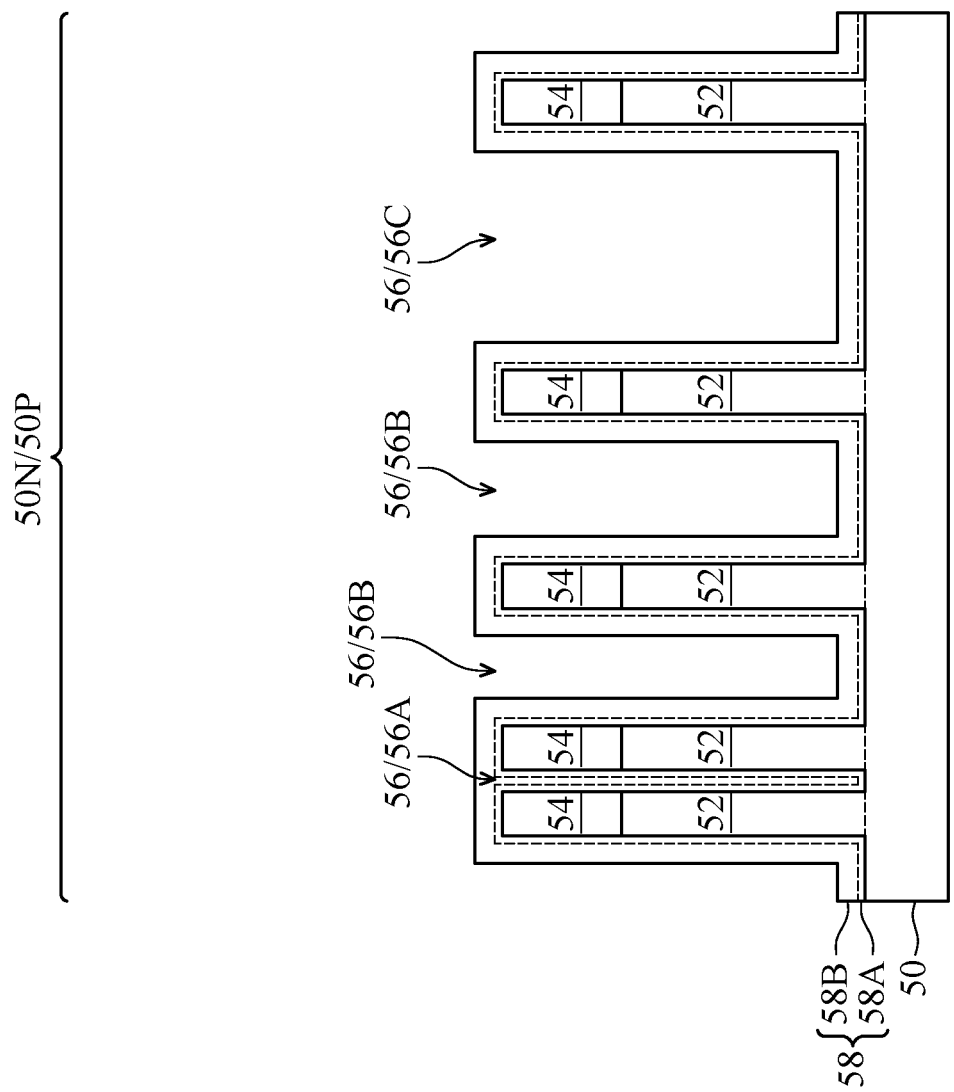

In FIG. 4, one or more layer(s) of insulation material 58 for isolation regions are formed over the substrate 50 and in the trenches 56. The insulation material 58 may include an oxide, such as silicon oxide, a nitride, such as silicon nitride, the like, or a combination thereof, and may be formed by chemical vapor deposition (CVD), a high density plasma chemical vapor deposition (HDP-CVD), a flowable CVD (FCVD), atomic layer deposition (ALD), the like, or a combination thereof. In some embodiments, the insulation material 58 is deposited by a deposition process with high gap-filling properties such as FCVD. Other insulation materials formed by any acceptable process may be used. In some embodiments, the insulation material 58 includes a liner 58A on surfaces of the substrate 50 and the semiconductor fins 52, and a fill material 58B on the liner 58A. The liner 58A may be formed of silicon oxide, silicon nitride, amorphous silicon, or the like, which may be deposited with a conformal deposition process such as ALD. The fill material 58B may be formed of silicon oxide, silicon oxycarbonitride, or the like, which may be deposited with a conformal deposition process such as CVD or the like. In some embodiments, the fill material 58B is formed by depositing a flowable material (e.g., silicon oxycarbonitride) with FCVD and then curing the flowable material (e.g., with an anneal process) to convert it to a solid material (e.g., silicon oxide). In another embodiment, a single layer of insulation material 58 is formed. In yet another embodiment, the fill material 58B includes multiple layers of materials (e.g., silicon oxynitride and silicon oxycarbonitride), each of which are converted to a desired material (e.g., silicon oxide) after they are formed. The insulation material 58 may be conformally formed so that it covers the semiconductor fins 52. In embodiments where a mask 54 remains on the semiconductor fins 52, the insulation material 58 covers the mask 54.

The thickness of the insulation material 58 is controlled so that the insulation material 58 does not fill all of the trenches 56. In some embodiments, the insulation material 58 is deposited to a thickness in the range of 15 nm to 25 nm. The widths $W_1$, $W_2$, $W_3$ of the trenches 56 (see FIG. 3) and the thickness of the insulation material 58 are controlled so that the insulation material 58 fills the trenches 56A without completely filling the trenches 56B, 56C. Specifically, the insulation material 58 is formed to a thickness which is large enough that the insulation material 58 completely fills (or overfills) the trenches 56A but is small enough that the insulation material 58 does not completely fill the trenches 56B, 56C. The insulation material 58 in the trenches 56B, 56C conformally lines the surfaces of the substrate 50 and the sidewalls of the semiconductor fins 52 which define the trenches 56B, 56C.

Figure 5:
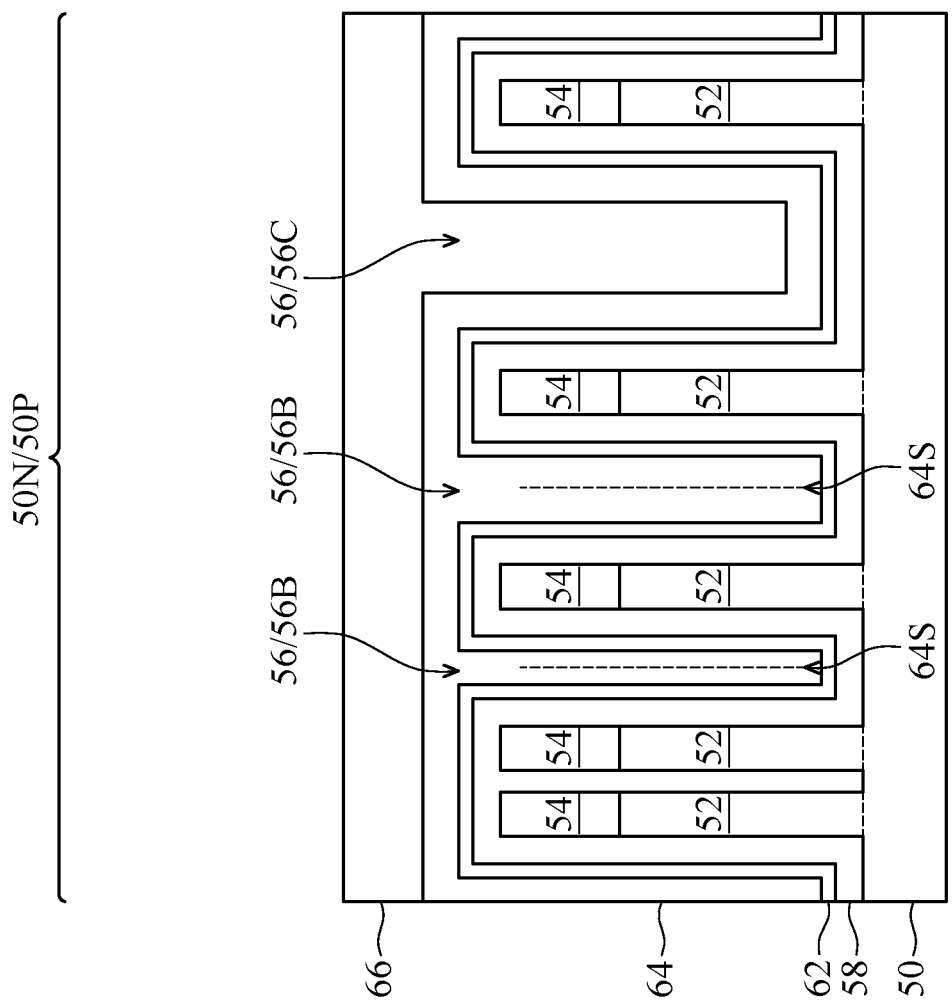

In FIG. 5, dielectric layers for dielectric fins are formed on the insulation material 58. The dielectric fins are isolation structures that will separate source/drain regions that will be subsequently grown in the semiconductor fins 52 to prevent coalescing of those source/drain regions. Further, the dielectric fins are formed of materials that have a high mechanical strength, which allows the dielectric fins to reduce CMP loading in subsequent processing. In the illustrated embodiment, the dielectric layers include a first dielectric layer 62, a second dielectric layer 64, and a third dielectric layer 66. The first dielectric layer 62 extends along sidewalls and the bottom of the second dielectric layer 64. The second dielectric layer 64 extends along sidewalls and the bottom of the third dielectric layer 66. In other embodiments (subsequently described for FIGS. 23A-23C), another dielectric layer is included between the first dielectric layer 62 and the second dielectric layer 64.

In the illustrated embodiment, the sidewalls of the semiconductor fins 52 and the insulation material 58 are illustrated as forming right angles with the top surfaces of the substrate 50 and the insulation material 58, respectively. In other embodiments (subsequently described for FIGS. 35-36), contouring may occur during the patterning of the semiconductor fins 52, the deposition of the insulation material 58, and/or the deposition of the dielectric layers 62, 64, 66. Accordingly, curved surfaces may connect the sidewalls of the semiconductor fins 52 to the top surfaces of the substrate 50, curved surfaces may connect the sidewalls of the insulation material 58 to the top surfaces of the insulation material 58, and curved surfaces may connect the sidewalls of the dielectric layers 62, 64, 66 to the top surfaces of the dielectric layers 62, 64, 66.

As will be subsequently described in greater detail, at least the first dielectric layer 62 and the second dielectric layer 64 are formed of ceramic dielectric materials. The ceramic dielectric materials may have a high k-value (e.g., a k-value greater than about 6.5). Ceramic dielectric materials are hard materials, having a high mechanical strength. Specifically, ceramic molecular structures are stronger than polymer structures, and so ceramic dielectric materials have greater wear resistance and are less prone to being crushed or peeled by outside forces than polymer dielectric materials. The subsequently formed dielectric fins may be free of polymer dielectric materials. Further, ceramic dielectric materials also have a greater mechanical strength than non-ceramic high-k dielectric materials, and have a greater etching selectivity from the etching of the insulation material 58 as compared to non-ceramic high-k dielectric materials. Further yet, ceramic dielectric materials are capable of being deposited by a deposition process with high conformality. Accordingly, the size and quantity of defects (e.g., dimple defects, seam/void defects, etc.) in the resulting FinFETs may be reduced, which may improve the performance and reliability of the resulting FinFETs.

The first dielectric layer 62 is conformally deposited on the insulation material 58. The first dielectric layer 62 is formed of a ceramic dielectric material such as silicon carbonitride, silicon nitride, silicon carbide, aluminum oxide, silicon oxycarbonitride, or the like, which may be deposited by a deposition process with high conformality such as ALD. In some embodiments, the first dielectric layer 62 is deposited to a thickness in the range of 2 nm to 4 nm. The thickness of the first dielectric layer 62 is controlled so that the first dielectric layer 62 lines the trenches 56B, 56C without completely filling the trenches 56B, 56C. Specifically, the thickness of the first dielectric layer 62 is selected to be small enough that the insulation material 58 does not completely fill the trenches 56B, 56C.

The second dielectric layer 64 is conformally deposited on the first dielectric layer 62. The second dielectric layer 64 is formed of a ceramic dielectric material such as silicon carbonitride, silicon nitride, silicon carbide, aluminum oxide, silicon oxycarbonitride, or the like, which may be deposited by a deposition process with high conformality such as ALD. The second dielectric layer 64 fills the remaining portions of the trenches 56B that are not filled (e.g., are unoccupied) by the first dielectric layer 62 and the insulation material 58. In some embodiments, the second dielectric layer 64 is deposited to a thickness in the range of 18 nm to 28 nm. The thickness of the second dielectric layer 64 is greater than the thickness of the first dielectric layer 62. The thickness of the second dielectric layer 64 is controlled so that the second dielectric layer 64 fills the trenches 56B without completely filling the trenches 56C. Specifically, the thickness of the second dielectric layer 64 is selected to be large enough that the second dielectric layer 64 completely fills (or overfills) the trenches 56B but small enough that the second dielectric layer 64 does not completely fill the trenches 56C.

The third dielectric layer 66 is conformally deposited on the second dielectric layer 64. The third dielectric layer 66 may be formed of a dielectric material such as silicon oxide, silicon nitride, a combination thereof, or the like, which may be deposited by a deposition process with high deposition rate such as CVD, FCVD, or the like. The third dielectric layer 66 fills the remaining portions of the trenches 56C that are not filled (e.g., are unoccupied) by the second dielectric layer 64, the first dielectric layer 62, and the insulation material 58. In some embodiments, the third dielectric layer 66 is deposited to a thickness in the range of 30 nm to 50 nm. The thickness of the third dielectric layer 66 is greater than the thickness of the second dielectric layer 64. The thickness of the third dielectric layer 66 is controlled so that the third dielectric layer 66 fills the trenches 56C. Specifically, the thickness of the third dielectric layer 66 is selected to be large enough that the third dielectric layer 66 completely fills (or overfills) the trenches 56C.

The first dielectric layer 62 and the second dielectric layer 64 are formed of dielectric materials with a high mechanical strength that have a high k-value. The material of the second dielectric layer 64 is harder (e.g., has a greater mechanical strength) than the material of the first dielectric layer 62. The second dielectric layer 64 acts as a fill layer for the subsequently formed dielectric fins, and forming it of a dielectric material having a high mechanical strength increases the mechanical strength of the dielectric fins. The mechanical strength of a dielectric material may be determined by its density and its capability to withstand stress. The material of the second dielectric layer 64 is capable of withstanding a greater stress than the material of the first dielectric layer 62. In some embodiments, the first dielectric layer 62 and the second dielectric layer 64 are each formed of a dielectric material that can withstand a stress in the range of 0.92 GPa to 1.1 GPa. The material of the second dielectric layer 64 has a greater density than the material of the first dielectric layer 62. In some embodiments, the first dielectric layer 62 and the second dielectric layer 64 are each formed of a dielectric material having a density in the range of 2.65 $g/cm^3$ to 2.85 $g/cm^3$. The material of the first dielectric layer 62 has a lesser k-value than the material of the second dielectric layer 64. The first dielectric layer 62 acts as a liner layer for the subsequently formed dielectric fins, and forming it of a dielectric material having a lesser k-value than the second dielectric layer 64 reduces the leakage current of the resulting FinFETs. In some embodiments, the first dielectric layer 62 and the second dielectric layer 64 are each formed of a dielectric material having a k-value in the range of 6.5 to 7.5. The third dielectric layer 66 may be formed of a dielectric material having a lesser k-value than that of the first dielectric layer 62 and/or the second dielectric layer 64.

In some embodiments, the first dielectric layer 62 and the second dielectric layer 64 are formed of the same ceramic dielectric material, and have different compositions of that ceramic dielectric material. Specifically, the first dielectric layer 62 may be a layer of silicon carbonitride (e.g., a silicon carbonitride layer) having a first carbon concentration, and the second dielectric layer 64 may be a layer of silicon carbonitride having a second carbon concentration, with the second carbon concentration being greater than the first carbon concentration. In some embodiments, the first carbon concentration of the first dielectric layer 62 is less than 12%, such as in the range of 5% to 8%, and the second carbon concentration of the second dielectric layer 64 is in the range of 10% to 13%, such as greater than or equal to 12%.

In some embodiments, the first dielectric layer 62 and the second dielectric layer 64 are formed of different ceramic dielectric materials. The first dielectric layer 62 is formed of a first ceramic dielectric material, the second dielectric layer 64 is formed of a second ceramic dielectric material, and the second ceramic dielectric material is different from the first ceramic dielectric material. For example, the first ceramic dielectric material may be silicon carbonitride, and the second ceramic dielectric material may be silicon nitride, silicon carbide, aluminum oxide, silicon oxycarbonitride, or the like.

In some embodiments, the first dielectric layer 62 is formed by depositing a ceramic dielectric material with a first atomic layer deposition (ALD) process. The first ALD process is performed by placing the substrate 50 in a deposition chamber and cyclically dispensing multiple source precursors into the deposition chamber, thus exposing the surfaces of the insulation material 58 to the source precursors. The source precursors include a first precursor, a second precursor, and a third precursor, which are any acceptable precursors capable of reacting to deposit the ceramic dielectric material of the first dielectric layer 62. In some embodiments where the ceramic dielectric material is silicon carbonitride, the first precursor is a silicon-containing precursor, the second precursor is a carbon-containing precursor, and the third precursor is a nitrogen-containing precursor. Acceptable silicon-containing precursors for depositing silicon carbonitride include binary silicon-hydrogen compound silanes such as silane ($SiH_4$), disilane ($Si_2H_6$), dichlorosilane ($SiH_2Cl_2$), and the like. Acceptable carbon-containing precursors for depositing silicon carbonitride include propene ($C_3H_6$) and the like. Acceptable nitrogen-containing precursors for depositing silicon carbonitride include ammonia ($NH_3$) and the like. Other acceptable precursors may be used. A first pulse of an ALD cycle is performed by dispensing the first precursor (e.g., a silicon-containing precursor such as dichlorosilane) into the deposition chamber. The first precursor is kept in the deposition chamber until the first precursor has reacted with the available reactive sites on the surfaces of the insulation material 58. The first precursor is then purged from the deposition chamber, such as by any acceptable vacuuming process and/or by flowing an inert gas into the deposition chamber. A second pulse of the ALD cycle is performed by dispensing the second precursor (e.g., a carbon-containing precursor such as propene) into the deposition chamber. The second precursor is kept in the deposition chamber until the second precursor has reacted with the available reactive sites on the surfaces of the insulation material 58. The second precursor is then purged from the deposition chamber, such as by any acceptable vacuuming process and/or by flowing an inert gas into the deposition chamber. A third pulse of the ALD cycle is performed by dispensing the third precursor (e.g., a nitrogen-containing precursor such as ammonia) into the deposition chamber. The third precursor is kept in the deposition chamber until the third precursor has reacted with the available reactive sites on the surfaces of the insulation material 58. The third precursor is then purged from the deposition chamber, such as by any acceptable vacuuming process and/or by flowing an inert gas into the deposition chamber. Each ALD cycle results in the deposition of an atomic layer (sometimes called a monolayer) of the ceramic dielectric material of the first dielectric layer 62. The ALD cycle is repeated a number of times, until the ceramic dielectric material of the first dielectric layer 62 is deposited to a desired thickness (previously described).

In some embodiments, the second dielectric layer 64 is formed by depositing a ceramic dielectric material with a second atomic layer deposition (ALD) process. The second ALD process is performed by placing the substrate 50 in a deposition chamber and cyclically dispensing multiple source precursors into the deposition chamber, thus exposing the surfaces of the first dielectric layer 62 to the source precursors. The source precursors include a first precursor, a second precursor, and a third precursor, which are any acceptable precursors capable of reacting to deposit the ceramic dielectric material of the second dielectric layer 64. In some embodiments where the ceramic dielectric material is silicon carbonitride, the first precursor is a silicon-containing precursor, the second precursor is a carbon-containing precursor, and the third precursor is a nitrogen-containing precursor. Acceptable silicon-containing precursors for depositing silicon carbonitride include binary silicon-hydrogen compound silanes such as silane ($SiH_4$), disilane ($Si_2H_6$), dichlorosilane ($SiH_2Cl_2$), and the like. Acceptable carbon-containing precursors for depositing silicon carbonitride include propene ($C_3H_6$) and the like. Acceptable nitrogen-containing precursors for depositing silicon carbonitride include ammonia ($NH_3$) and the like. Other acceptable precursors may be used. A first pulse of an ALD cycle is performed by dispensing the first precursor (e.g., a silicon-containing precursor such as dichlorosilane) into the deposition chamber. The first precursor is kept in the deposition chamber until the first precursor has reacted with the available reactive sites on the surfaces of the first dielectric layer 62. The first precursor is then purged from the deposition chamber, such as by any acceptable vacuuming process and/or by flowing an inert gas into the deposition chamber. A second pulse of the ALD cycle is performed by dispensing the second precursor (e.g., a carbon-containing precursor such as propene) into the deposition chamber. The second precursor is kept in the deposition chamber until the second precursor has reacted with the available reactive sites on the surfaces of the first dielectric layer 62. The second precursor is then purged from the deposition chamber, such as by any acceptable vacuuming process and/or by flowing an inert gas into the deposition chamber. A third pulse of the ALD cycle is performed by dispensing the third precursor (e.g., a nitrogen-containing precursor such as ammonia) into the deposition chamber. The third precursor is kept in the deposition chamber until the third precursor has reacted with the available reactive sites on the surfaces of the first dielectric layer 62. The third precursor is then purged from the deposition chamber, such as by any acceptable vacuuming process and/or by flowing an inert gas into the deposition chamber. Each ALD cycle results in the deposition of an atomic layer (sometimes called a monolayer) of the ceramic dielectric material of the second dielectric layer 64. The ALD cycle is repeated a number of times, until the ceramic dielectric material of the second dielectric layer 64 is deposited to a desired thickness (previously described).

The first ALD process for depositing the first dielectric layer 62 and the second ALD process for depositing the second dielectric layer 64 may be performed in the same deposition chamber. Further, the first ALD process and the second ALD process may be performed at the same temperature and/or the same pressure. In some embodiments, during the first ALD process and the second ALD process, the deposition chamber is maintained at a temperature in the range of 600° C. to 660° C., and the deposition chamber is maintained at pressure in the range of 66 Pa to 1000 Pa. As noted above, in some embodiments, the first dielectric layer 62 and the second dielectric layer 64 are formed of the same ceramic dielectric material, and have different compositions of that ceramic dielectric material, such as different carbon concentrations. In such embodiments, the second dielectric layer 64 may be formed to a greater carbon concentration than the first dielectric layer 62 by varying the parameters of the ALD processes so that a greater amount of the carbon-containing precursor is dispensed during the second ALD process than during the first ALD process. The amount of the carbon-containing precursor dispensed may be controlled in several manners. In some embodiments, the carbon-containing precursor is kept in the deposition chamber for a first duration during the cycles of the first ALD process, the carbon-containing precursor is kept in the deposition chamber for a second duration during the cycles of the second ALD process, and the second duration is greater than the first duration. In some embodiments, the carbon-containing precursor is dispensed into the deposition chamber at a first flow rate during the cycles of the first ALD process, the carbon-containing precursor is dispensed into the deposition chamber at a second flow rate during the cycles of the second ALD process, and the second flow rate is greater than the first flow rate. In some embodiments, the carbon-containing precursor is dispensed into the deposition chamber at a first concentration during the cycles of the first ALD process, the carbon-containing precursor is dispensed into the deposition chamber at a second concentration during the cycles of the second ALD process, and the second concentration is greater than the first concentration.

The second dielectric layer 64 may be deposited until it seams together and fills the trenches 56B. As such, during deposition of the second dielectric layer 64, vertical seams 64S may be formed in the trenches 56B. As noted above, the second dielectric layer 64 is deposited by a deposition process with high conformality (e.g., ALD). The high conformality of the deposition process allows the vertical seams 64S to be small. Accordingly, the size and quantity of defects (e.g., dimple defects, seam/void defects, etc.) in the resulting FinFETs may be reduced.

In some embodiments, the third dielectric layer 66 is formed by depositing a dielectric material with a FCVD process. For example, a flowable material may be dispensed with FCVD, and then the flowable material may be converted to a solid dielectric material. The curing process may be, e.g., an annealing process. Thus, the type of process (e.g., FCVD) for forming the third dielectric layer 66 may be different from the type of processes (e.g., ALD) for forming the second dielectric layer 64 and the first dielectric layer 62. Further, the process for forming the third dielectric layer 66 may have a lower conformality than the processes for forming the second dielectric layer 64 and the first dielectric layer 62. The material of the third dielectric layer 66 may have a lower mechanical strength than the materials of the second dielectric layer 64 and the first dielectric layer 62, such as by having a lower carbon concentration than the materials of the second dielectric layer 64 and the first dielectric layer 62. The material of the third dielectric layer 66 may be a non-ceramic dielectric material. In another embodiment, the third dielectric layer 66 is also formed of a ceramic dielectric material, which may be deposited by a deposition process with high conformality such as ALD.

After the first dielectric layer 62, the second dielectric layer 64, and the third dielectric layer 66 are formed, one or more removal process(es) are performed to remove excess portions of the first dielectric layer 62, the second dielectric layer 64, and the third dielectric layer 66 over the semiconductor fins 52 (e.g., outside of the trenches 56), thereby forming dielectric fins 60 (see FIG. 9) on the insulation material 58. The dielectric fins 60 are disposed between a subset of the semiconductor fins 52, and may also be referred to as "hybrid fins." In some embodiments, and as will be subsequently described for FIGS. 6-9, the removal process(es) include multiple chemical mechanical polish (CMP) processes and etch-back processes, and one or more dummy layer(s) for buffering the CMP processes are formed and removed. After the CMP processes, the top surfaces of the semiconductor fins 52, the insulation material 58, the first dielectric layer 62, the second dielectric layer 64, and the third dielectric layer 66 are coplanar (within process variations) such that they are level with each other. Other acceptable removal process(es) may be used.

Figure 6:
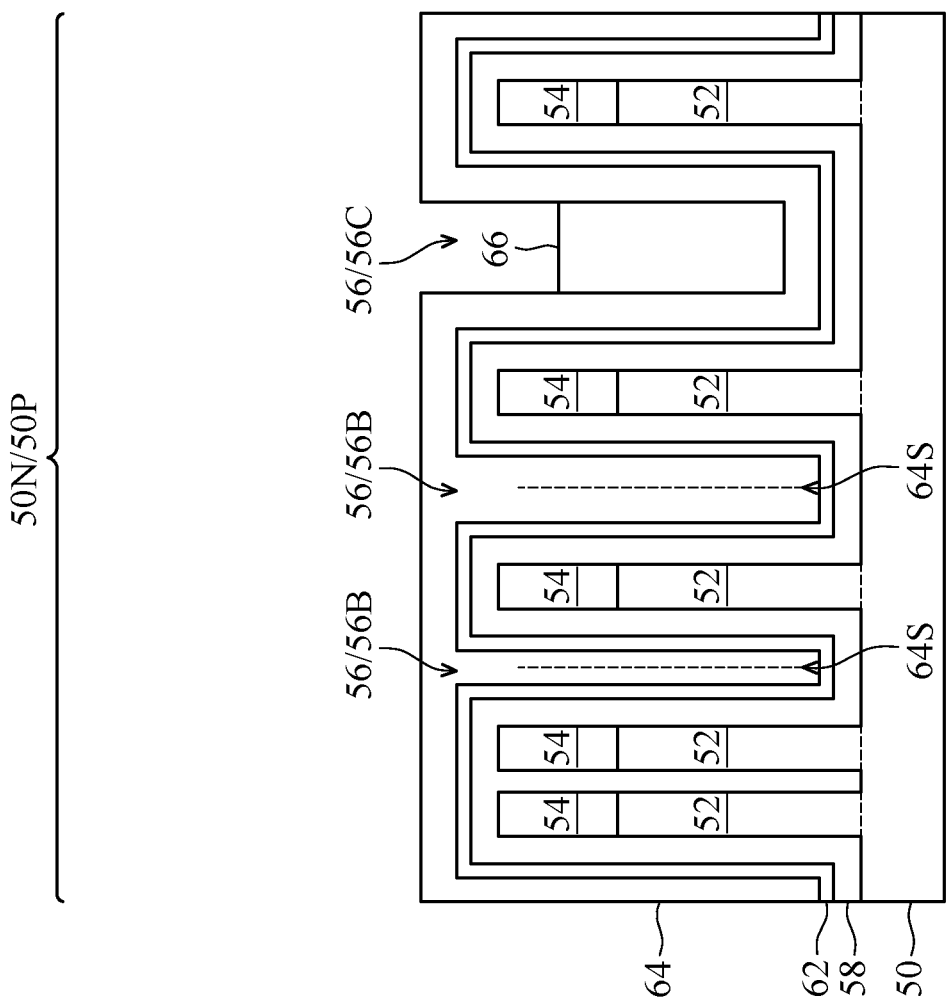

In FIG. 6, the third dielectric layer 66 is recessed such that upper portions of the second dielectric layer 64 protrude above the third dielectric layer 66. Recessing the third dielectric layer 66 reforms portions of the trenches 56C. The third dielectric layer 66 may be recessed by an etch-back process, a chemical mechanical polish (CMP) process, a combination thereof, or the like. In some embodiments, a CMP process may be performed to level the top surfaces of the third dielectric layer 66 with the top surfaces of the second dielectric layer 64, and an etch-back process may then be performed to recess the top surfaces of the third dielectric layer 66 from the top surfaces of the second dielectric layer 64. The etch-back process may be an acceptable etching process, such as one that is selective to the third dielectric layer 66 (e.g., selectively etches the material of the third dielectric layer 66 at a faster rate than the material of the second dielectric layer 64). Timed etch processes may be used to stop the etching of the third dielectric layer 66 after the trenches 56C reach a desired depth.

Figure 7:
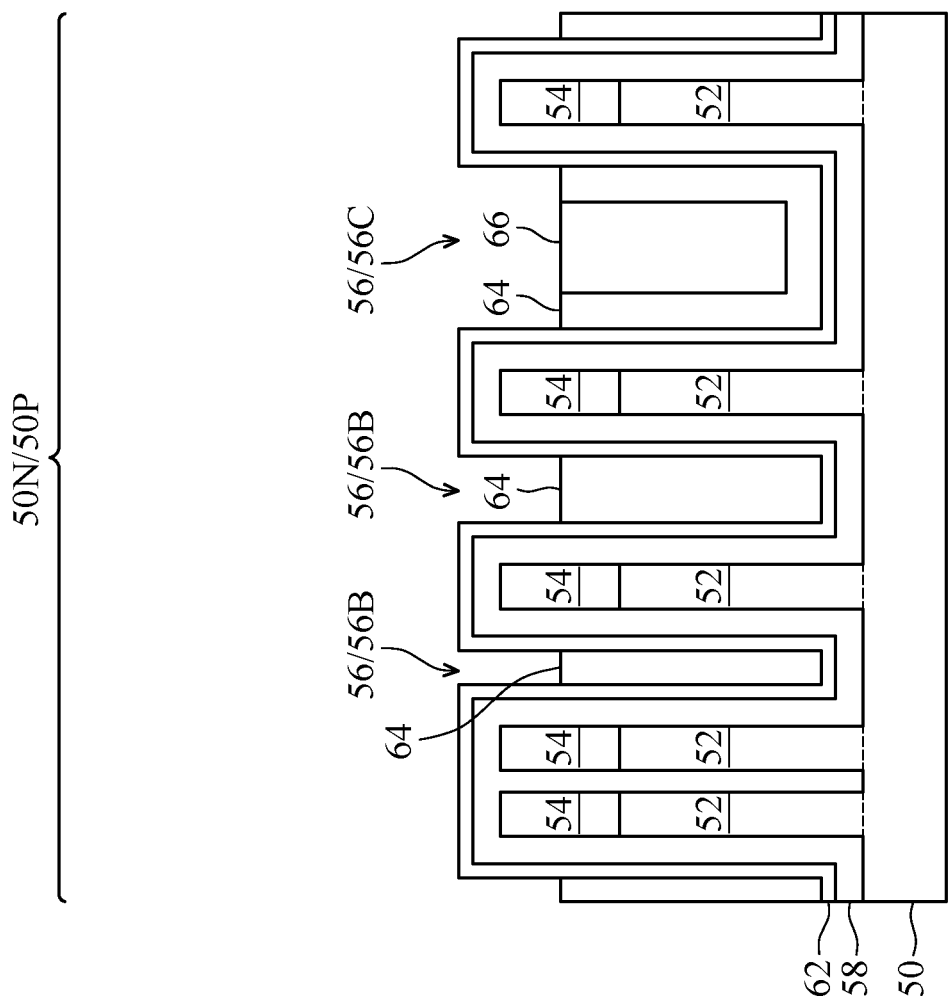

In FIG. 7, the second dielectric layer 64 is recessed such that upper portions of the first dielectric layer 62 protrude above the second dielectric layer 64. Recessing the second dielectric layer 64 reforms portions of the trenches 56B, 56C. The second dielectric layer 64 may be recessed by an etch-back process, a chemical mechanical polish (CMP) process, a combination thereof, or the like. In some embodiments, a CMP process may be performed to level the top surfaces of the second dielectric layer 64 with the top surfaces of the first dielectric layer 62, and an etch-back process may then be performed to recess the top surfaces of the second dielectric layer 64 from the top surfaces of the first dielectric layer 62. The etch-back process may be an acceptable etching process, such as one that is selective to the second dielectric layer 64 (e.g., selectively etches the material of the second dielectric layer 64 at a faster rate than the material(s) of the first dielectric layer 62 and the third dielectric layer 66). Timed etch processes may be used to stop the etching of the second dielectric layer 64 after the trenches 56B, 56C reach a desired depth.

Figure 8:
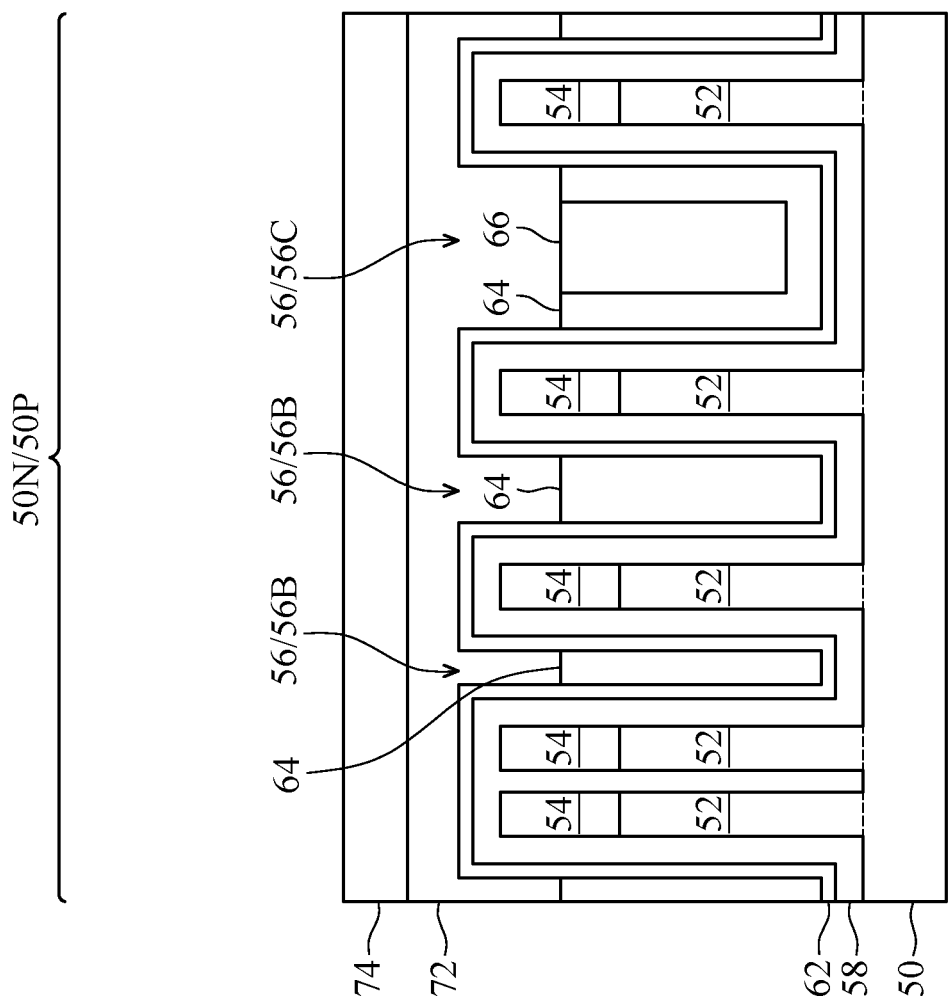

In FIG. 8, one or more dummy layer(s) are formed on the second dielectric layer 64 and the third dielectric layer 66 in the trenches 56B, 56C. The dummy layer(s) may fill (or overfill) the trenches 56B, 56C such that excess material of the dummy layer(s) covers the first dielectric layer 62. The dummy layer(s) are for buffering a CMP process to reduce loading during the CMP process. In the illustrated embodiment, the dummy layer(s) include a first dummy layer 72 and a second dummy layer 74.

The first dummy layer 72 is conformally deposited on the first dielectric layer 62, the second dielectric layer 64, and the third dielectric layer 66 in the trenches 56B, 56C. The first dummy layer 72 may be formed of a dielectric material such as silicon oxide, silicon nitride, a combination thereof, or the like, which may be deposited by a deposition process with high deposition rate such as CVD. In some embodiments, the first dummy layer 72 is deposited to a thickness in the range of 32 nm to 34 nm. The thickness of the first dummy layer 72 may be greater than the thickness of the third dielectric layer 66. The thickness of the first dummy layer 72 is controlled so that the first dummy layer 72 fills the trenches 56B, 56C. Specifically, the thickness of the first dummy layer 72 is selected to be large enough that the first dummy layer 72 completely fills (or overfills) the trenches 56B, 56C. In this embodiment, the first dummy layer 72 overfills the trenches 56B, 56C such that excess material of the first dummy layer 72 covers the first dielectric layer 62.

The second dummy layer 74 is formed on the first dummy layer 72. In this embodiment, the second dummy layer 74 extends along the top surface of the first dummy layer 72. The second dummy layer 74 may be formed of a dielectric material such as silicon oxide, silicon nitride, a combination thereof, or the like, which may be deposited or thermally grown according to acceptable techniques.

In some embodiments, the material of the first dummy layer 72 is harder (e.g., has a greater mechanical strength) than the material of the second dummy layer 74, so that the first dummy layer 72 may act as a CMP stop layer during subsequent removal of the second dummy layer 74. The first dummy layer 72 may (or may not) be formed of a ceramic dielectric material, which may be deposited by a deposition process with high conformality such as ALD. In some embodiments, the first dummy layer 72 and the second dielectric layer 64 are formed of the same ceramic dielectric material, and have the same composition of that ceramic dielectric material. For example, the first dummy layer 72 may be formed of silicon carbonitride having a carbon concentration that is greater than or equal to 12%, such as in the range of 10% to 15%.

Figure 9:
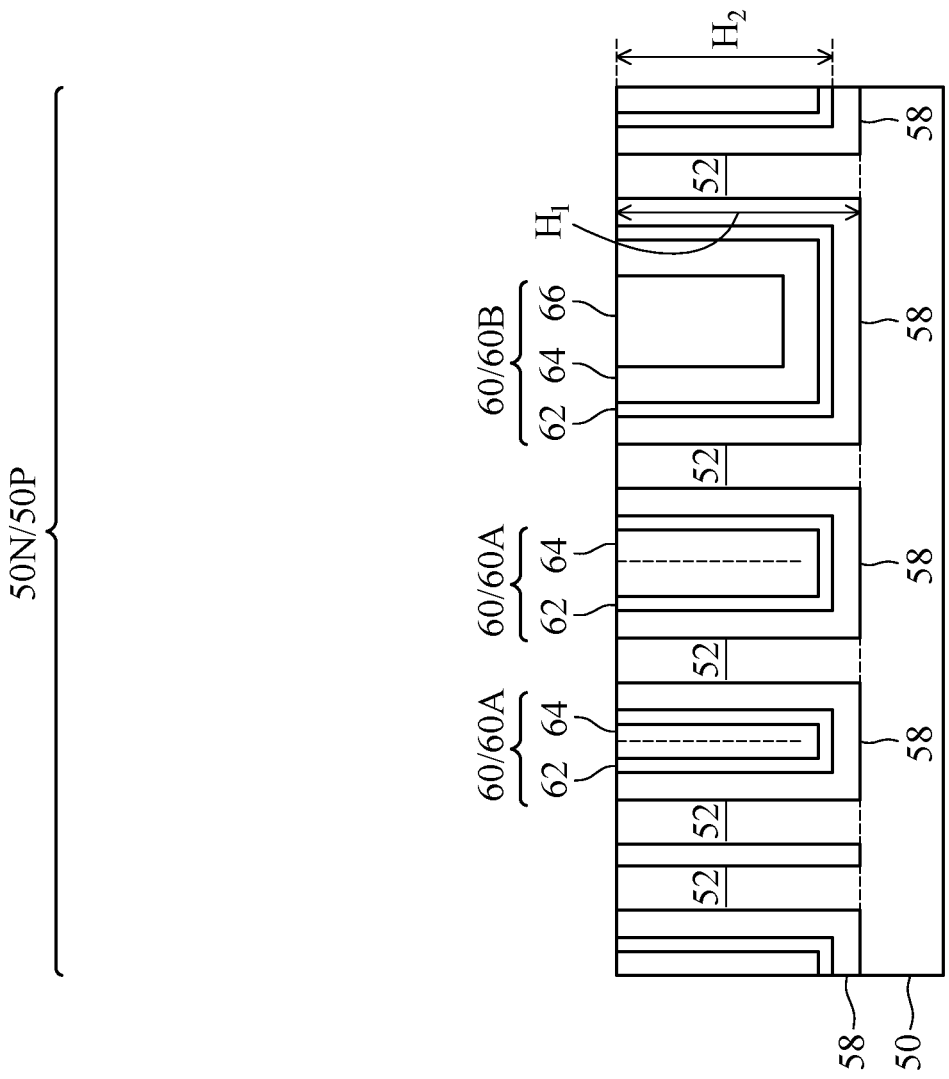

In FIG. 9, one or more planarization process(es) are performed to level the top surfaces of the insulation material 58, the first dielectric layer 62, the second dielectric layer 64, and the third dielectric layer 66 with the top surfaces of the semiconductor fins 52. In some embodiments, the planarization process(es) include a chemical mechanical polish (CMP) process, an etch-back process, combinations thereof, or the like. The planarization process(es) may also remove the mask 54 on the semiconductor fins 52. After the planarization process(es), the top surfaces of the semiconductor fins 52, the insulation material 58, the first dielectric layer 62, the second dielectric layer 64, and the third dielectric layer 66 are coplanar (within process variations) such that they are level with each other. The first dielectric layer 62, the second dielectric layer 64, and the third dielectric layer 66, after the planarization process(es), have portions left in the trenches 56B, 56C (thus forming the dielectric fins 60).

The dielectric fins 60 are formed in the trenches 56B, 56C and thus have different widths. Specifically, a first subset of the dielectric fins 60A in the trenches 56B have a lesser width than a second subset of the dielectric fins 60B in the trenches 56C. The widths of the dielectric fins 60A, 60B are determined by the thickness of the insulation material 58 and, respectively, by the widths of the trenches 56B, 56C (previously described). For example, forming the insulation material 58 to a greater thickness will cause the dielectric fins 60 to have a lesser width. The dielectric fins 60A will separate subsequently formed source/drain regions that are close together (e.g., source/drain regions of a same logic device or a same memory device). The dielectric fins 60B will separate subsequently formed source/drain regions that are far apart (e.g., source/drain regions of different logic devices or of different memory devices). In some embodiments, the dielectric fins 60A have a width in the range of 20 nm to 30 nm, and the dielectric fins 60B have a width in the range of 55 nm to 70 nm.

In some embodiments, the planarization process(es) include a first CMP process, a second CMP process, and a third CMP process. The first CMP process is performed to remove the second dummy layer 74. The second CMP process is performed to remove the portions of the first dummy layer 72 over the first dielectric layer 62. The third CMP process is performed to remove the portions of the insulation material 58, the first dielectric layer 62, the second dielectric layer 64, and the third dielectric layer 66 over the semiconductor fins 52; the masks 54; and the portions of the insulation material 58, the first dielectric layer 62, the second dielectric layer 64, and the third dielectric layer 66 along sidewalls of the masks 54. Other acceptable planarization process(es) may be used. Timed planarization process(es) may be used to stop the removal of the various layers after the semiconductor fins 52 and the dielectric fins 60 reach a desired height. In some embodiments, the semiconductor fins 52 have a height $H_1$ in the range of 90 nm to 120 nm, and the dielectric fins 60 have a height $H_2$ in the range of 65 nm to 80 nm. The height $H_2$ is less than the height $H_1$.

The steps described for FIGS. 6-9 are an example of the removal process(es) that may be utilized to form the dielectric fins 60. Other acceptable removal process(es) may be utilized. Further, one or more patterning process may optionally be performed during the steps described for FIGS. 6-9. For example, between the formation of the first dielectric layer 62 and the formation of the second dielectric layer 64, a hard mask may be formed, used for a fin cut process, and removed. Similarly, between the recessing of the third dielectric layer 66 and the recessing of the second dielectric layer 64, a hard mask may be formed, used for another fin cut process, and removed. Some of these patterning process will be subsequently described in greater detail for FIGS. 25A-34B. In another embodiment, the second dummy layer 74 may be a hard mask layer, which may be patterned to form an etching mask that is used to etch other features in the substrate 50 before the second dummy layer 74 is removed.

Figure 10:
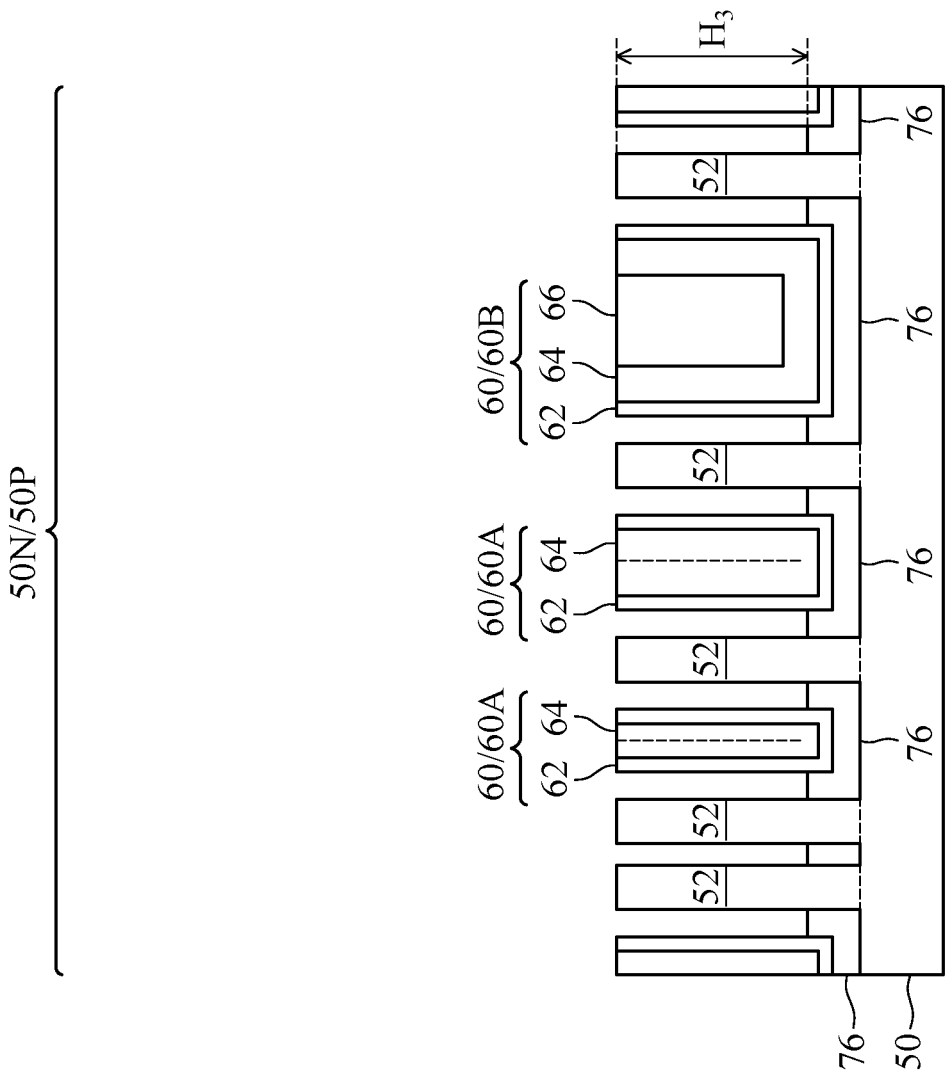

In FIG. 10, the insulation material 58 is recessed to form STI regions 76. The insulation material 58 is recessed such that upper portions of the semiconductor fins 52 and the dielectric fins 60 protrude above and from between neighboring STI regions 76. Further, the top surfaces of the STI regions 76 may have a flat surface as illustrated, a convex surface, a concave surface (such as dishing), or a combination thereof. The top surfaces of the STI regions 76 may be formed flat, convex, and/or concave by an appropriate etch. The STI regions 76 may be recessed using an acceptable etching process, such as one that is selective to the insulation material 58 (e.g., selectively etches the material(s) of the insulation material 58 at a faster rate than the material(s) of the semiconductor fins 52 and the dielectric fins 60). Timed etch processes may be used to stop the etching of the insulation material 58 after the STI regions 76 reach a desired height. In some embodiments, the semiconductor fins 52 and the dielectric fins 60 have a same height $H_3$ above the STI regions 76 in the range of 55 nm to 65 nm. The STI regions 76 include the remaining portions of the insulation material 58 in the trenches 56. The height $H_3$ is less than the height $H_2$ (see FIG. 9).

Further, appropriate wells (not separately illustrated) may be formed in the semiconductor fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the semiconductor fins 52, the dielectric fins 60, and the STI regions 76 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist is removed, such as by any acceptable ashing process.

Following or prior to the implanting of the p-type region 50P, a mask (not separately illustrated) such as a photoresist is formed over the semiconductor fins 52, the dielectric fins 60, and the STI regions 76 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the semiconductor fins 52, the grown materials (e.g., the second semiconductor layer 50B, see FIG. 2) may be in situ doped during growth, which may obviate the implantations, although in situ and implantation doping may be used together.

Figure 11:
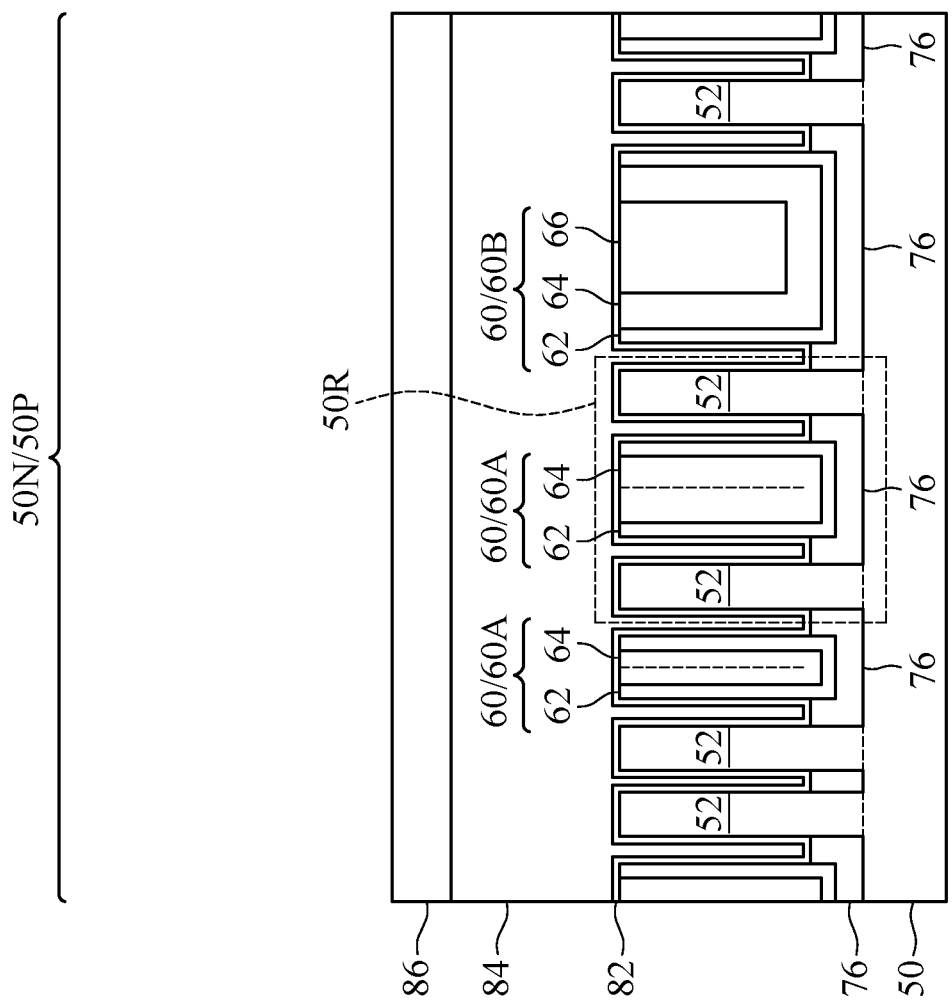

In FIG. 11, a dummy dielectric layer 82 is formed on the semiconductor fins 52 and the dielectric fins 60. The dummy dielectric layer 82 may be formed of a dielectric material such as silicon oxide, silicon nitride, a combination thereof, or the like, which may be deposited or thermally grown according to acceptable techniques such as ALD, in-situ steam growth (ISSG), rapid thermal oxidation (RTO), or the like. A dummy gate layer 84 is formed over the dummy dielectric layer 82, and a mask layer 86 is formed over the dummy gate layer 84. The dummy gate layer 84 may be deposited over the dummy dielectric layer 82 and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may be formed of material(s) that have a high etching selectivity from the etching of insulation materials, e.g., the dielectric fins 60, the STI regions 76, and/or the dummy dielectric layer 82. The mask layer 86 may be deposited over the dummy gate layer 84. The mask layer 86 may be formed of a dielectric material such as silicon nitride, silicon oxynitride, or the like. In this example, a single dummy gate layer 84 and a single mask layer 86 are formed across the n-type region 50N and the p-type region 50P. In the illustrated embodiment, the dummy dielectric layer 82 covers the semiconductor fins 52, the dielectric fins 60, and the STI regions 76, such that the dummy dielectric layer 82 extends over the STI regions 76 and between the dummy gate layer 84 and the STI regions 76. In another embodiment, the dummy dielectric layer 82 covers only the semiconductor fins 52.

FIGS. 12A-21C illustrate various additional steps in the manufacturing of embodiment devices. FIGS. 12A, 13A, 14A, 15A, 16A, 17A, 18A, 19A, 20A, and 21A illustrate features in a region 50R of FIG. 11. The region 50R may be in either of the n-type region 50N and the p-type region 50P.

Figures 12A, 12B:
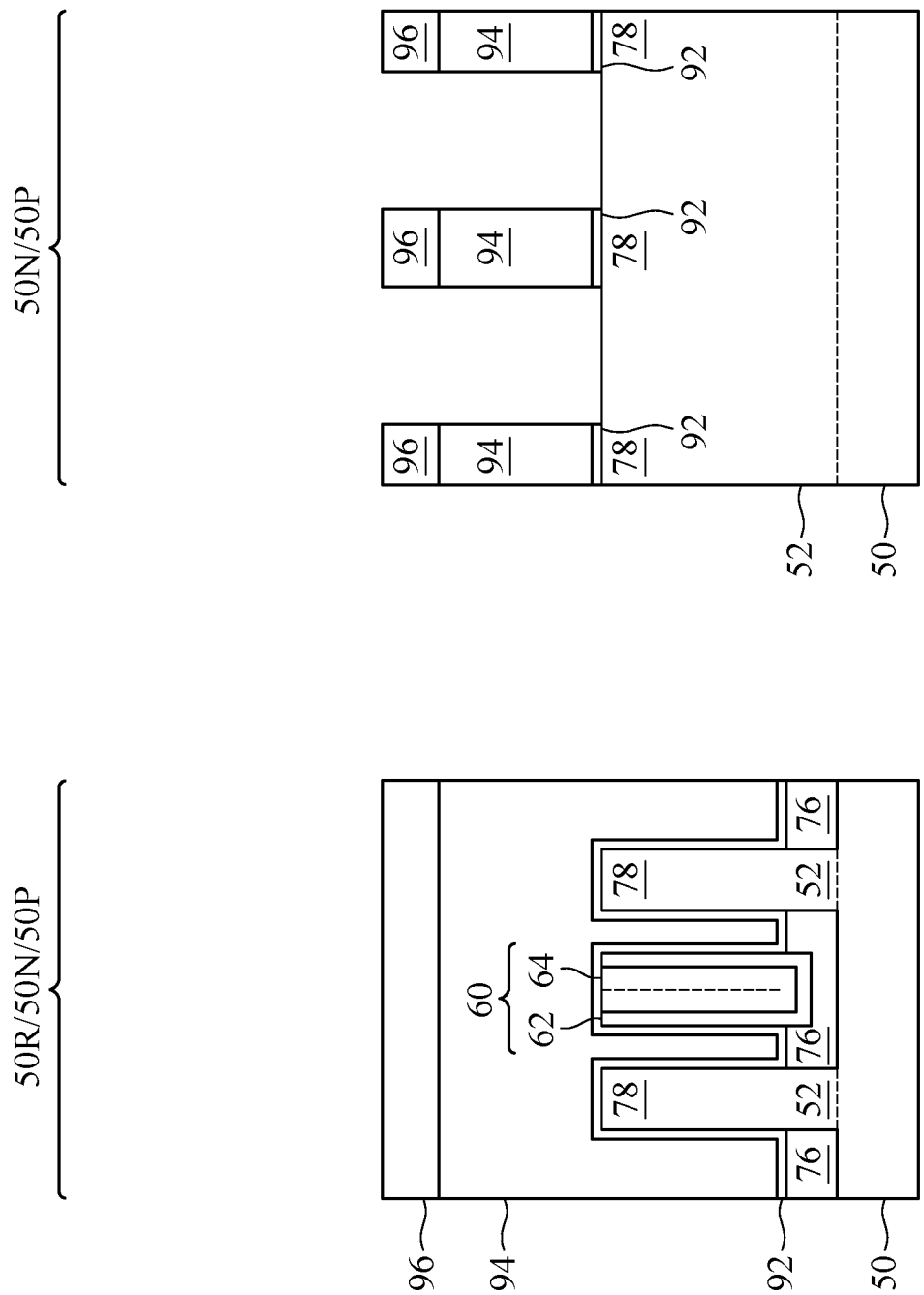
Figure 12C:
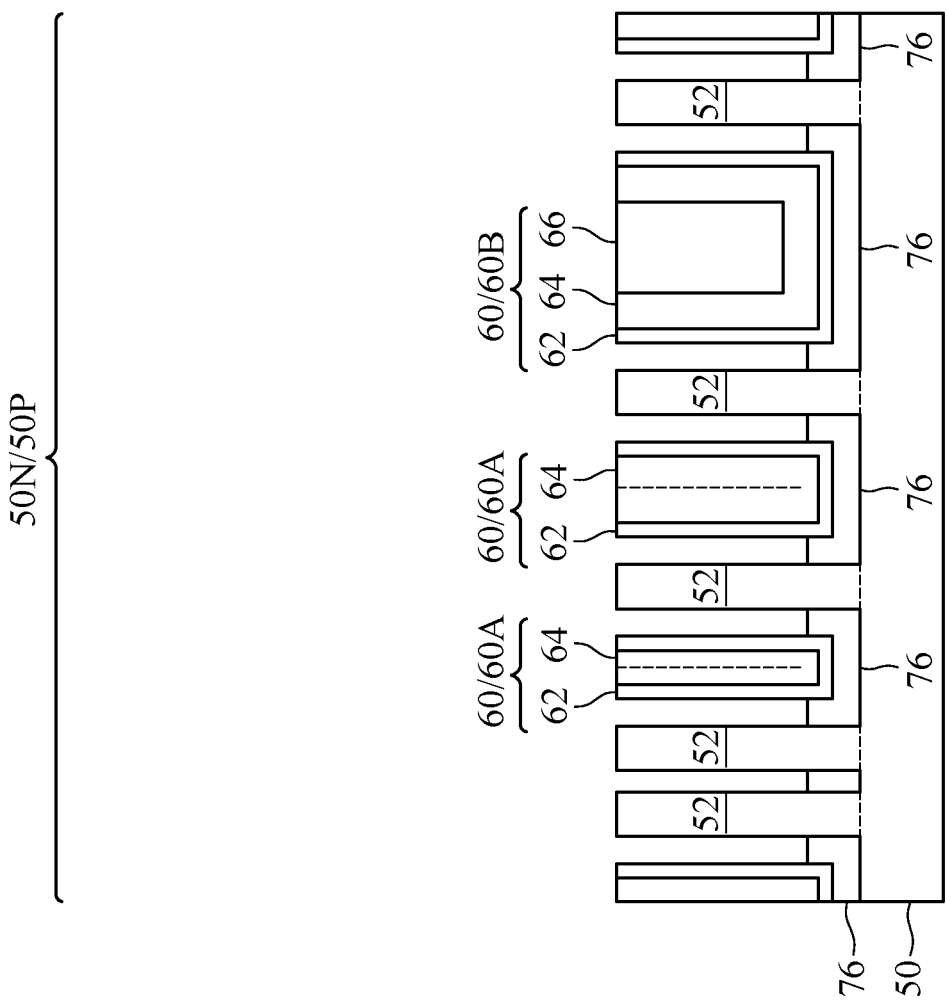

In FIGS. 12A-12C, the mask layer 86 is patterned using acceptable photolithography and etching techniques to form masks 96. The pattern of the masks 96 is then transferred to the dummy gate layer 84 by any acceptable etching technique to form dummy gates 94. The pattern of the masks 96 may optionally be further transferred to the dummy dielectric layer 82 by any acceptable etching technique to form dummy dielectrics 92. The dummy gates 94 cover respective channel regions 78 of the semiconductor fins 52. The dummy gates 94 may also cover respective portions of the dielectric fins 60. The pattern of the masks 96 may be used to physically separate adjacent dummy gates 94. The dummy gates 94 may have lengthwise directions substantially perpendicular (within process variations) to the lengthwise directions of the semiconductor fins 52 and the dielectric fins 60. The masks 96 may be removed during the patterning of the dummy gate 94, or may be removed during subsequent processing.

Figure 13C:
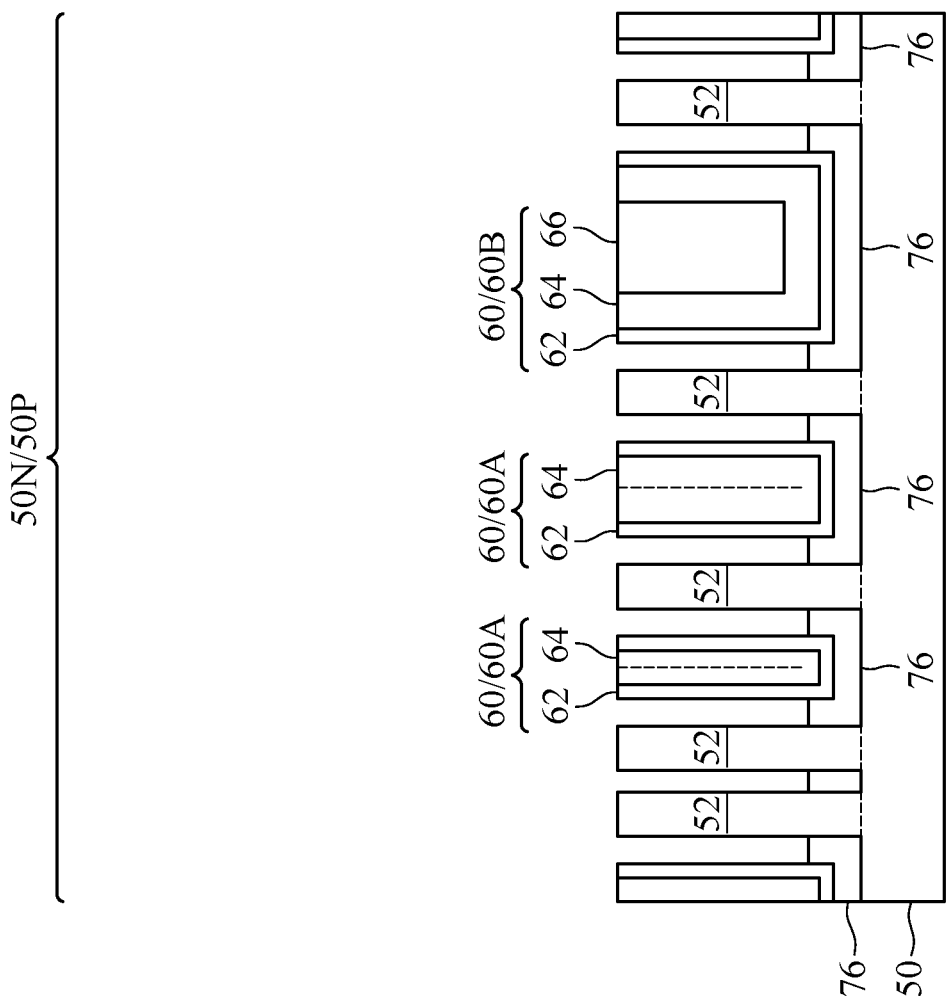

In FIGS. 13A-13C, gate spacers 102 are formed over the semiconductor fins 52, on exposed sidewalls of the masks 96 (if present), the dummy gates 94, and the dummy dielectrics 92. The gate spacers 102 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 102). In some embodiments the etch used to form the gate spacers 102 is adjusted so that the dielectric material(s), when etched, also have portions left on the sidewalls of the semiconductor fins 52 (thus forming fin spacers, not separately illustrated). After etching, the gate spacers 102 and the fin spacers (if present) can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the semiconductor fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the semiconductor fins 52 exposed in the n-type region 50N. The mask may then be removed. The n-type impurities may be any of the n-type impurities previously described, and the p-type impurities may be any of the p-type impurities previously described. During the implanting, the channel regions 78 remain covered by the dummy gates 94, so that the channel regions 78 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities. The impurities may also be implanted in the dielectric fins 60.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figures 14A, 14B:
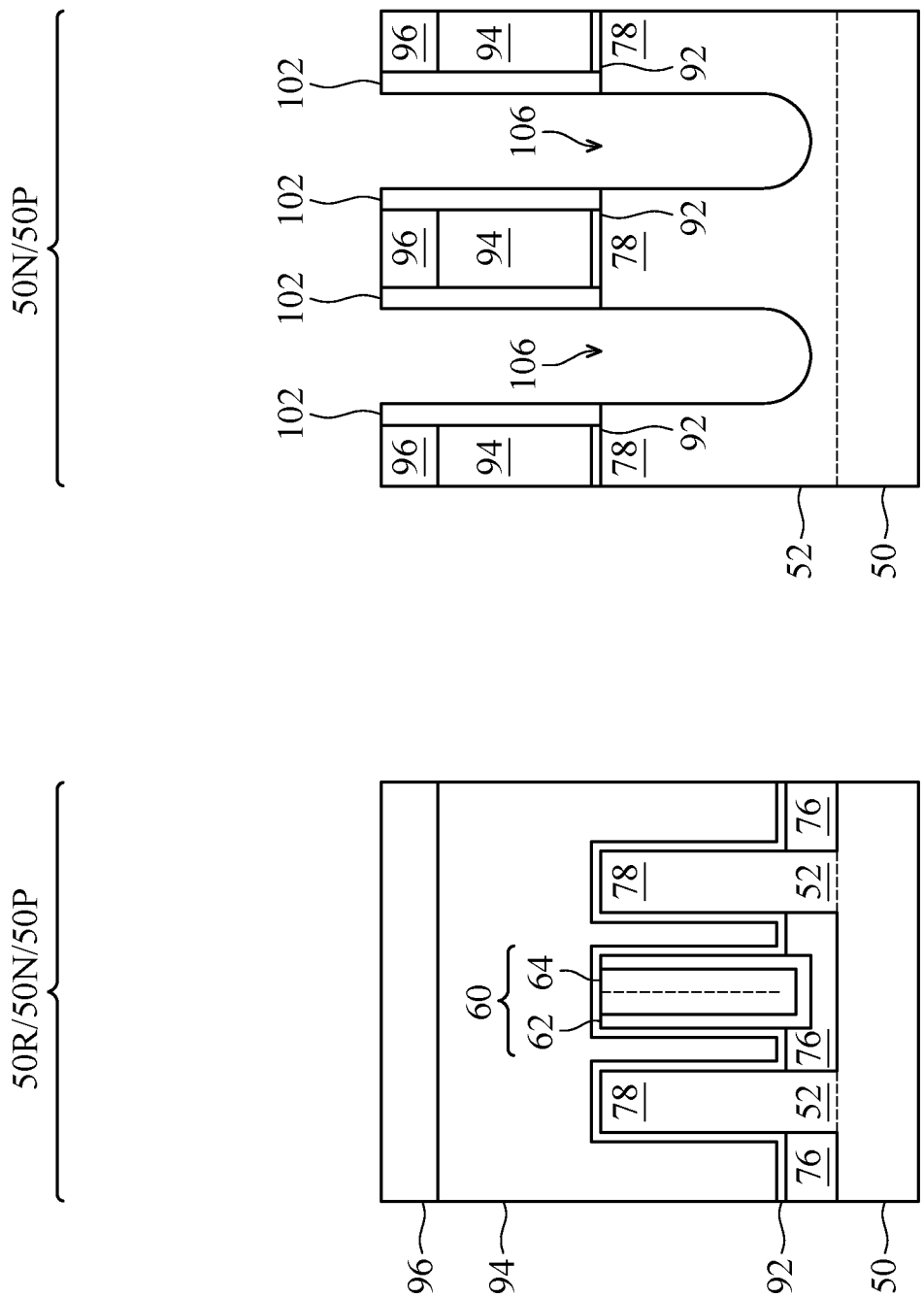
Figure 14C:
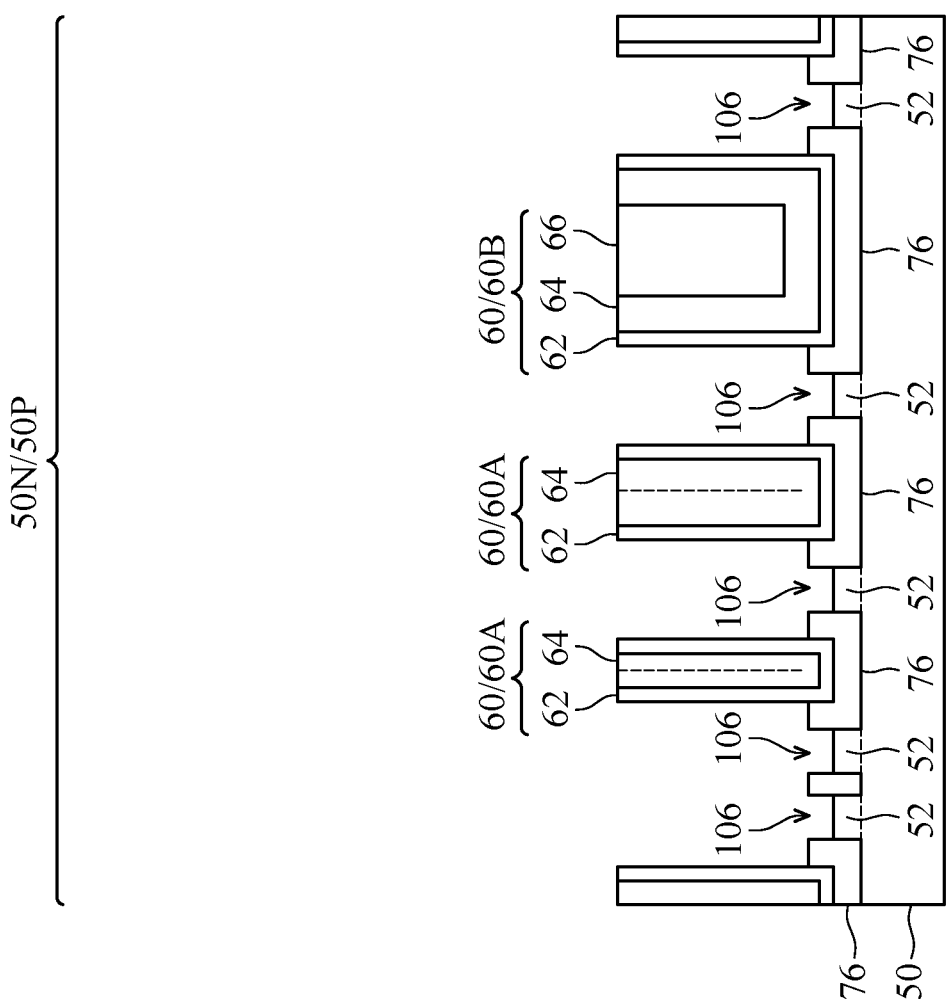

In FIGS. 14A-14C, source/drain recesses 106 are formed in the semiconductor fins 52. In the illustrated embodiment, the source/drain recesses 106 extend into the semiconductor fins 52. The source/drain recesses 106 may also extend into the substrate 50. In various embodiments, the source/drain recesses 106 may extend to a top surface of the substrate 50 without etching the substrate 50; the semiconductor fins 52 may be etched such that bottom surfaces of the source/drain recesses 106 are disposed below the top surfaces of the STI regions 76; or the like. The source/drain recesses 106 may be formed by etching the semiconductor fins 52 using an anisotropic etching processes, such as a RIE, a NBE, or the like. The etching process selectively etches the material(s) of the semiconductor fins 52 at a faster rate than the materials of the dielectric fins 60 and the STI regions 76. The gate spacers 102 and the dummy gates 94 collectively mask portions of the semiconductor fins 52 during the etching processes used to form the source/drain recesses 106. Timed etch processes may be used to stop the etching of the source/drain recesses 106 after the source/drain recesses 106 reach a desired depth. The dielectric fins 60 are not recessed, and remain between the semiconductor fins 52 after the source/drain recesses 106 are etched.

Figures 15A, 15B:
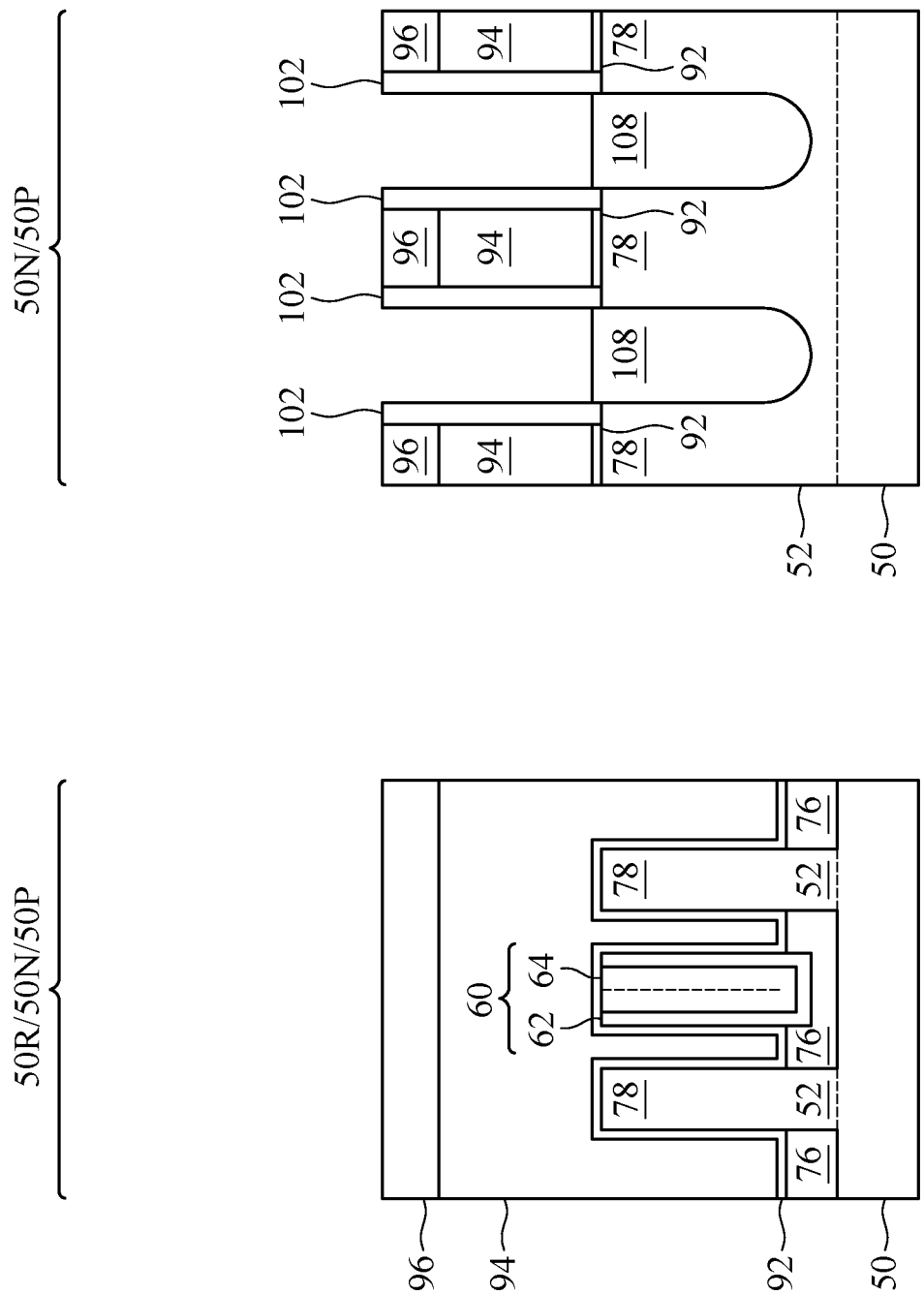
Figure 15C:
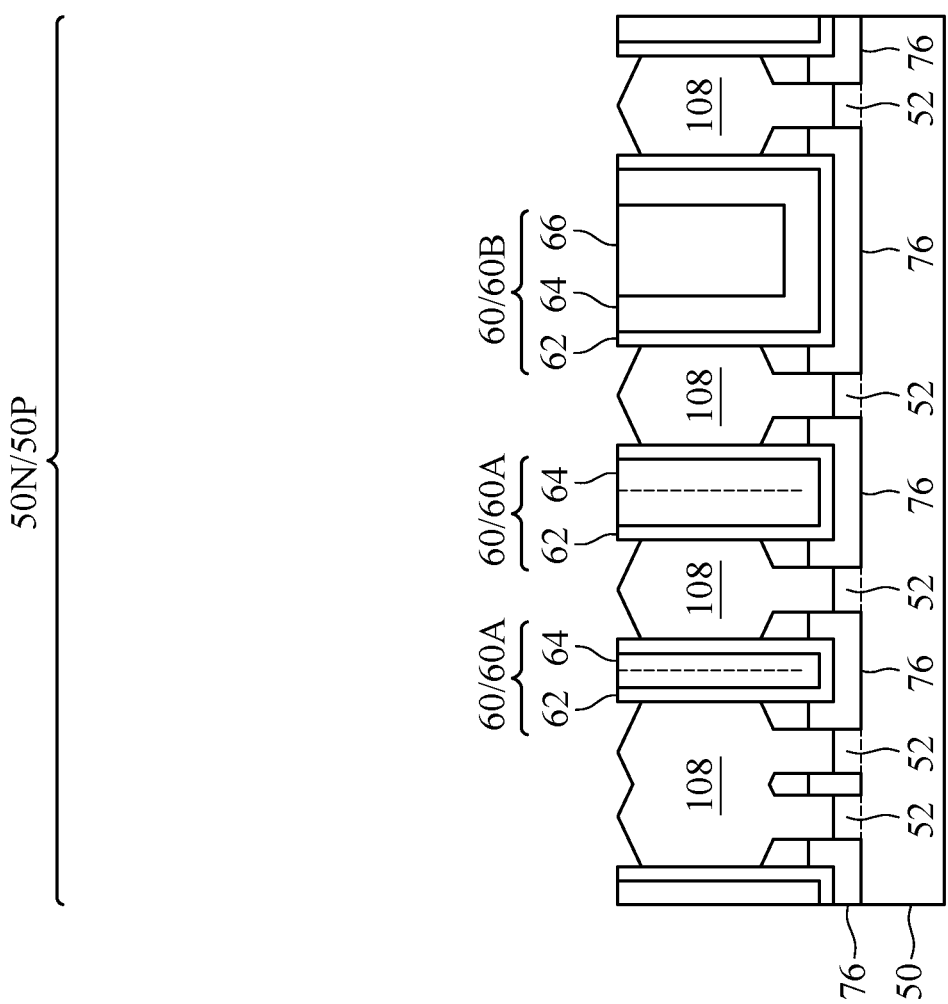

In FIGS. 15A-15C, epitaxial source/drain regions 108 are formed in the source/drain recesses 106. The epitaxial source/drain regions 108 are thus disposed in the semiconductor fins 52 such that each dummy gate 94 (and corresponding channel region 78) is between respective adjacent pairs of the epitaxial source/drain regions 108. The epitaxial source/drain regions 108 adjoin the channel regions 78. In some embodiments, the gate spacers 102 are used to separate the epitaxial source/drain regions 108 from the dummy gates 94 by an appropriate lateral distance so that the epitaxial source/drain regions 108 do not short out with subsequently formed gates of the resulting FinFETs. A material of the epitaxial source/drain regions 108 may be selected to exert stress in the respective channel regions 78, thereby improving performance.

The epitaxial source/drain regions 108 in the n-type region 50N may be formed by masking the p-type region 50P. Then, the epitaxial source/drain regions 108 in the n-type region 50N are epitaxially grown in the source/drain recesses 106 in the n-type region 50N. The epitaxial source/drain regions 108 may include any acceptable material appropriate for n-type devices. For example, if the semiconductor fins 52 are silicon, the epitaxial source/drain regions 108 in the n-type region 50N may include materials exerting a tensile strain on the channel regions 78, such as silicon, silicon carbide, phosphorous doped silicon carbide, silicon phosphide, or the like. The epitaxial source/drain regions 108 in the n-type region 50N may be referred to as "n-type source/drain regions." The epitaxial source/drain regions 108 in the n-type region 50N may have surfaces raised from respective surfaces of the semiconductor fins 52 and may have facets.

The epitaxial source/drain regions 108 in the p-type region 50P may be formed by masking the n-type region 50N. Then, the epitaxial source/drain regions 108 in the p-type region 50P are epitaxially grown in the source/drain recesses 106 in the p-type region 50P. The epitaxial source/drain regions 108 may include any acceptable material appropriate for p-type devices. For example, if the semiconductor fins 52 are silicon, the epitaxial source/drain regions 108 in the p-type region 50P may include materials exerting a compressive strain on the channel regions 78, such as silicon germanium, boron doped silicon germanium, germanium, germanium tin, or the like. The epitaxial source/drain regions 108 in the p-type region 50P may be referred to as "p-type source/drain regions." The epitaxial source/drain regions 108 in the p-type region 50P may have surfaces raised from respective surfaces of the semiconductor fins 52 and may have facets.

The epitaxial source/drain regions 108 and/or the semiconductor fins 52 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. The impurities may also be implanted in the dielectric fins 60. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer, a main layer, and a finishing layer (or more generally, a first semiconductor material layer, a second semiconductor material layer, and a third semiconductor material layer). Any number of semiconductor material layers may be used for the epitaxial source/drain regions 108. In embodiments where the epitaxial source/drain regions 108 include three semiconductor material layers, the liner layers may be grown in the source/drain recesses 106, the main layers may be grown on the liner layers, and the finishing layers may be grown on the main layers. The liner layers, the main layers, and the finishing layers may be formed of different semiconductor materials and may be doped to different impurity concentrations. In some embodiments, the main layers have a greater concentration of impurities than the finishing layers, and the main layers have a greater concentration of impurities than the liner layers. Forming the liner layers with a lesser concentration of impurities than the main layers may increase adhesion in the source/drain recesses 106, and forming the finishing layers with a lesser concentration of impurities than the main layers may reduce out-diffusion of dopants from the main layers during subsequent processing.

As a result of the epitaxy processes used to form the epitaxial source/drain regions 108, upper surfaces of the epitaxial source/drain regions have facets which expand laterally outward beyond sidewalls of the semiconductor fins 52. In some embodiments, these facets cause some adjacent epitaxial source/drain regions 108 to merge as illustrated by FIG. 15C. However, the dielectric fins 60 (where present) block the lateral epitaxial growth to prevent coalescing of some of the epitaxial source/drain regions 108. For example, the dielectric fins 60 may be formed at cell boundaries to separate the epitaxial source/drain regions 108 of adjacent cells. Therefore, some of the epitaxial source/drain regions 108 are separated by the dielectric fins 60. The epitaxial source/drain regions 108 may be grown until they contact the sidewalls of the dielectric fins 60. In some embodiments, fin spacers (not separately illustrated) are formed to cover a portion of the sidewalls of the semiconductor fins 52 that extend above the STI regions 76, thereby blocking the epitaxial growth. In another embodiment, the spacer etch used to form the gate spacers 102 is adjusted to not form fin spacers on the sidewalls of the semiconductor fins 52, so as to allow the epitaxial source/drain regions 108 to extend to the surfaces of the STI regions 76.

Figures 16A, 16B:
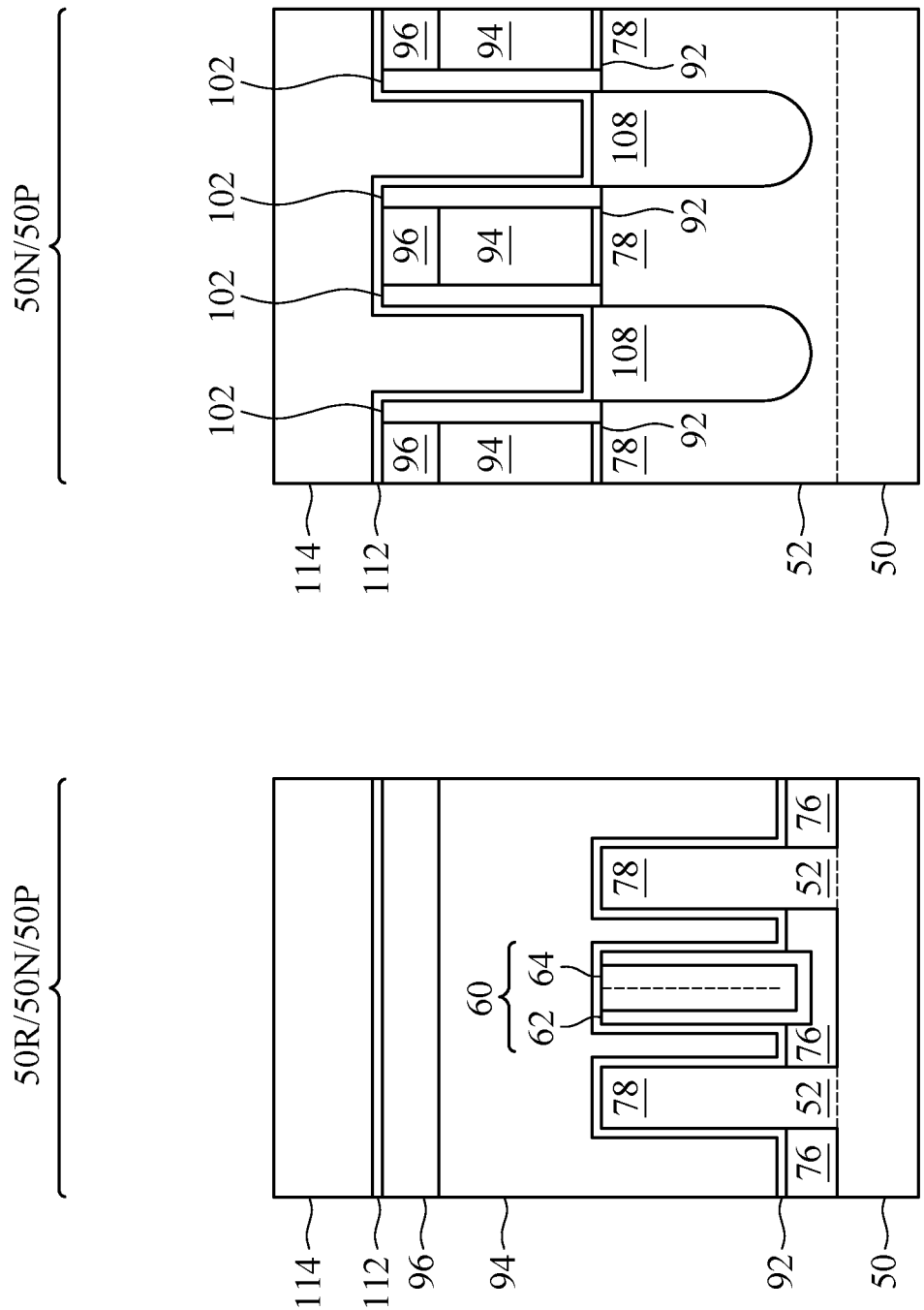
Figure 16C:
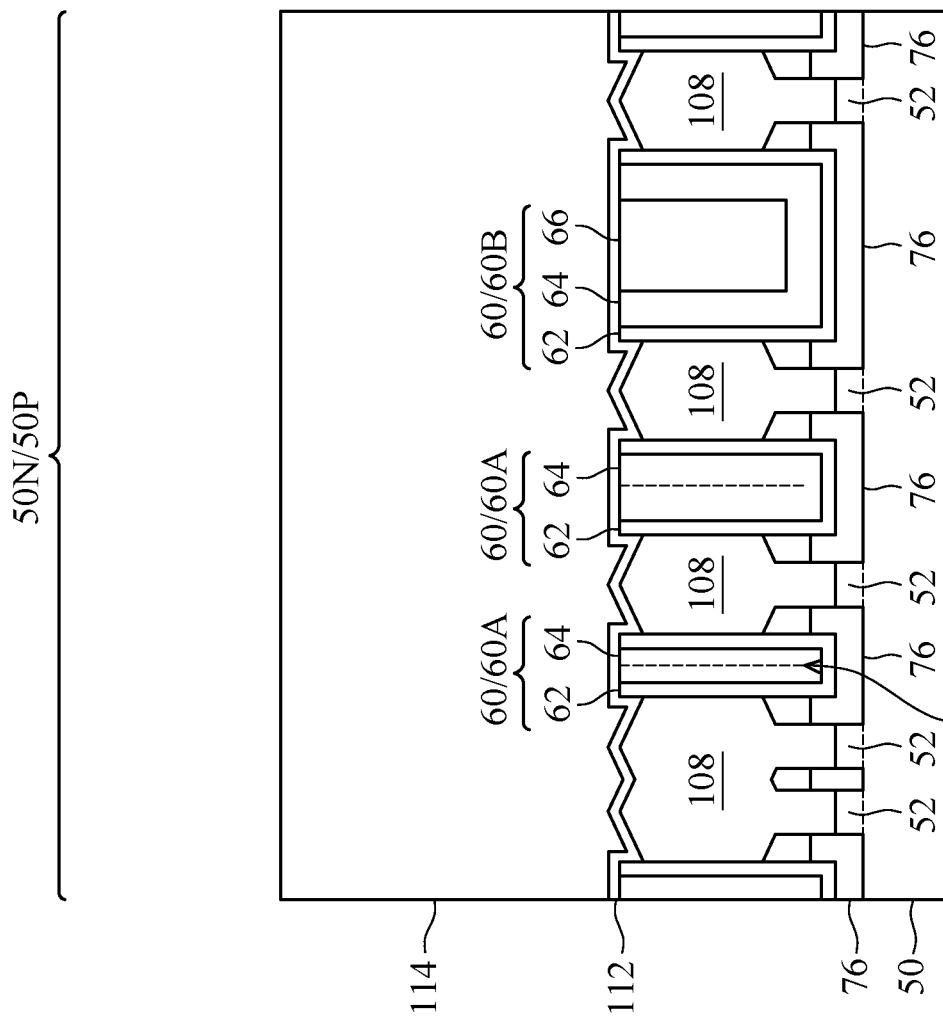

In FIGS. 16A-16C, a first ILD 114 is deposited over the epitaxial source/drain regions 108, the gate spacers 102, the masks 96 (if present) or the dummy gates 94, and the dielectric fins 60. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 108, the gate spacers 102, the masks 96 (if present) or the dummy gates 94, and the dielectric fins 60. The CESL 112 may be formed of a dielectric material, such as silicon nitride, silicon oxide, silicon oxynitride, or the like, having a high etching selectivity from the etching of the first ILD 114. The CESL 112 may be formed by any suitable method, such as CVD, ALD, or the like. When the dielectric fins 60 include vertical seams 64S, the CESL 112 may be exposed to the vertical seams 64S such that a surface of the CESL 112 forms an angle with each of the vertical seams 64S.

Figures 17A, 17B:
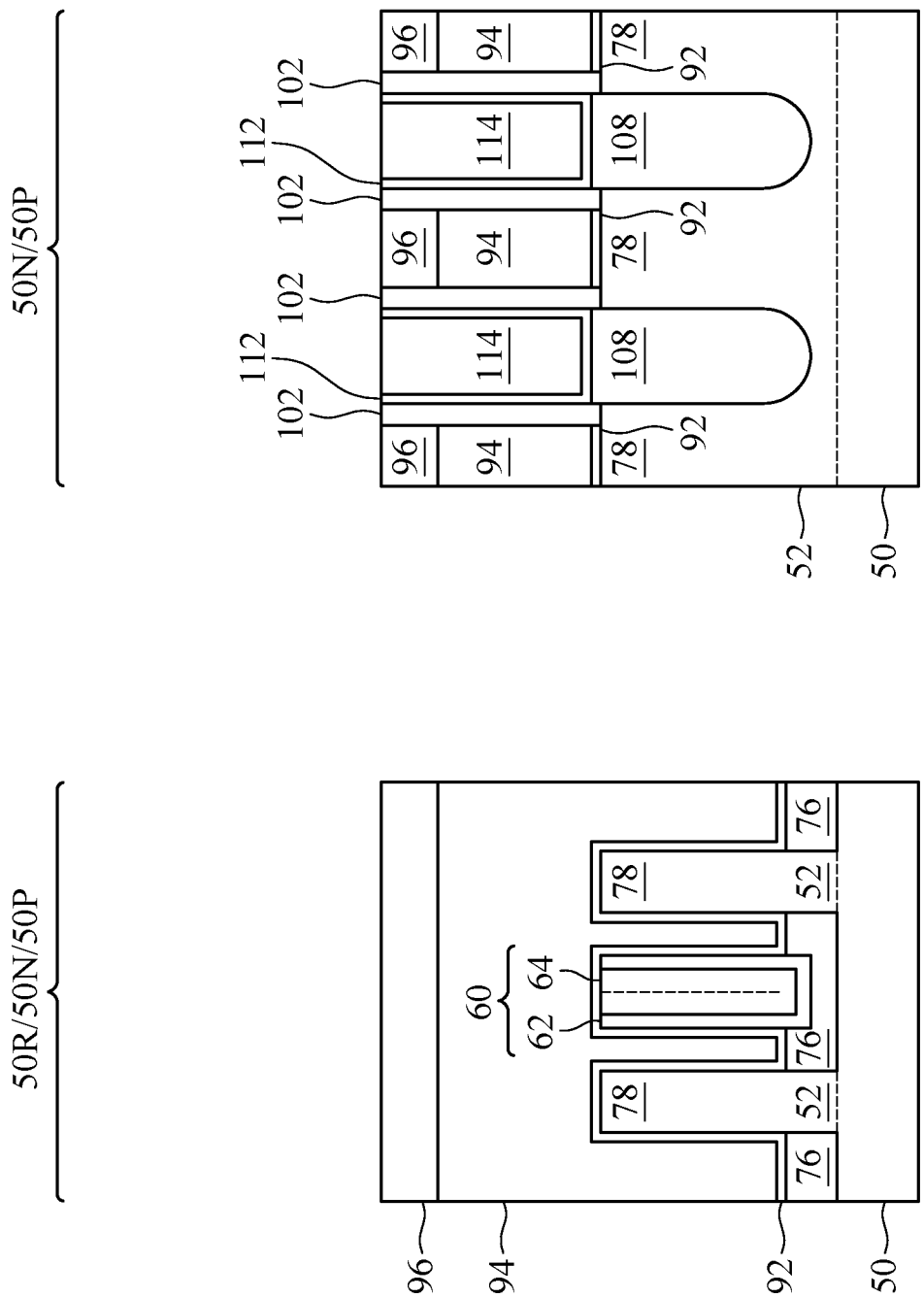
Figure 17C:
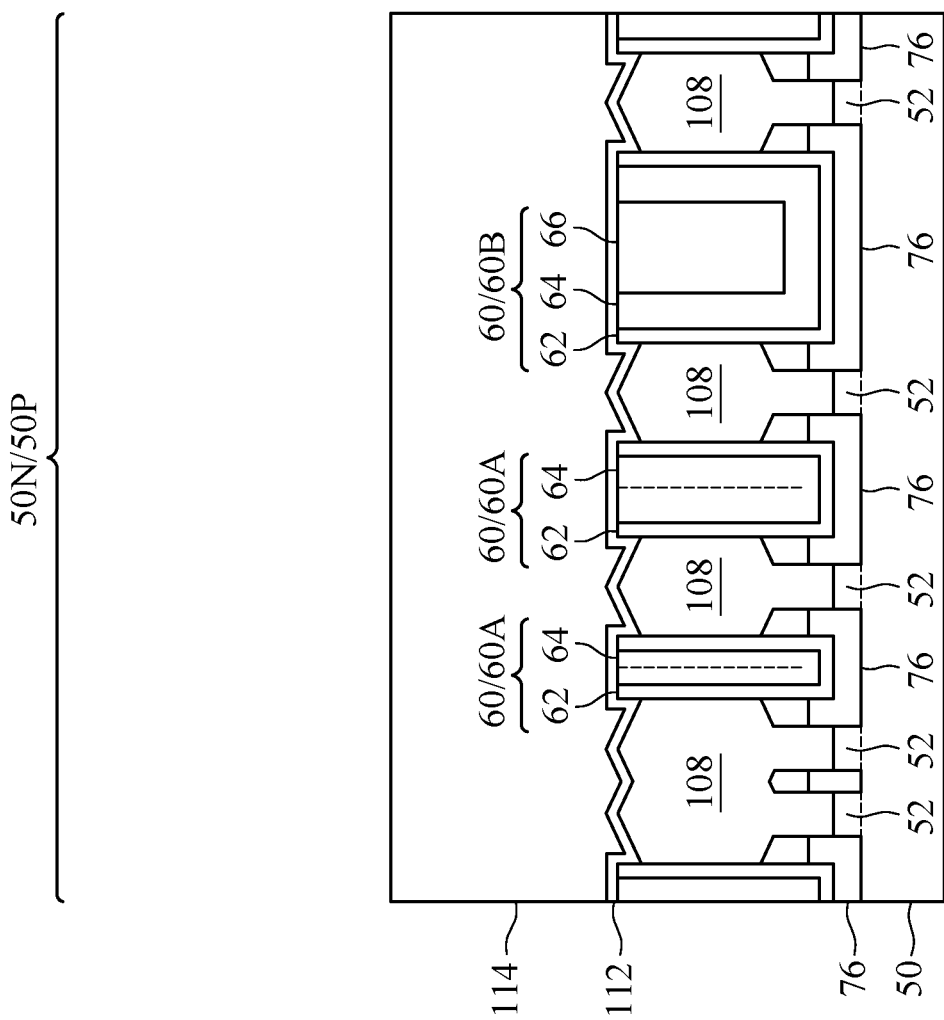

In FIGS. 17A-17C, a removal process is performed to level the top surfaces of the first ILD 114 with the top surfaces of the gate spacers 102 and the masks 96 (if present) or the dummy gates 94. In some embodiments, a planarization process such as a chemical mechanical polish (CMP) process, an etch-back process, combinations thereof, or the like may be utilized. The planarization process may also remove the masks 96 on the dummy gates 94, and portions of the gate spacers 102 along sidewalls of the masks 96. After the planarization process, the top surfaces of the first ILD 114, the CESL 112, the gate spacers 102, and the masks 96 (if present) or the dummy gates 94 are coplanar (within process variations) such that they are level with each other. Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 18B:
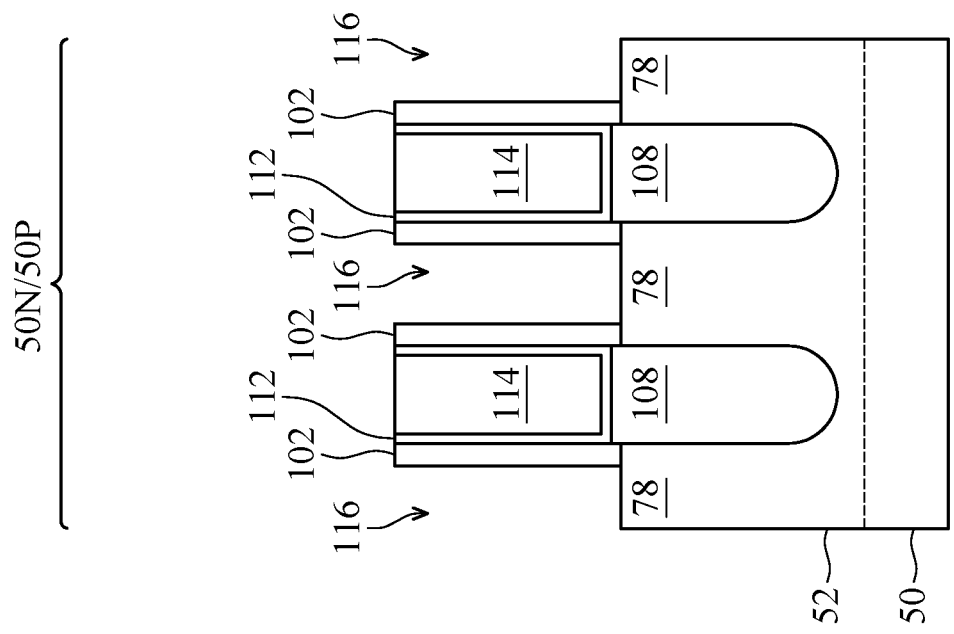
Figure 18A:
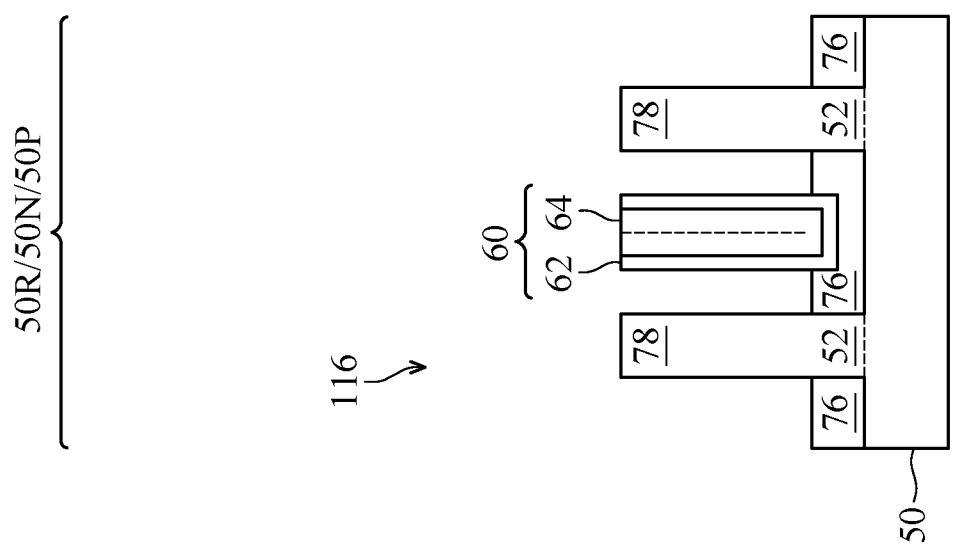
Figure 18C:
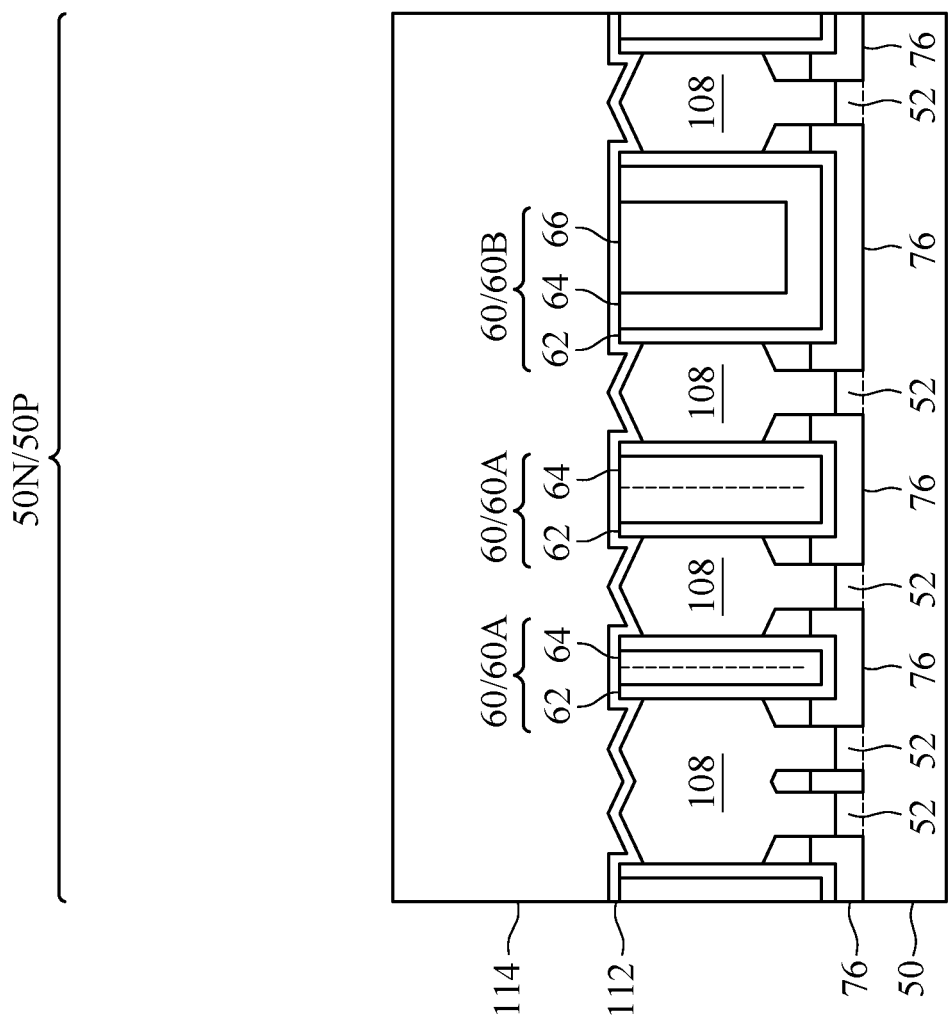

In FIGS. 18A-18C, the masks 96 (if present) and the dummy gates 94 are removed in an etching process, so that recesses 116 are formed. Portions of the dummy dielectrics 92 in the recesses 116 may also be removed. In some embodiments, only the dummy gates 94 are removed and the dummy dielectrics 92 remain and are exposed by the recesses 116. In some embodiments, the dummy dielectrics 92 are removed from recesses 116 in a first region of a die (e.g., a core logic region) and remain in recesses 116 in a second region of the die (e.g., an input/output region). In some embodiments, the dummy gates 94 are removed by an anisotropic dry etch process. For example, the etching process may include a dry etch process using reaction gas(es) that selectively etch the material of the dummy gates 94 at a faster rate than the materials of the first ILD 114 and the gate spacers 102. During the removal, the dummy dielectrics 92 may be used as etch stop layers when the dummy gates 94 are etched. The dummy dielectrics 92 may then be optionally removed after the removal of the dummy gates 94. Each recess 116 exposes and/or overlies a channel region 78 of a respective semiconductor fin 52. The recesses 116 may also expose the dielectric fins 60 (when the dummy dielectrics 92 are removed).

Figure 19B:
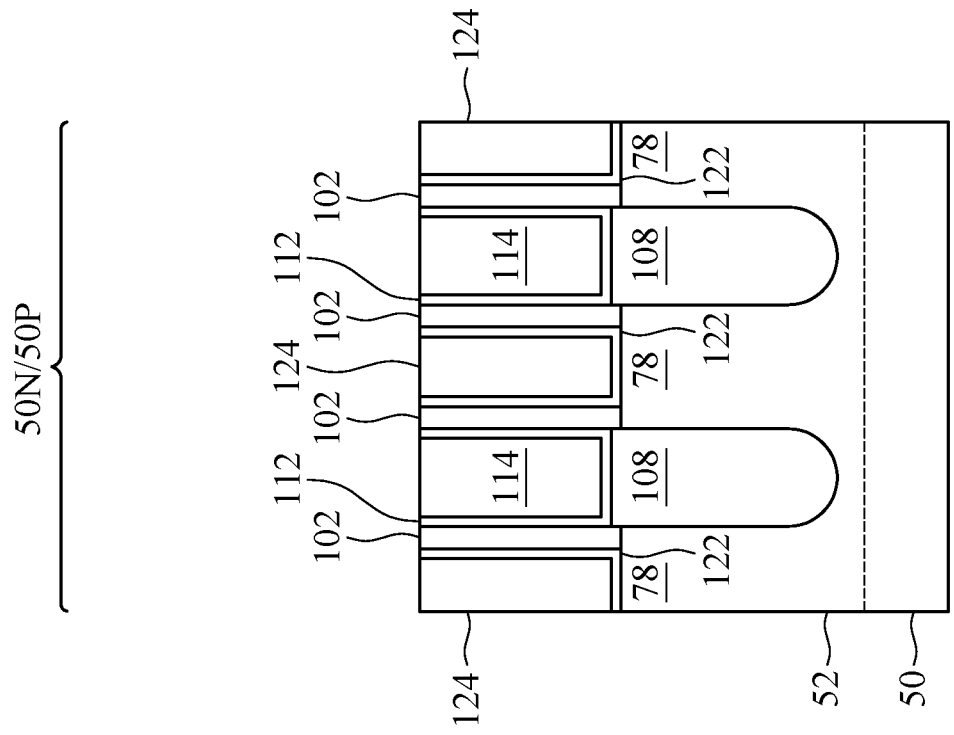
Figure 19A:
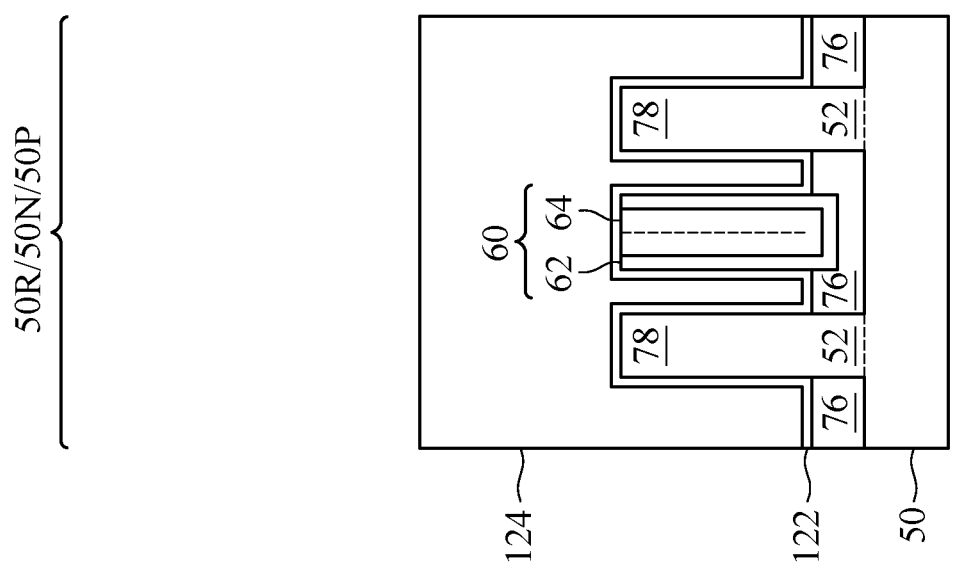
Figure 19C:
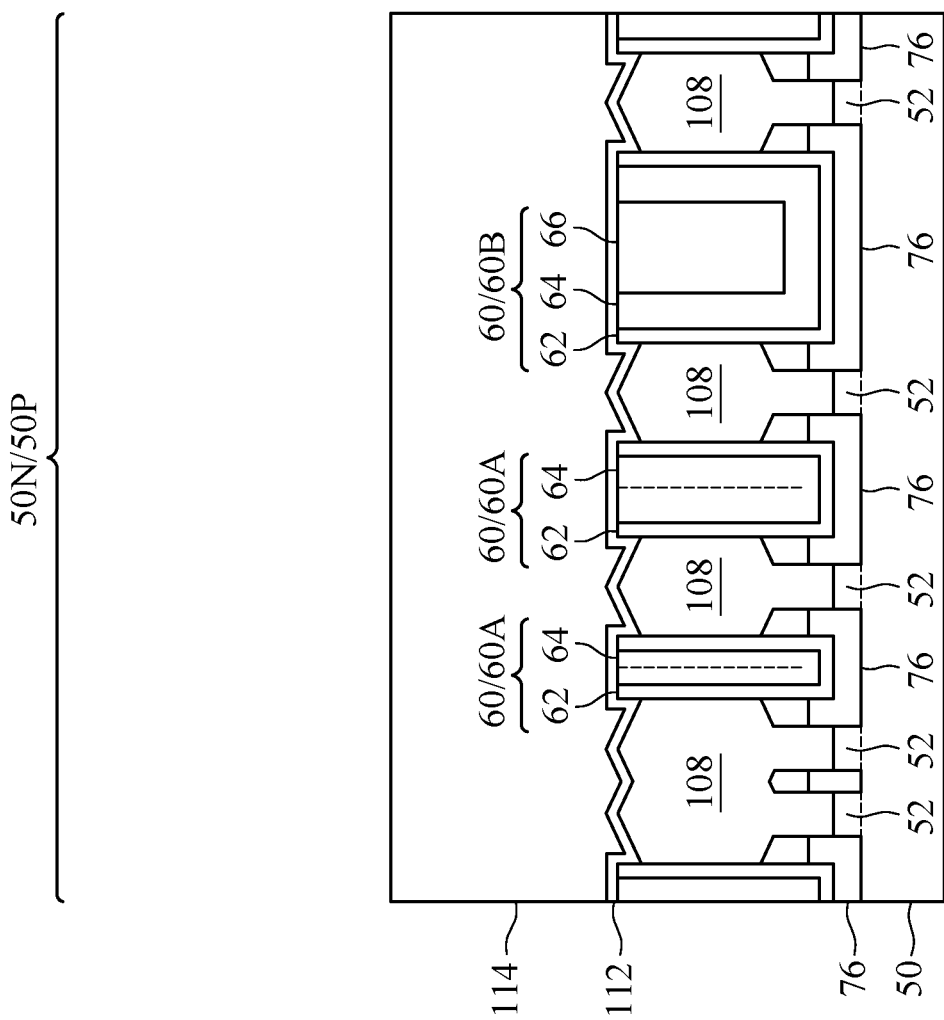

In FIGS. 19A-19C, gate dielectrics 122 and gate electrodes 124 are formed for replacement gates. Each respective pair of a gate dielectric 122 and a gate electrode 124 may be collectively referred to as a "gate structure." Each gate structure extends along sidewalls and a top surface of a channel region 78 of the semiconductor fins 52. Some of the gate structures further extend along sidewalls and a top surface of a dielectric fin 60.

The gate dielectrics 122 include one or more gate dielectric layer(s) on the top surfaces and the sidewalls of the semiconductor fins 52, on the top surfaces and the sidewalls of the dielectric fins 60, and on sidewalls of the gate spacers 102. The gate dielectrics 122 may include an oxide such as silicon oxide or a metal oxide, a silicate such as a metal silicate, combinations thereof, multi-layers thereof, or the like. The gate dielectrics 122 may include a high-k dielectric material (e.g., a dielectric material having a k-value greater than about 6.5), such as a metal oxide or a silicate of hafnium, aluminum, zirconium, lanthanum, manganese, barium, titanium, lead, and combinations thereof. The dielectric material(s) of the gate dielectrics 122 may be formed by molecular-beam deposition (MBD), ALD, PECVD, or the like. In embodiments where portions of the dummy dielectrics 92 remain in the recesses 116, the gate dielectrics 122 includes a material of the dummy dielectrics 92 (e.g., silicon oxide). Although single-layered gate dielectrics 122 are illustrated, the gate dielectrics 122 may include any number of interfacial layers and any number of main layers. For example, the gate dielectrics 122 may include an interfacial layer and an overlying high-k dielectric layer.

The gate electrodes 124 include one or more gate electrode layer(s) disposed over the gate dielectrics 122. The gate electrodes 124 may include a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 124 are illustrated, the gate electrodes 124 may include any number of work function tuning layers, any number of barrier layers, any number of glue layers, and a fill material.

As an example to form the gate structures, one or more gate dielectric layer(s) may be deposited in the recesses 116. The gate dielectric layer(s) may also be deposited on the top surfaces of the first ILD 114, the CESL 112, and the gate spacers 102. Subsequently, one or more gate electrode layer(s) may be deposited on the gate dielectric layer(s). The gate electrode layer(s) may fill the remaining portions of the recesses 116. A removal process may then be performed to remove the excess portions of the gate dielectric layer(s) and the gate electrode layer(s), which excess portions are over the top surfaces of the first ILD 114, the CESL 112, and the gate spacers 102. The gate dielectric layer(s), after the removal process, have portions left in the recesses 116 (thus forming the gate dielectrics 122). The gate electrode layer(s), after the removal process, have portions left in the recesses 116 (thus forming the gate electrodes 124). In some embodiments, a planarization process such as a chemical mechanical polish (CMP) process, an etch-back process, combinations thereof, or the like may be utilized. After the planarization process, the top surfaces of the gate spacers 102, the CESL 112, the first ILD 114, the gate dielectrics 122, and the gate electrodes 124 are coplanar (within process variations) such that they are level with each other.

The formation of the gate dielectrics 122 in the n-type region 50N and the p-type region 50P may occur simultaneously such that the gate dielectrics 122 in each region are formed of the same material(s), and the formation of the gate electrodes 124 may occur simultaneously such that the gate electrodes 124 in each region are formed of the same material(s). In some embodiments, the gate dielectrics 122 in each region may be formed by distinct processes, such that the gate dielectrics 122 may include different materials and/or have a different number of layers, and/or the gate electrodes 124 in each region may be formed by distinct processes, such that the gate electrodes 124 may include different materials and/or have a different number of layers. Various masking steps may be used to mask and expose appropriate regions when using distinct processes.

In some embodiments, no intervening layers are formed between the dielectric fins 60 and the gate dielectrics 122 or the CESL 112. As such, the gate dielectrics 122 (see FIG. 19A) contact and extend along the top surfaces of the first dielectric layer 62 and the second dielectric layer 64. Similarly, the CESL 112 (see FIG. 19C) contacts and extends along the top surfaces of the first dielectric layer 62 and the second dielectric layer 64.

Figures 20A, 20B:
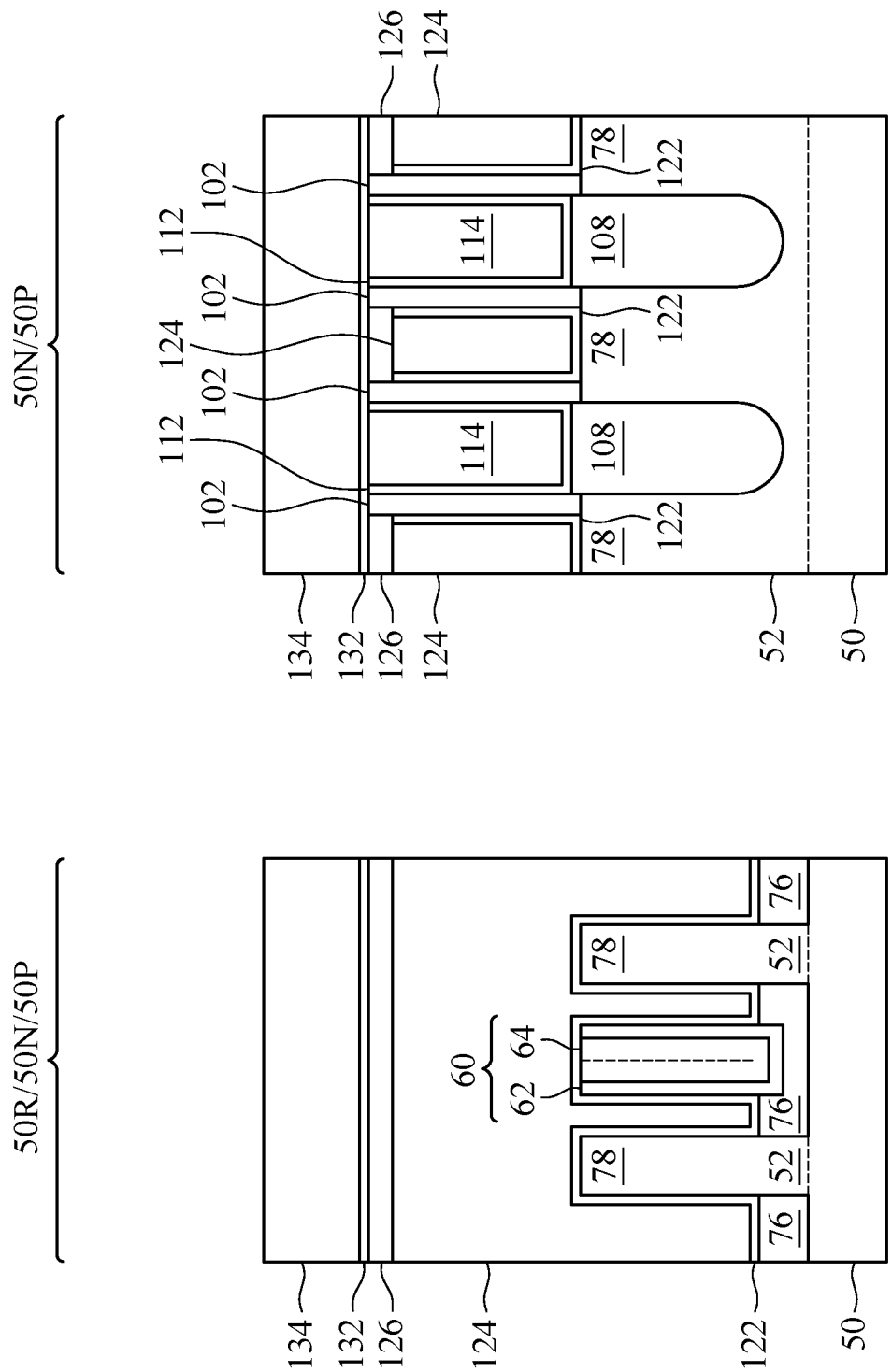
Figure 20C:
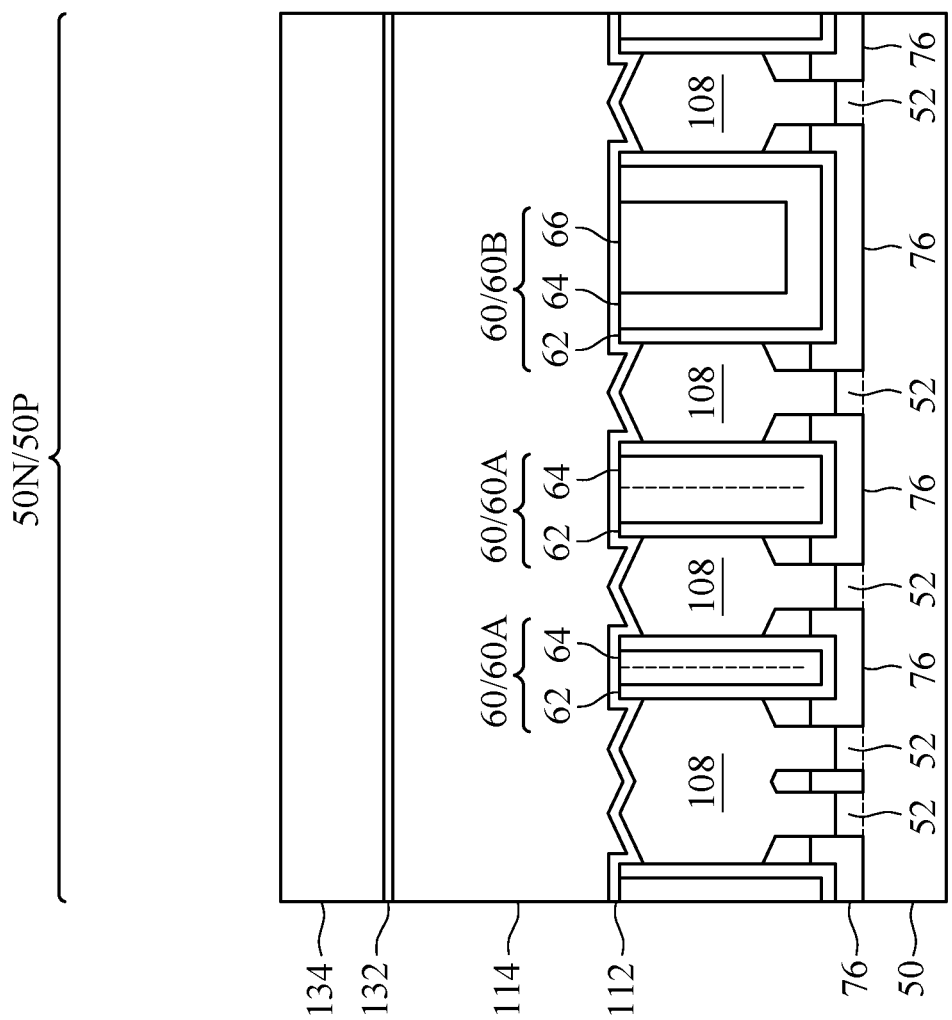

In FIGS. 20A-20C, a second ILD 134 is deposited over the gate spacers 102, the CESL 112, the first ILD 114, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

Optionally, before the formation of the second ILD 134, gate masks 126 are formed over the gate structures (including the gate dielectrics 122 and the gate electrodes 124). As an example to form the gate masks 126, the gate structures and optionally the gate spacers 102 may be recessed using any acceptable etching process. One or more dielectric material(s) may then be formed in the recesses and on the top surfaces of the CESL 112 and the first ILD 114. Acceptable dielectric materials include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other insulation materials formed by any acceptable process may be used. A removal process is performed to remove the excess portions of the dielectric material(s), which excess portions are over the top surfaces of the CESL 112 and the first ILD 114. The dielectric material(s), after the removal process, have portions left in the recesses (thus forming the gate masks 126). In some embodiments, a planarization process such as a chemical mechanical polish (CMP) process, an etch-back process, combinations thereof, or the like may be utilized. After the planarization process, the top surfaces of the CESL 112, the first ILD 114, and the gate masks 126 are coplanar (within process variations) such that they are level with each other. Gate contacts will be subsequently formed to penetrate through the gate masks 126 to contact the top surfaces of the gate electrodes 124.

In some embodiments, an etch stop layer (ESL) 132 is formed between the second ILD 134 and the gate spacers 102, the CESL 112, the first ILD 114, and the gate masks 126 (if present) or the gate dielectrics 122 and the gate electrodes 124. The ESL 132 may include a dielectric material, such as, silicon nitride, silicon oxide, silicon oxynitride, or the like, having a high etching selectivity from the etching of the second ILD 134.

Figures 21A, 21B:
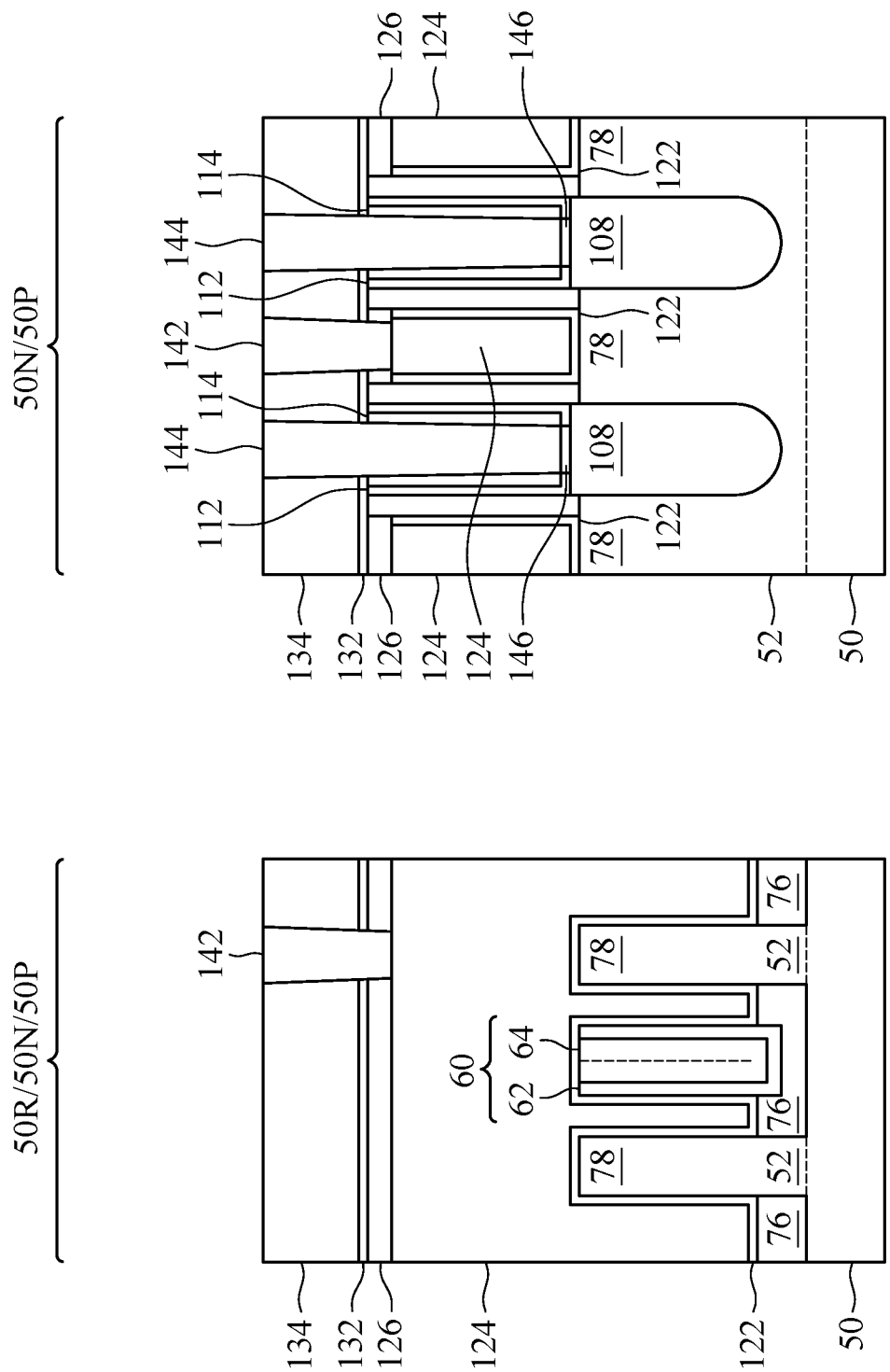
Figure 21C:
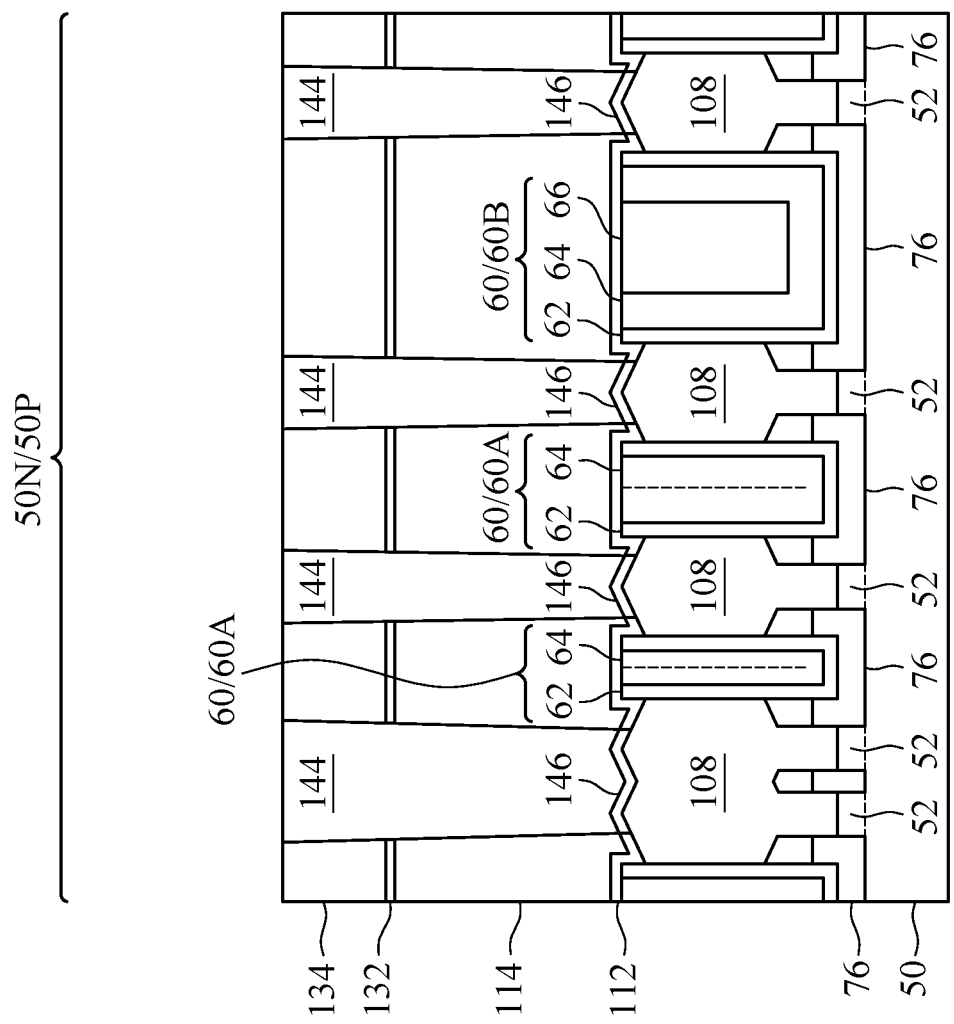

In FIGS. 21A-21C, gate contacts 142 and source/drain contacts 144 are formed to contact, respectively, the gate electrodes 124 and the epitaxial source/drain regions 108. The gate contacts 142 are physically and electrically coupled to the gate electrodes 124. The source/drain contacts 144 are physically and electrically coupled to the epitaxial source/drain regions 108.

As an example to form the gate contacts 142 and the source/drain contacts 144, openings for the gate contacts 142 are formed through the second ILD 134, the ESL 132, and the gate masks 126 (if present), and openings for the source/drain contacts 144 are formed through the second ILD 134, the ESL 132, the first ILD 114, and the CESL 112. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 108 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. The metal can be any metal capable of reacting with the semiconductor materials (e.g., silicon, silicon-germanium, germanium, etc.) of the epitaxial source/drain regions 108 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

The devices may be interconnected by metallization layers in an overlying interconnect structure to form integrated circuits. The overlying interconnect structure can be formed in a back end of line (BEOL) process, in which the metallization layers are connected to the gate contacts 142 and the source/drain contacts 144. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

Figure 22:
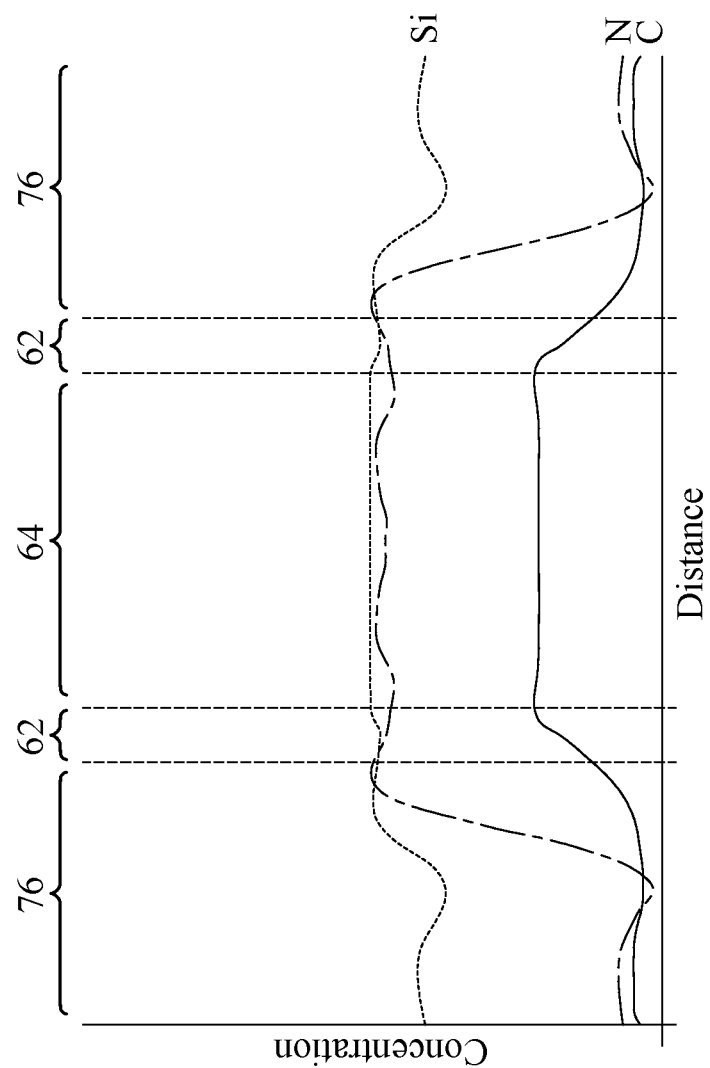
FIG. 22 is a graph illustrating the composition of the materials of a dielectric fin.

FIG. 22 is a graph illustrating the composition of the materials of the dielectric fins 60, in accordance with some embodiments. Specifically, FIG. 22 illustrates an embodiment where the first dielectric layer 62 and the second dielectric layer 64 are formed of the same ceramic dielectric material (e.g., silicon carbonitride), and have different compositions of that ceramic dielectric material (e.g., the second dielectric layer 64 has a greater carbon concentration than the first dielectric layer 62). The concentration of silicon has a gradient and increases from the first dielectric layer 62 to the second dielectric layer 64. The concentration of nitrogen has a gradient and decreases from the first dielectric layer 62 to the second dielectric layer 64. The concentration of carbon has a gradient and increases from the first dielectric layer 62 to the second dielectric layer 64.

Figures 23A, 23B:
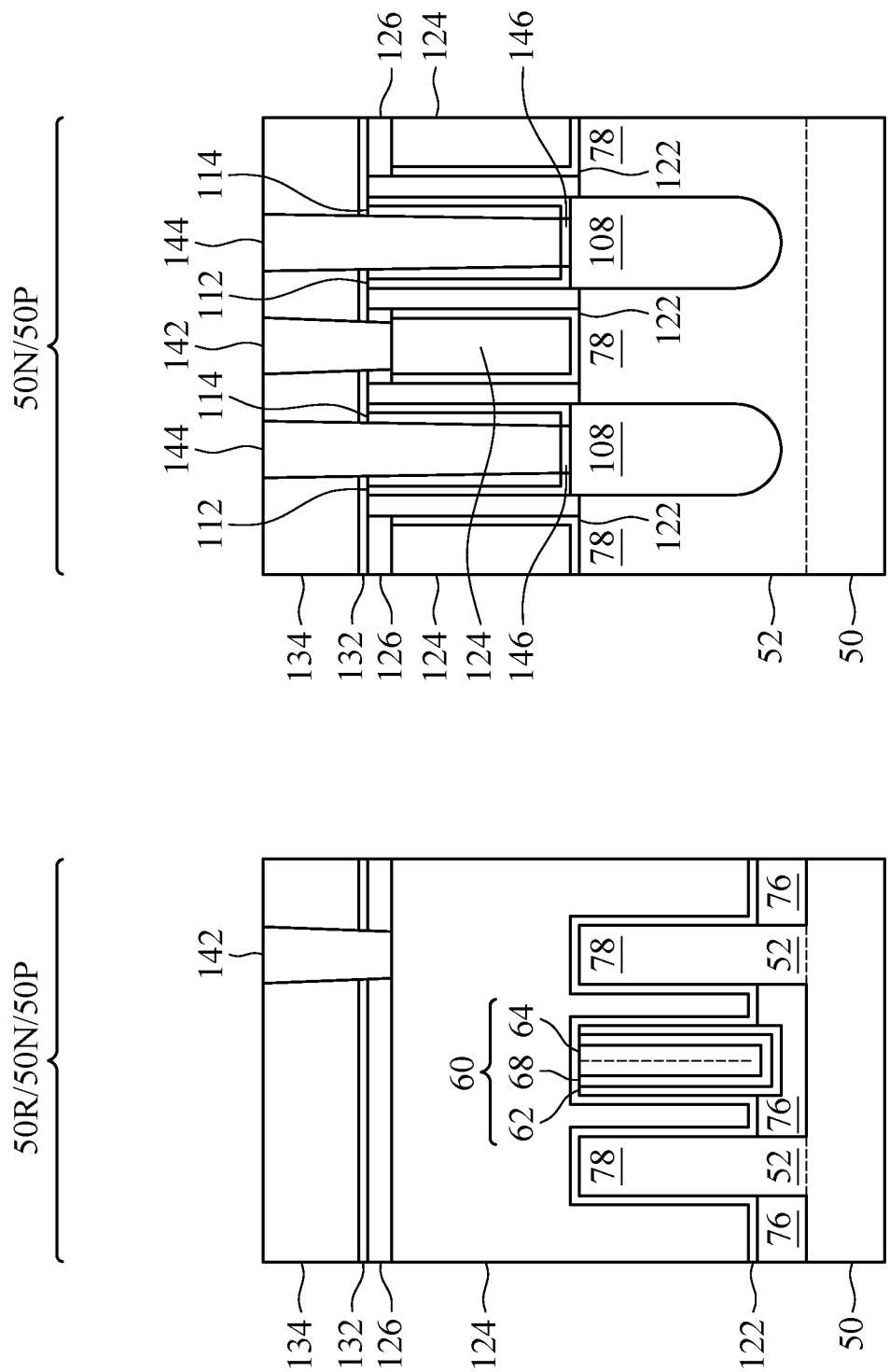
FIGS. 23A-23C are views of FinFETs, in accordance with some embodiments.
Figure 23C:
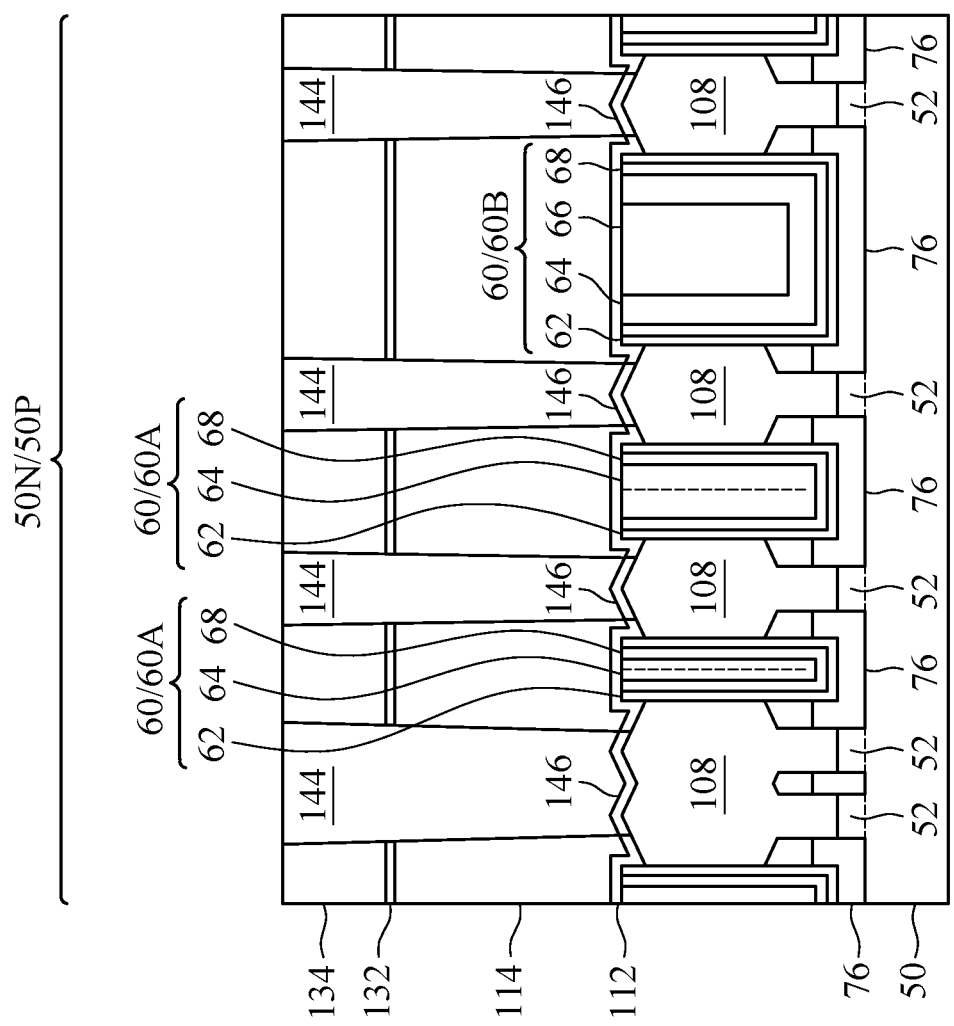

FIGS. 23A-23C are views of FinFETs, in accordance with some embodiments. This embodiment is similar to the embodiment of FIGS. 21A-21C, except the dielectric fins 60 further include a fourth dielectric layer 68, which is between the first dielectric layer 62 and the second dielectric layer 64. The fourth dielectric layer 68 is formed of a ceramic dielectric material such as silicon carbonitride, silicon nitride, silicon carbide, aluminum oxide, silicon oxycarbonitride, or the like, which may be deposited by a deposition process with high conformality such as ALD. In some embodiments, the fourth dielectric layer 68 is deposited to a thickness in the range of 0.5 nm to 3 nm. The material of the fourth dielectric layer 68 may be different from the materials of the first dielectric layer 62 and the second dielectric layer 64. In some embodiments where the first dielectric layer 62 and the second dielectric layer 64 are formed of the different compositions of the same ceramic dielectric material, the fourth dielectric layer 68 may also be formed of that ceramic dielectric material and may also have a different composition than the first dielectric layer 62 and the second dielectric layer 64. In some embodiments, the material of the fourth dielectric layer 68 is harder (e.g., has a greater mechanical strength) than the material of the first dielectric layer 62, and the material of the second dielectric layer 64 is harder than the material of the fourth dielectric layer 68. In some embodiments, the carbon concentration of the fourth dielectric layer 68 is less than the carbon concentration of the second dielectric layer 64 and greater than the carbon concentration of the first dielectric layer 62. Including the fourth dielectric layer 68 allows it to act as a gradient layer to buffer stress in the dielectric fins 60.

Figure 24:
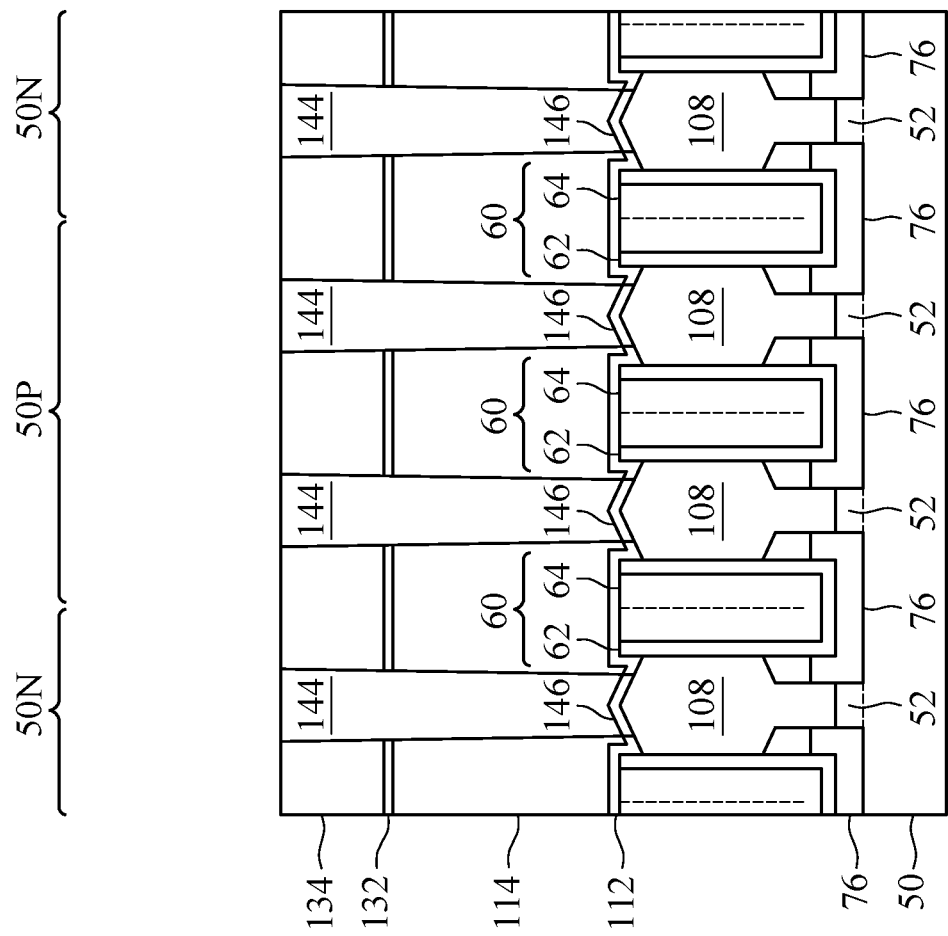
FIG. 24 is a view of FinFETs, in accordance with some embodiments.

FIG. 24 is a view of FinFETs, in accordance with some embodiments. This embodiment is similar to the embodiment of FIG. 21C, except a p-type region 50P is between two n-type regions 50N. FIG. 24 may be a view of a region of a memory device, e.g., an SRAM device. The dielectric fins 60 prevent coalescing of each of the epitaxial source/drain regions 108 of the memory device. Although not separately illustrated in FIG. 24, the epitaxial source/drain regions 108 in the p-type region 50P may have a different shape than the epitaxial source/drain regions 108 in the n-type regions 50N.

FIGS. 25A-34B are view of intermediate stages in the manufacturing of FinFETs, in accordance with some embodiments. FIGS. 25A-34B are simplified views, and some features are omitted for clarity of illustration. FIGS. 25A-34B illustrate additional views of a semiconductor device during the process described above with respect to FIGS. 3 through 8. FIGS. 25A, 26A, 27A, 28A, 29A, 30A, 31A, 32A, 33A, and 34A are three-dimensional views illustrating a first region of a die (e.g., a logic region 50L). FIGS. 25B, 26B, 27B, 28B, 29B, 30B, 31B, 32B, 33B, and 34B are three-dimensional views illustrating a second region of the die (e.g., a memory region 50M).

Figure 25B:
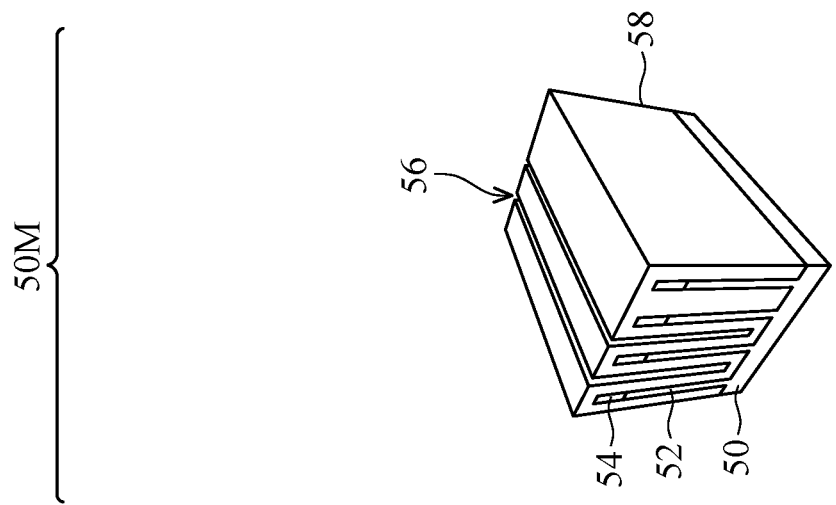
FIGS. 25A-34B are view of intermediate stages in the manufacturing of FinFETs, in accordance with some embodiments.
Figure 25A:
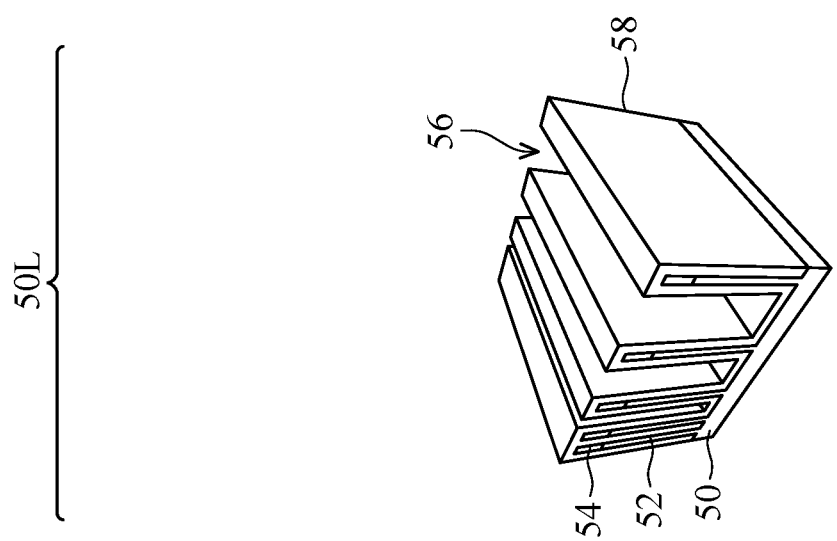
Figure 25C:
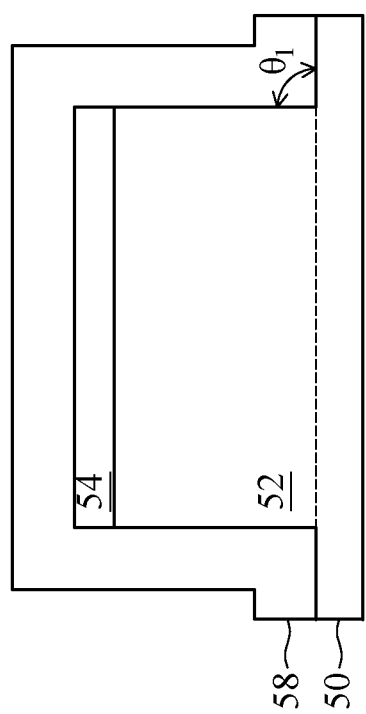

In FIGS. 25A and 25B, the semiconductor fins 52 are formed in the substrate 50. The insulation material 58 is then formed in the trenches 56. The semiconductor fins 52 and the trenches 56 may be formed in the manner described with respect to FIGS. 3-4. After the semiconductor fins 52 are formed, the sidewalls of the semiconductor fins 52 form an angle $\theta_1$ with respect to a major surface of the substrate 50, as shown in FIG. 25C. In some embodiments, the angle $\theta_1$ is in the range of 85 degrees to 95 degrees.

Figure 26B:
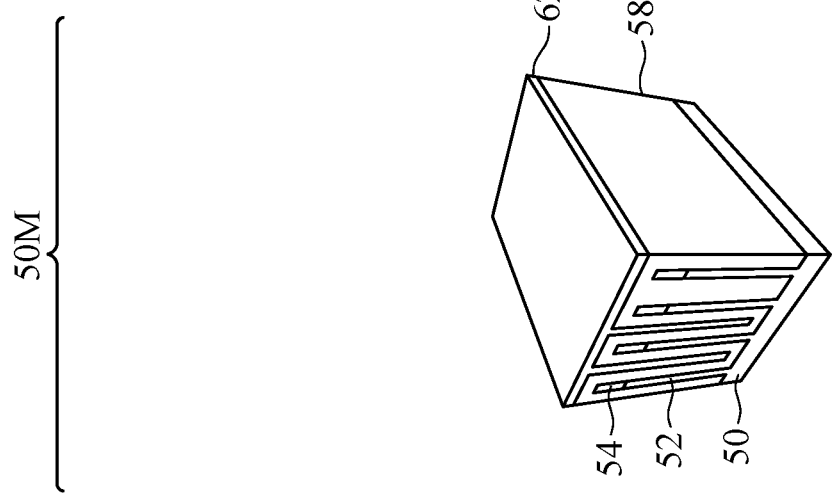
Figure 26A:
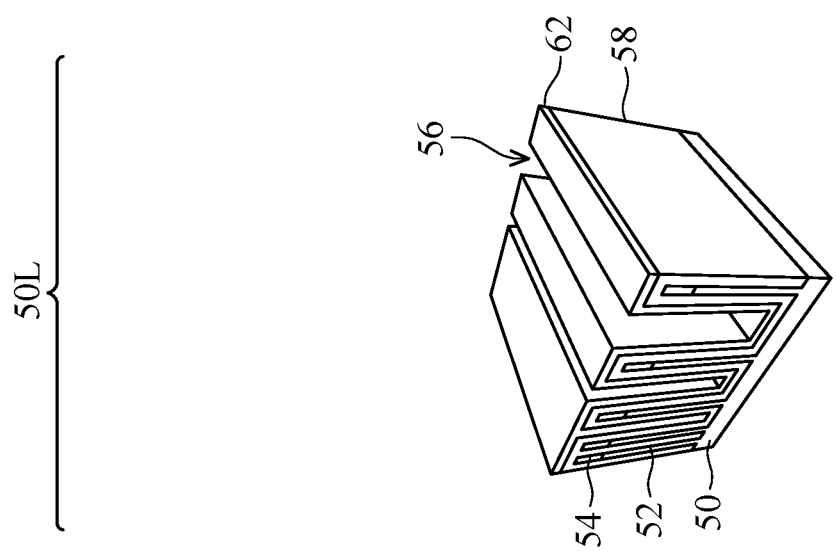

In FIGS. 26A and 26B, the first dielectric layer 62 is formed on the insulation material 58. The first dielectric layer 62 may be formed in the manner described with respect to FIG. 5.

Figure 27B:
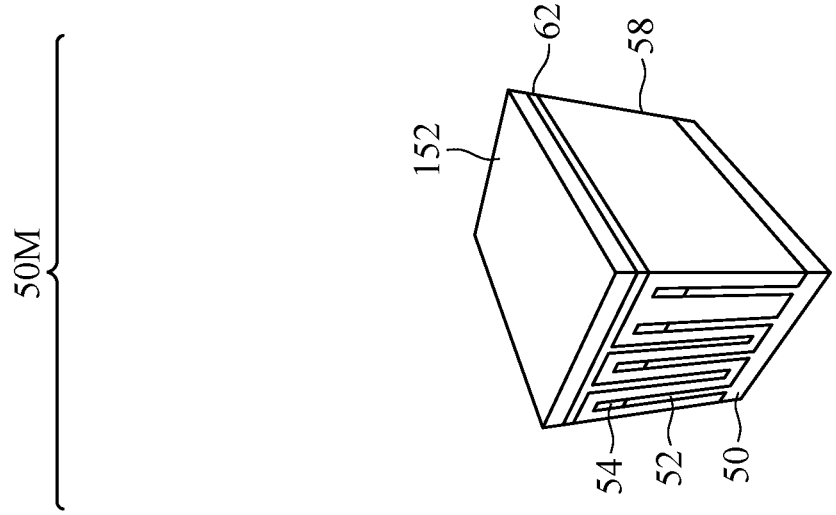
Figure 27A:
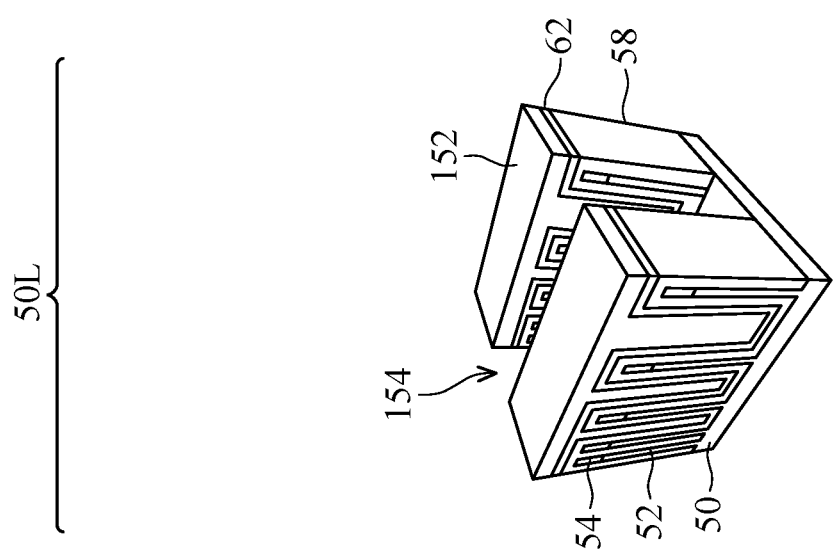

In FIGS. 27A and 27B, a hard mask 152 is formed on the first dielectric layer 62. The hard mask 152 may be formed of a dielectric material such as silicon oxide, silicon nitride, a combination thereof, or the like, which may be deposited or thermally grown according to acceptable techniques. The hard mask 152 is then patterned, such as by using any acceptable photolithography and etching process. A fin cut process is then performed in the logic region 50L to divide the semiconductor fins 52 in the logic region 50L. In this embodiment, the memory region 50M is covered during the etching so that the semiconductor fins 52 in the memory region 50M are not cut. The fin cut process may be performed by etching the semiconductor fins 52 using an anisotropic etching processes, such as a RIE, a NBE, or the like, using the hard mask 152 as an etching mask. The etching forms trenches 154 between the semiconductor fins 52. The trenches 154 cut the semiconductor fins 52. The hard mask 152 may then be removed.

Figure 28A:
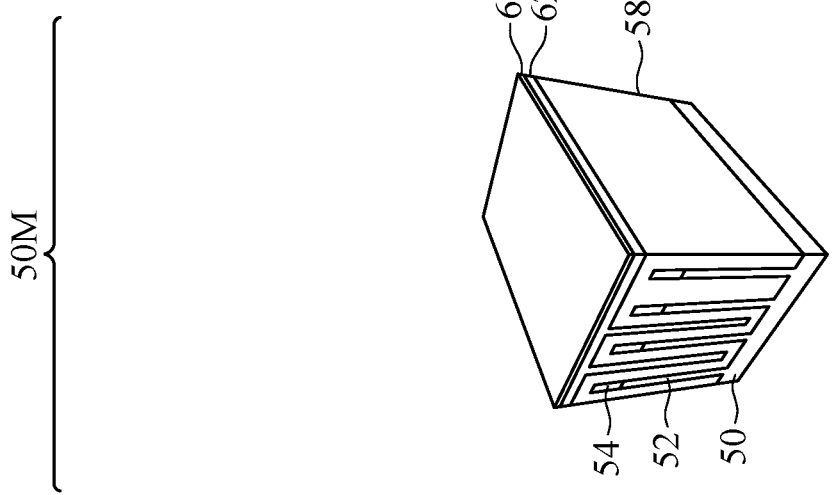
Figure 28B:
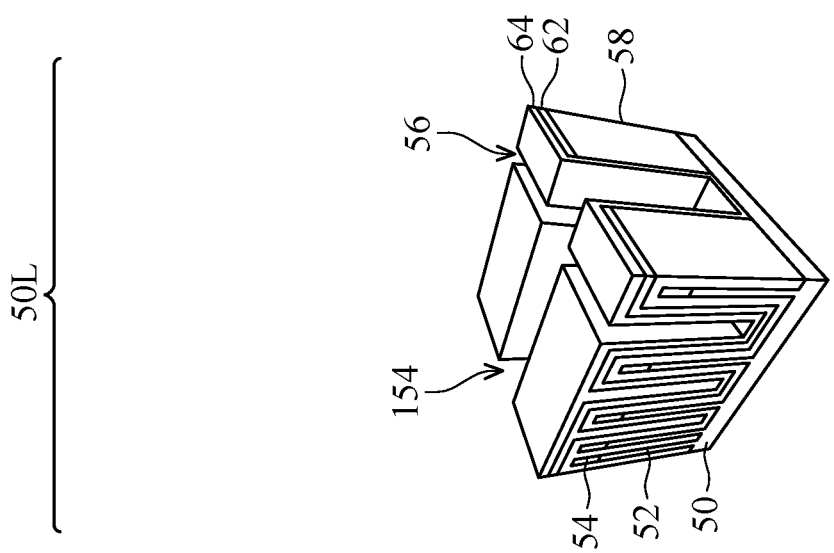

In FIGS. 28A and 28B, the second dielectric layer 64 is formed on the first dielectric layer 62. The second dielectric layer 64 may be formed in the manner described with respect to FIG. 5.

Figures 29A, 29B:
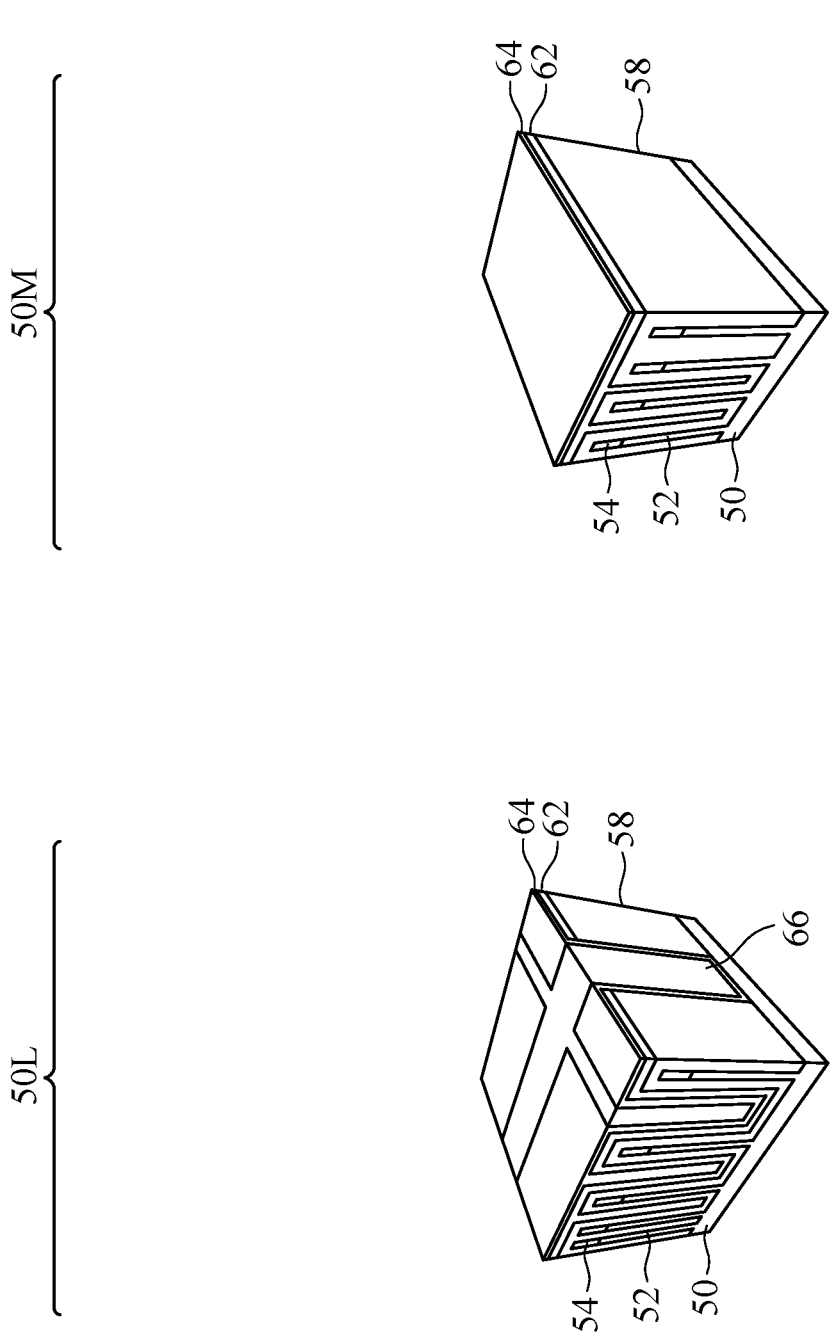

In FIGS. 29A and 29B, the third dielectric layer 66 is formed on the second dielectric layer 64. The third dielectric layer 66 may be formed in the manner described with respect to FIG. 5. The top surfaces of the third dielectric layer 66 are then leveled with the top surfaces of the second dielectric layer 64. The third dielectric layer 66 may be leveled in the manner described with respect to FIG. 6.

Figure 30B:
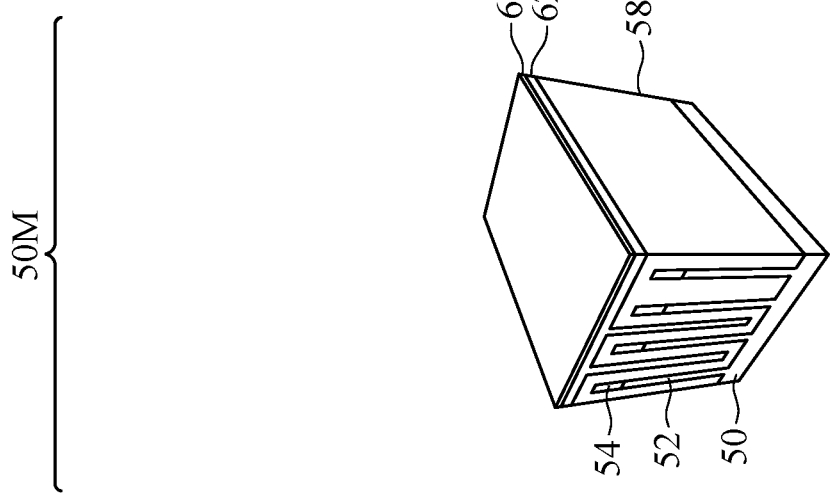
Figure 30A:
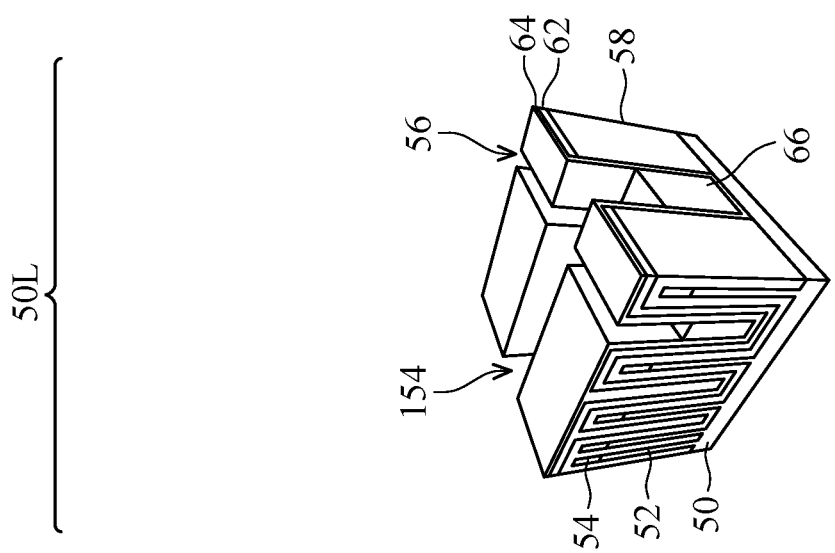

In FIGS. 30A and 30B, the third dielectric layer 66 is recessed. The third dielectric layer 66 may be recessed in the manner described with respect to FIG. 6.

Figure 31B:
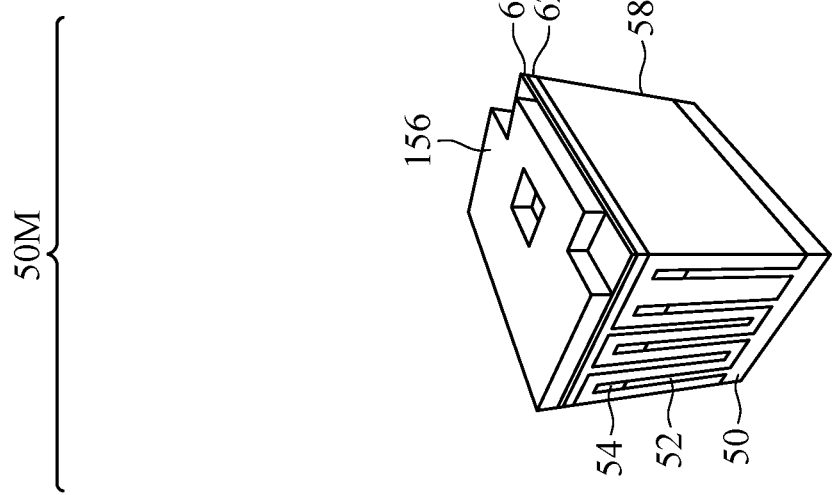
Figure 31A:
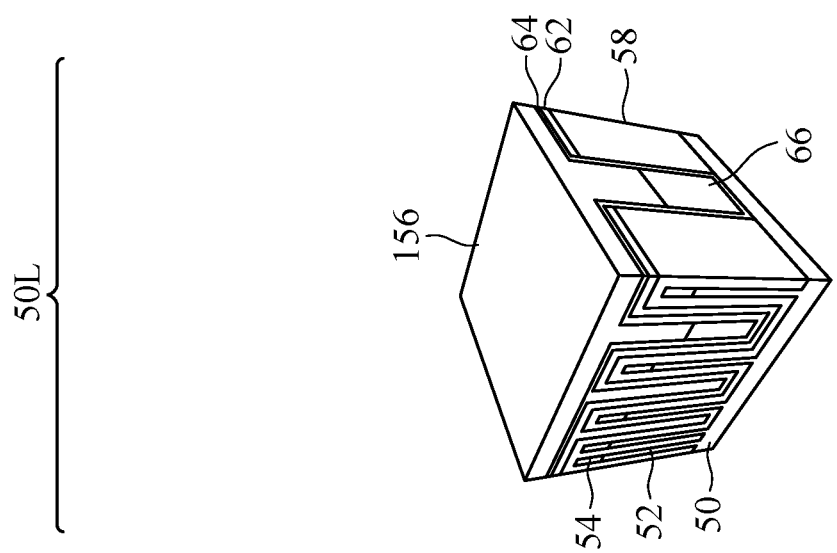

In FIGS. 31A and 31B, a hard mask 156 is formed on the second dielectric layer 64. The hard mask 156 may be formed of a dielectric material such as silicon oxide, silicon nitride, a combination thereof, or the like, which may be deposited or thermally grown according to acceptable techniques. The hard mask 156 is then patterned, such as by using any acceptable photolithography and etching process.

Figure 32B:
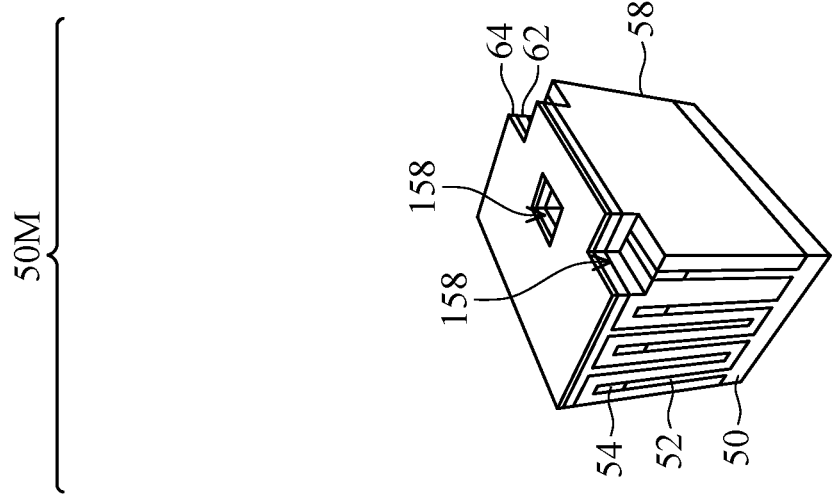
Figure 32A:
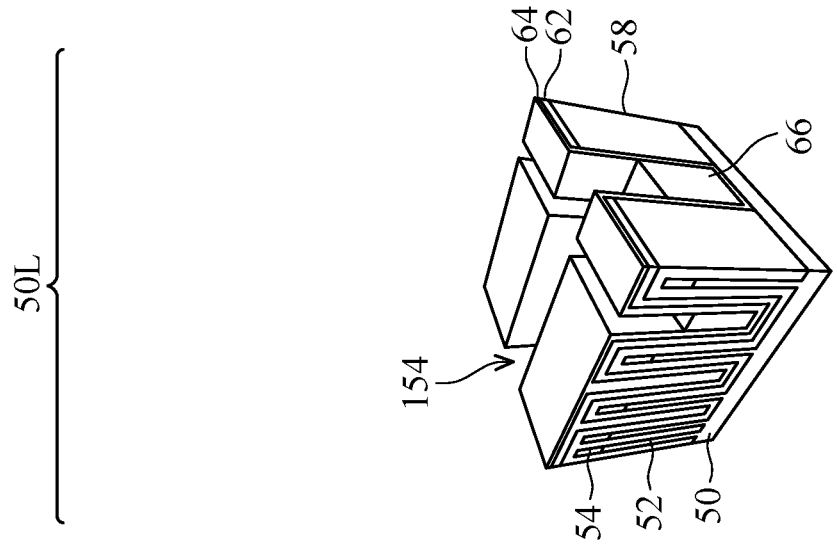

In FIGS. 32A and 32B, the pattern of the hard mask 156 is transferred to the second dielectric layer 64 and the first dielectric layer 62. The pattern of the hard mask 156 may be transferred using an anisotropic etching processes, such as a RIE, a NBE, or the like, using the hard mask 156 as an etching mask. The etching forms openings 158 in the insulation material 58, the first dielectric layer 62, and the second dielectric layer 64, exposing the semiconductor fins 52.

Figure 33B:
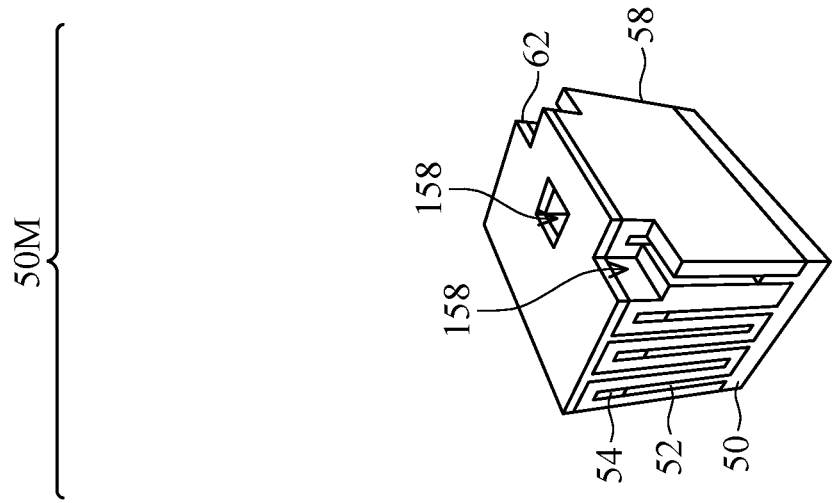
Figure 33A:
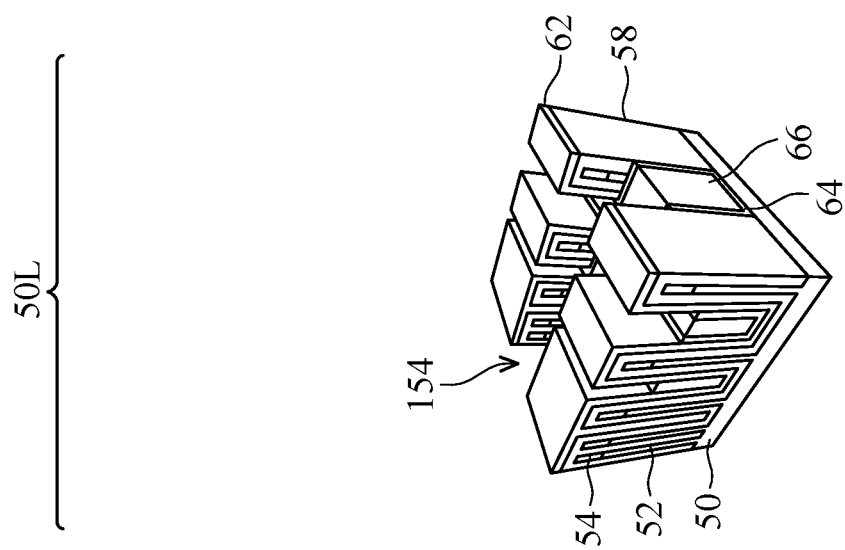

In FIGS. 33A and 33B, the pattern of the second dielectric layer 64 and the first dielectric layer 62 is transferred to the substrate 50, thereby performing another fin cut process in the memory region 50M. In this embodiment, the logic region 50L is covered by the hard mask 156 (see FIGS. 32A and 32B) so that the semiconductor fins 52 in the logic region 50L are not cut. The pattern of the second dielectric layer 64 and the first dielectric layer 62 may be transferred using an anisotropic etching processes, such as a RIE, a NBE, or the like, using the second dielectric layer 64 and the first dielectric layer 62 as an etching mask. The etching extends the openings 158 into/through the semiconductor fins 52.

Figure 34B:
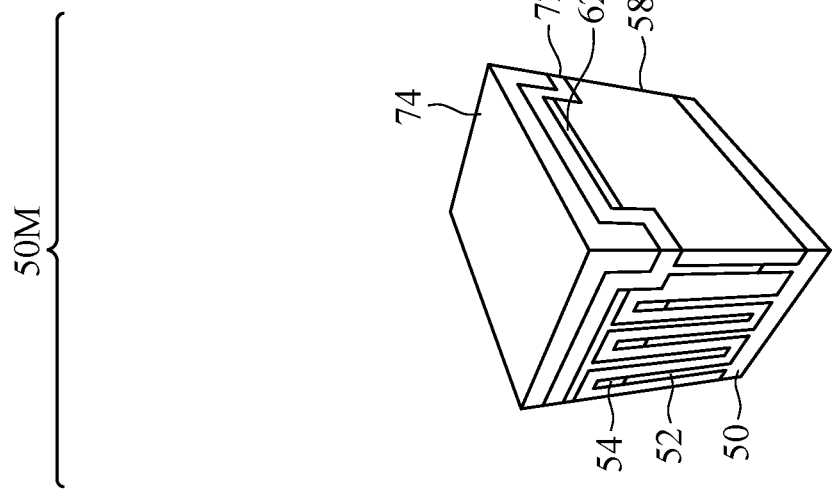
Figure 34A:
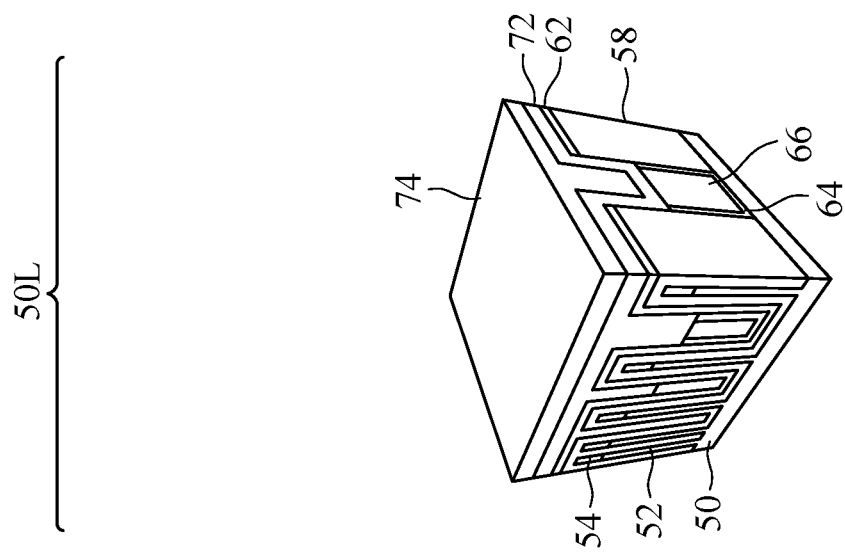

In FIGS. 34A and 34B, the first dummy layer 72 is formed on the first dielectric layer 62, the second dielectric layer 64, and the third dielectric layer 66. The second dummy layer 74 is then formed on the first dummy layer 72. The first dummy layer 72 and the second dummy layer 74 may be formed in the manner described with respect to FIG. 8.

Figure 35:
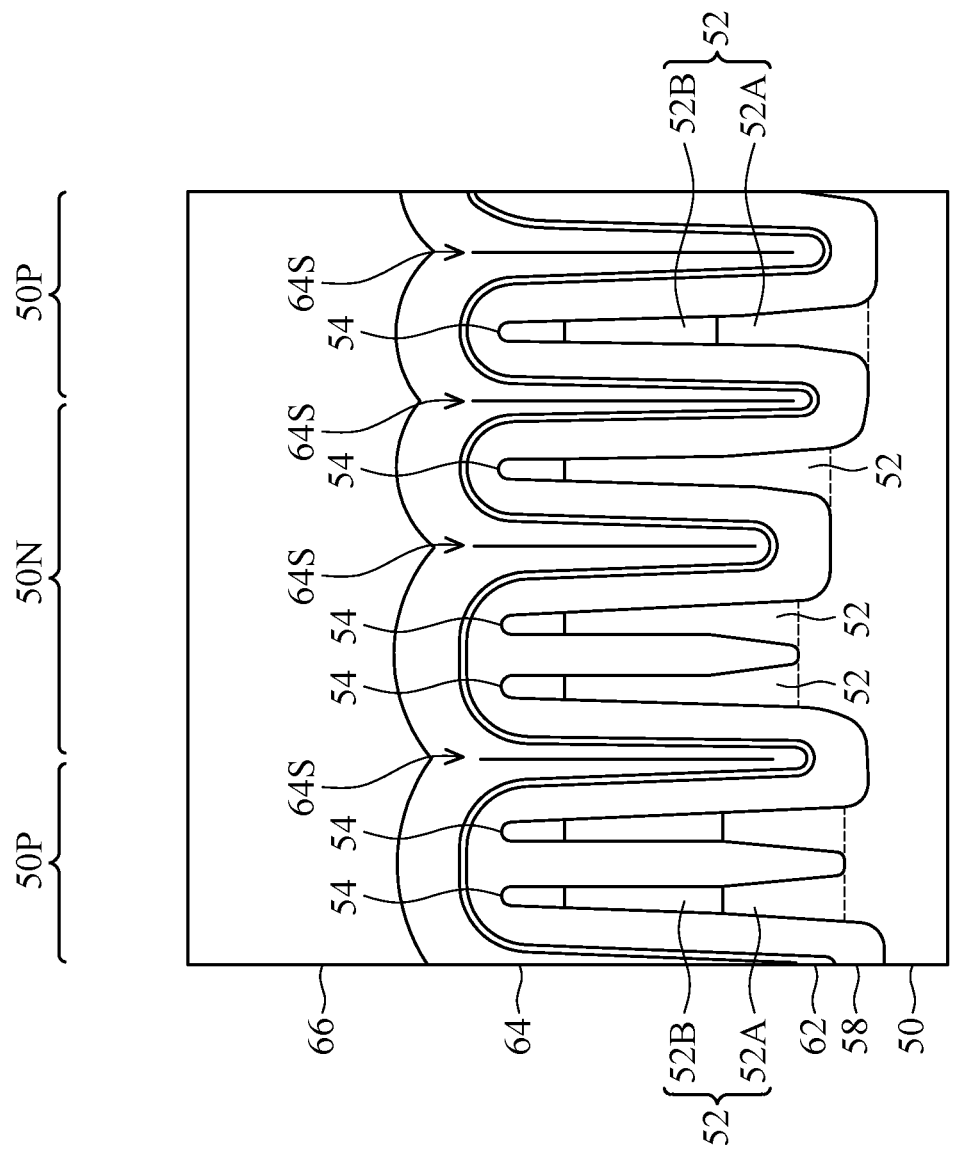
FIGS. 35-36 are view of intermediate stages in the manufacturing of FinFETs, in accordance with some embodiments.
Figure 36:
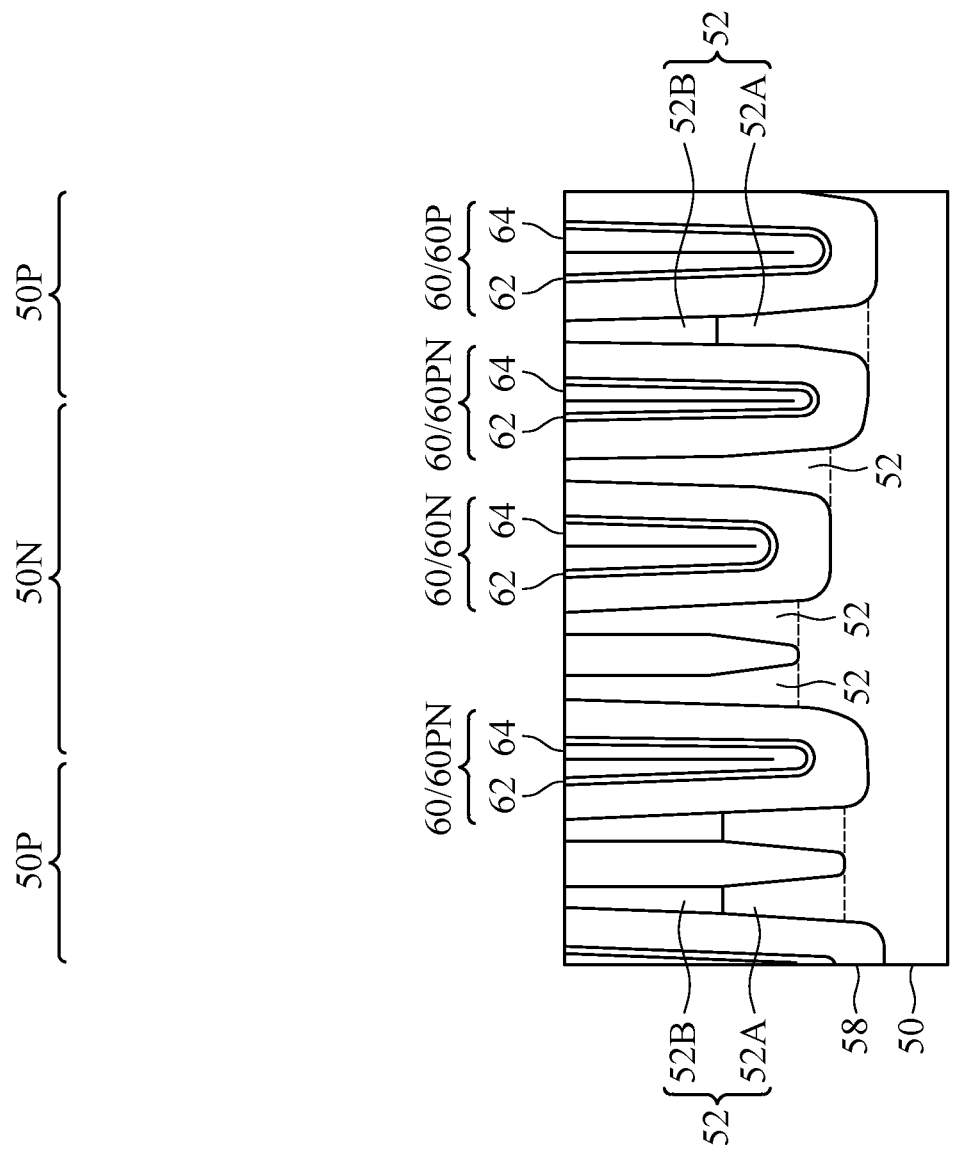

FIGS. 35-36 are view of intermediate stages in the manufacturing of FinFETs, in accordance with some embodiments. FIGS. 35-36 illustrate processing at similar steps as the embodiment of FIGS. 9-10, except a n-type region 50N is between two p-type regions 50P. FIGS. 35-36 may be views of a region of a memory device, e.g., an SRAM device. Further, in this embodiment, contouring occurs during the patterning of the semiconductor fins 52 and the deposition of the insulation material 58. Accordingly, curved surfaces connect the sidewalls of the semiconductor fins 52 to the top surfaces of the substrate 50, and curved surfaces may connect the sidewalls of the insulation material 58 to the top surfaces and the bottom surfaces of the insulation material 58 (see FIG. 35). As a result, the dielectric fins 60 (see FIG. 36) have curved bottom surfaces, such as convex bottom surfaces. Still further, in some embodiments, the semiconductor fins 52 in the p-type regions 50P include lower portions 52A (including portions of the first semiconductor layer 50A, see FIG. 2) and upper portions 52B (including portions of the second semiconductor layer 50B, see FIG. 2), while the semiconductor fins 52 in the n-type region 50N include a single portion (including portions of the first semiconductor layer 50A, see FIG. 2). Additional processing as described for FIGS. 6-21C may be performed on the structure in FIG. 36 to form FinFETs.

In this embodiment, the dielectric fins 60 have different dimensions in the different regions. Specifically, the dielectric fins 60N in the n-type region 50N, the dielectric fins 60P in the p-type regions 50P, and the dielectric fins 60PN at the boundaries between the n-type region 50N and the p-type regions 50P can have different dimensions. The second dielectric layer 64 of the dielectric fins 60N can have a first thickness, the second dielectric layer 64 of the dielectric fins 60P can have a second thickness, and the second dielectric layer 64 of the dielectric fins 60PN can have a third thickness. In some embodiments, the first thickness is in the range of 15 nm to 17 nm, the second thickness is in the range of 15 nm to 17 nm, and the third thickness is in the range of 12 nm to 14 nm, with the third thickness being smaller than the second thickness and the first thickness.

The widths of the dielectric fins 60 may taper, as a result of the contouring and/or pattern loading that occurs during the patterning of the semiconductor fins 52. In some embodiments, the first thickness is in the range of 20 nm to 23 nm at the top of the dielectric fins 60N, and the first thickness decreases to be in the range of 16 nm to 19 nm at the bottom of the dielectric fins 60N. In some embodiments, the second thickness is in the range of 20 nm to 23 nm at the top of the dielectric fins 60P, and the second thickness decreases to be in the range of 16 nm to 19 nm at the bottom of the dielectric fins 60P. In some embodiments, the third thickness is in the range of 15 nm to 18 nm at the top of the dielectric fins 60PN, and the third thickness decreases to be in the range of 13 nm to 15 nm at the bottom of the dielectric fins 60PN.

The heights of the dielectric fins 60 may also differ, as a result of the contouring and/or pattern loading that occurs during the patterning of the semiconductor fins 52. The dielectric fins 60N can have a first height, the dielectric fins 60P can have a second height, and the dielectric fins 60PN can have a third height. In some embodiments, the first height is in the range of 73 nm to 77 nm, the second height is in the range of 90 nm to 95 nm, and the third height is in the range of 88 nm to 92 nm, with the second height being greater than the third height, and the third height being greater than the first height.

Forming the dielectric fins 60 with widths that are less than those described herein or with heights that are greater than those described herein may cause the formation of voids in the dielectric fins 60. For example, if the widths are too small, the filling of the trenches 56 may be incomplete, forming voids.

The curved bottom surfaces of the dielectric fins 60 have different arc lengths, as a result of the contouring and/or pattern loading that occurs during the patterning of the semiconductor fins 52. The curved bottom surfaces of the dielectric fins 60N can have a first arc length, the curved bottom surfaces of the dielectric fins 60P can have a second arc length, and the curved bottom surfaces of the dielectric fins 60PN can have a third arc length. In some embodiments, the first arc length is in the range of 7.5 nm to 9.5 nm, the second arc length is in the range of 7 nm to 9 nm, and the third arc length is in the range of 5.5 nm to 7.5 nm, with the third arc length being less than the second arc length and the first arc length.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Embodiments may achieve advantages. Forming the dielectric fins 60 of ceramic dielectric material(s) increases the mechanical strength of the dielectric fins 60. The dielectric fins 60 may thus reduce CMP loading in subsequent processing, and are less prone to being crushed or peeled by outside forces. Further, the ceramic dielectric material(s) of the dielectric fins 60 have a greater etching selectivity from the etching of the insulation material 58 as compared to other (e.g., non-ceramic) dielectric materials. The formation of voids during etching may thus be reduced. Further yet, ceramic dielectric materials are capable of being deposited by a deposition process with high conformality. Accordingly, the size and quantity of defects (e.g., dimple defects, seam/void defects, etc.) in the resulting FinFETs may be reduced, which may improve the performance and reliability of the resulting FinFETs.

In an embodiment, a device includes: an isolation region on a substrate; a first semiconductor fin protruding above the isolation region; a second semiconductor fin protruding above the isolation region; and a dielectric fin between the first semiconductor fin and the second semiconductor fin, the dielectric fin protruding above the isolation region, the dielectric fin including: a first layer including a first dielectric material having a first carbon concentration; and a second layer on the first layer, the second layer including a second dielectric material having a second carbon concentration, the second carbon concentration greater than the first carbon concentration. In some embodiments of the device, the first dielectric material and the second dielectric material have different compositions of the same ceramic dielectric material. In some embodiments of the device, the first dielectric material and the second dielectric material are different ceramic dielectric materials. In some embodiments of the device, the first dielectric material has a lesser k-value than the second dielectric material. In some embodiments of the device, the dielectric fin further includes: a third layer between the first layer and the second layer, the third layer including a third dielectric material, the third dielectric material having a third carbon concentration, the third carbon concentration greater than the first carbon concentration, the third carbon concentration less than the second carbon concentration. In some embodiments, the device further includes: a gate dielectric on the first semiconductor fin, the second semiconductor fin, the first layer of the dielectric fin, and the second layer of the dielectric fin; and a gate electrode on the gate dielectric. In some embodiments of the device, the dielectric fin further includes: a third layer on the second layer, the third layer including a third dielectric material, the third dielectric material having a third carbon concentration, the third carbon concentration less than the first carbon concentration and the second carbon concentration.

In an embodiment, a device includes: a first source/drain region; a second source/drain region; a dielectric fin between the first source/drain region and the second source/drain region, the dielectric fin including: a first silicon carbonitride layer; and a second silicon carbonitride layer, the first silicon carbonitride layer extending along sidewalls and a bottom of the second silicon carbonitride layer; and a dielectric layer on the first silicon carbonitride layer, the second silicon carbonitride layer, the first source/drain region, and the second source/drain region. In some embodiments of the device, the first silicon carbonitride layer has a first carbon concentration, the second silicon carbonitride layer has a second carbon concentration, and the second carbon concentration is greater than the first carbon concentration. In some embodiments of the device, the first carbon concentration is in a range of 5% to 8%, and the second carbon concentration is in a range of 10% to 13%. In some embodiments of the device, the second silicon carbonitride layer has a vertical seam, and the dielectric layer is exposed to the vertical seam. In some embodiments of the device, the first silicon carbonitride layer has a first thickness, the second silicon carbonitride layer has a second thickness, and the second thickness is greater than the first thickness.

In an embodiment, a method includes: etching a trench in a substrate; depositing an insulation material in the trench; depositing a first ceramic dielectric material on the insulation material and in the trench with a first atomic layer deposition process; depositing a second ceramic dielectric material on the first ceramic dielectric material and in the trench with a second atomic layer deposition process; planarizing a top surface of the insulation material with a top surface of the first ceramic dielectric material and a top surface of the second ceramic dielectric material; and recessing the top surface of the insulation material from the top surface of the first ceramic dielectric material and the top surface of the second ceramic dielectric material. In some embodiments of the method, the first ceramic dielectric material is deposited to a first thickness, the second ceramic dielectric material is deposited to a second thickness, and the second thickness is greater than the first thickness. In some embodiments of the method, the second ceramic dielectric material is deposited in the trench until the second ceramic dielectric material seams together and fills the trench. In some embodiments of the method, the first ceramic dielectric material and the second ceramic dielectric material are different ceramic dielectric materials. In some embodiments of the method, the first ceramic dielectric material and the second ceramic dielectric material are different compositions of the same ceramic dielectric material. In some embodiments, the method further includes: depositing a non-ceramic dielectric material on the second ceramic dielectric material with a flowable chemical vapor deposition process. In some embodiments, the method further includes: depositing a third ceramic dielectric material on the first ceramic dielectric material and in the trench with a third atomic layer deposition process, the second ceramic dielectric material deposited on the third ceramic dielectric material. In some embodiments of the method: the first atomic layer deposition process includes: performing a first atomic layer deposition cycle in a deposition chamber by exposing the insulation material to a silicon-containing precursor, a carbon-containing precursor, and a nitrogen-containing precursor cyclically; and repeating the first atomic layer deposition cycle a first number of times; the second atomic layer deposition process includes: performing a second atomic layer deposition cycle in the deposition chamber by exposing the first ceramic dielectric material to the silicon-containing precursor, the carbon-containing precursor, and the nitrogen-containing precursor cyclically; and repeating the second atomic layer deposition cycle a second number of times; and a greater amount of the carbon-containing precursor is dispensed during the second atomic layer deposition process than during the first atomic layer deposition process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a trench in a substrate;
    depositing an insulation material in the trench;
    depositing a first ceramic dielectric material on the insulation material and in the trench with a first atomic layer deposition process, the first ceramic dielectric material having a first carbon concentration;
    depositing a second ceramic dielectric material on the first ceramic dielectric material and in the trench with a second atomic layer deposition process, the second ceramic dielectric material having a second carbon concentration, the second carbon concentration being greater than the first carbon concentration;
    planarizing a top surface of the insulation material with a top surface of the first ceramic dielectric material and a top surface of the second ceramic dielectric material; and
    recessing the top surface of the insulation material from the top surface of the first ceramic dielectric material and the top surface of the second ceramic dielectric material.

2. The method of claim 1, wherein the first ceramic dielectric material is deposited to a first thickness, the second ceramic dielectric material is deposited to a second thickness, and the second thickness is greater than the first thickness.

3. The method of claim 1, wherein the second ceramic dielectric material is deposited in the trench until the second ceramic dielectric material seams together and fills the trench.

4. The method of claim 1, wherein the first ceramic dielectric material and the second ceramic dielectric material are different ceramic dielectric materials.

5. The method of claim 1, wherein the first ceramic dielectric material and the second ceramic dielectric material are different compositions of the same ceramic dielectric material.

6. The method of claim 1, further comprising:
    depositing a non-ceramic dielectric material on the second ceramic dielectric material with a flowable chemical vapor deposition process.

7. The method of claim 1, further comprising:
    depositing a third ceramic dielectric material on the first ceramic dielectric material and in the trench with a third atomic layer deposition process, the second ceramic dielectric material deposited on the third ceramic dielectric material.

8. The method of claim 1, wherein:
    the first atomic layer deposition process comprises:
        performing a first atomic layer deposition cycle in a deposition chamber by exposing the insulation material to a silicon-containing precursor, a carbon-containing precursor, and a nitrogen-containing precursor cyclically; and
        repeating the first atomic layer deposition cycle a first number of times;
    the second atomic layer deposition process comprises:
        performing a second atomic layer deposition cycle in the deposition chamber by exposing the first ceramic dielectric material to the silicon-containing precursor, the carbon-containing precursor, and the nitrogen-containing precursor cyclically; and
        repeating the second atomic layer deposition cycle a second number of times; and
    a greater amount of the carbon-containing precursor is dispensed during the second atomic layer deposition process than during the first atomic layer deposition process.

9. A method comprising:
    forming a first semiconductor fin and a second semiconductor fin protruding from a substrate;
    depositing an isolation material between the first semiconductor fin and the second semiconductor fin;
    forming a dielectric fin on the isolation material, the dielectric fin disposed between the first semiconductor fin and the second semiconductor fin, wherein forming the dielectric fin comprises:
        depositing a first layer of a first dielectric material with a first carbon concentration;
        depositing a second layer of a second dielectric material with a second carbon concentration on the first layer, wherein the second carbon concentration is greater than the first carbon concentration; and
        recessing the first layer and the second layer.

10. The method of claim 9, wherein the first dielectric material and the second dielectric material are the same dielectric material with different compositions.

11. The method of claim 9, wherein the first dielectric material and the second dielectric material are different dielectric materials.

12. The method of claim 9, wherein the first dielectric material has a lesser k-value than the second dielectric material.

13. The method of claim 9, further comprising depositing a third layer of a third dielectric material on the first layer, wherein the second layer is deposited on the third layer, wherein the third dielectric material has a third carbon concentration that is greater than the first carbon concentration and less than the second carbon concentration.

14. The method of claim 9, further comprising:
    forming a gate dielectric on the first semiconductor fin, the second semiconductor fin, the first layer of the dielectric fin, and the second layer of the dielectric fin; and
    forming a gate electrode on the gate dielectric.

15. The method of claim 9, wherein forming the dielectric fin further comprises:
    depositing a third layer on the second layer, wherein the third layer comprises a third dielectric material with a third carbon concentration that is less than the first and second carbon concentrations.

16. A method comprising:

forming a dielectric fin, wherein the dielectric fin comprises a first silicon carbonitride layer and a second silicon carbonitride layer, the first silicon carbonitride layer extending along sidewalls and a bottom of the second silicon carbonitride layer, the first silicon carbonitride layer having a first carbon concentration, the second silicon carbonitride layer having a second carbon concentration, the second carbon concentration being greater than the first carbon concentration;

forming a first source/drain region and a second source/drain region at opposing sides of the dielectric fin; and depositing a dielectric layer on the first source/drain region, the second source/drain region, the first silicon carbonitride layer, and the second silicon carbonitride layer.

17. The method of claim 16, wherein the second silicon carbonitride layer has a vertical seam, and the dielectric layer is exposed to the vertical seam.

18. The method of claim 16, wherein the first silicon carbonitride layer has a first thickness, the second silicon carbonitride layer has a second thickness, and the second thickness is greater than the first thickness.

19. The method of claim 16, wherein forming the dielectric fin comprises:

depositing the first silicon carbonitride layer with a first atomic layer deposition process, wherein the first atomic layer deposition process comprises:
performing a first atomic layer deposition cycle by cyclically dispensing a silicon-containing precursor, a carbon-containing precursor, and a nitrogen-containing precursor; and
repeating the first atomic layer deposition cycle a first number of times; and depositing the second silicon carbonitride layer with a second atomic layer deposition process, wherein the second atomic layer deposition process comprises:
performing a second atomic layer deposition cycle by cyclically dispensing the silicon-containing precursor, the carbon-containing precursor, and the nitrogen-containing precursor cyclically, wherein a greater amount of the carbon-containing precursor is dispensed during the second atomic layer deposition process than during the first atomic layer deposition process; and
repeating the second atomic layer deposition cycle a second number of times, the second number of times greater than the first number of times.

20. The method of claim 16, wherein the first silicon carbonitride layer has a lesser k-value than the second silicon carbonitride layer.

* * * * *